(12) United States Patent
Ohkawa et al.

(10) Patent No.: US 9,047,842 B2
(45) Date of Patent: Jun. 2, 2015

(54) SHIFT REGISTER, DISPLAY-DRIVING CIRCUIT, DISPLAYING PANEL, AND DISPLAYING DEVICE

(75) Inventors: Hiroyuki Ohkawa, Osaka (JP); Yasushi Sasaki, Osaka (JP); Yuhichiroh Murakami, Osaka (JP); Shige Furuta, Osaka (JP); Makoto Yokoyama, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 220 days.

(21) Appl. No.: 13/377,855

(22) PCT Filed: Mar. 18, 2010

(86) PCT No.: PCT/JP2010/001972
§ 371 (c)(1),
(2), (4) Date: Dec. 13, 2011

(87) PCT Pub. No.: WO2010/146753
PCT Pub. Date: Dec. 23, 2010

(65) Prior Publication Data
US 2012/0092311 A1 Apr. 19, 2012

(30) Foreign Application Priority Data

Jun. 17, 2009 (JP) ................................. 2009-144749

(51) Int. Cl.
G09G 3/36 (2006.01)
G06F 3/038 (2013.01)
(Continued)

(52) U.S. Cl.
CPC ............ *G09G 3/3677* (2013.01); *G09G 3/3614* (2013.01); *G09G 3/3655* (2013.01); *G09G 2310/0245* (2013.01);
(Continued)

(58) Field of Classification Search
None
See application file for complete search history.

(56) References Cited

U.S. PATENT DOCUMENTS

2002/0039096 A1* 4/2002 Katsutani ...................... 345/204
2002/0140689 A1* 10/2002 Huang et al. .................. 345/208
(Continued)

FOREIGN PATENT DOCUMENTS

JP 2000347627 A 12/2000
JP 2004227751 A 8/2004
(Continued)

OTHER PUBLICATIONS

International Search Report and Written Opinion of Searching Authority.

*Primary Examiner* — Alexander Eisen
*Assistant Examiner* — Nan-Ying Yang
(74) *Attorney, Agent, or Firm* — Harness, Dickey & Pierce, P.L.C.

(57) ABSTRACT

Disclosed is a shift register for use in a display driving circuit that simultaneously selects signal lines, including, in a stage thereof: a flip-flop including an initialization terminal; and a signal generating circuit that receives a simultaneous selection signal and that generates an output signal of the stage by use of an output of the flip-flop, wherein: the output signal of the stage becomes active due to an activation of the simultaneous selection signal so as to be active during a period of the simultaneous selection; the output of the flip-flop is non-active while the initialization terminal, a set terminal, and a reset terminal of the flip-flop; and the initialization terminal of the flip-flop receives the simultaneous selection signal. This shift register makes it possible to downsize various drivers.

19 Claims, 33 Drawing Sheets

(51) Int. Cl.
*G09G 5/00* (2006.01)
*G11C 19/28* (2006.01)
*H03K 3/356* (2006.01)

(52) U.S. Cl.
CPC . *G09G 2310/0286* (2013.01); *G09G 2310/063* (2013.01); *G09G 2320/0233* (2013.01); *G09G 2330/026* (2013.01); *G09G 2330/027* (2013.01); *G11C 19/28* (2013.01); *H03K 3/356182* (2013.01)

(56) References Cited

U.S. PATENT DOCUMENTS

| | | | |
|---|---|---|---|
| 2003/0030616 A1* | 2/2003 | Maeda et al. | 345/98 |
| 2004/0130948 A1* | 7/2004 | Rolandi | 365/185.05 |
| 2004/0150610 A1 | 8/2004 | Zebedee et al. | |
| 2005/0184784 A1 | 8/2005 | Washio et al. | |
| 2009/0109161 A1 | 4/2009 | Yamamoto et al. | |
| 2009/0121998 A1* | 5/2009 | Ohkawa et al. | 345/100 |
| 2010/0128009 A1 | 5/2010 | Okada et al. | |
| 2010/0158186 A1* | 6/2010 | Moon et al. | 377/76 |

FOREIGN PATENT DOCUMENTS

| | | |
|---|---|---|
| JP | 2005244956 A | 9/2005 |
| WO | WO-2007010835 A1 | 1/2007 |
| WO | WO-2007108177 A1 | 9/2007 |
| WO | WO 2007108177 A1 * | 9/2007 |
| WO | WO 2009/028353 | 3/2009 |
| WO | WO 2009/050926 | 4/2009 |

* cited by examiner

SHIFT REGISTER, DISPLAY-DRIVING CIRCUIT, DISPLAYING PANEL, AND DISPLAYING DEVICE

TECHNICAL FIELD

The present invention relates to a shift register and various display drivers.

BACKGROUND ART

Patent Literature 1 (see FIG. 34) discloses an arrangement in which NAND elements are supplied with (i) respective outputs from respective stages of a shift register included in a gate driver and (ii) a DCG signal, and in which the NAND elements supply their respective outputs to respective scanning signal lines. This arrangement makes it possible to (i) simultaneously select all scanning signal lines by causing the DCG signal to be active when a liquid crystal display device is turned on and off, and thus (ii) write a Vcom (common electrode potential) to all pixels.

CITATION LIST

Patent Literature 1

Japanese Patent Application Publication, Tokukai, No. 2000-347627 A (Publication Date: Dec. 15, 2000)

SUMMARY OF INVENTION

Technical Problem

The above conventional arrangement unfortunately requires (i) NAND elements that are supplied with respective outputs from the shift register and the DCG signal and (ii) components that initializes the shift register after the simultaneous selection of all scanning signal lines (for example, (i) a circuit for generating an initializing signal and (ii) a transmission line). This requirement prevents the gate driver from being downsized.

It is an object of the present invention to provide a shift register that makes it possible to downsize display driving circuits (various display drivers).

Solution to Problem

A shift register of the present invention is a shift register for a display driving circuit that simultaneously selects signal lines at, for example, a predetermined timing, the shift register comprising, in a stage thereof: a flip-flop including an initialization terminal; and a signal generating circuit that receives a simultaneous selection signal and that generates an output signal of said stage by use of an output of the flip-flop, wherein: the output signal of said stage becomes active due to an activation of the simultaneous selection signal so as to be active during a period of the simultaneous selection; while the initialization terminal of the flip-flop is active, the output of the flip-flop is non-active regardless of a state of another input terminal (of the flip-flop); and the initialization terminal receives the simultaneous selection signal.

The above arrangement allows a simultaneous selection signal to be used as a signal for initializing a shift register, and thus eliminates the need to additionally generate such a signal and supply the signal to each stage. This makes it possible to downsize a display driving circuit (that is, various display drivers) including a shift register.

Advantageous Effects of Invention

The present invention downsizes a display driving circuit (display driver).

BRIEF DESCRIPTION OF DRAWINGS

FIG. 1 is a diagram schematically illustrating a configuration of a liquid crystal display device of Embodiment 1.

FIG. 2 is a circuit diagram illustrating a part of a shift register of the liquid crystal display device illustrated in FIG. 1.

Figure 2:
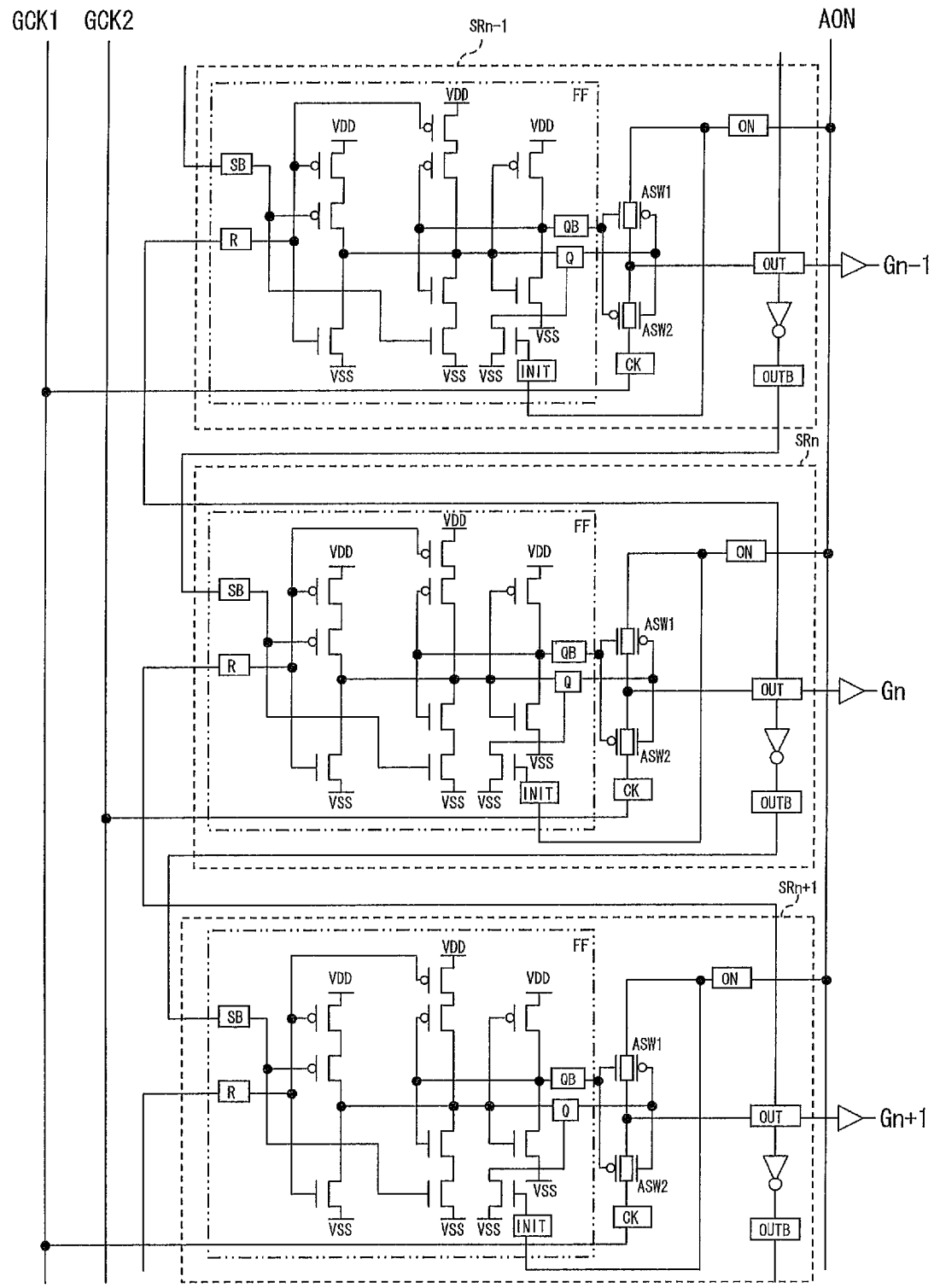
FIG. 2

(*a*) is a circuit diagram of a flip-flop of the shift register illustrated in FIG. 2, and (*b*) is a truth table for the flip-flop.

FIG. 4

Figure 1:
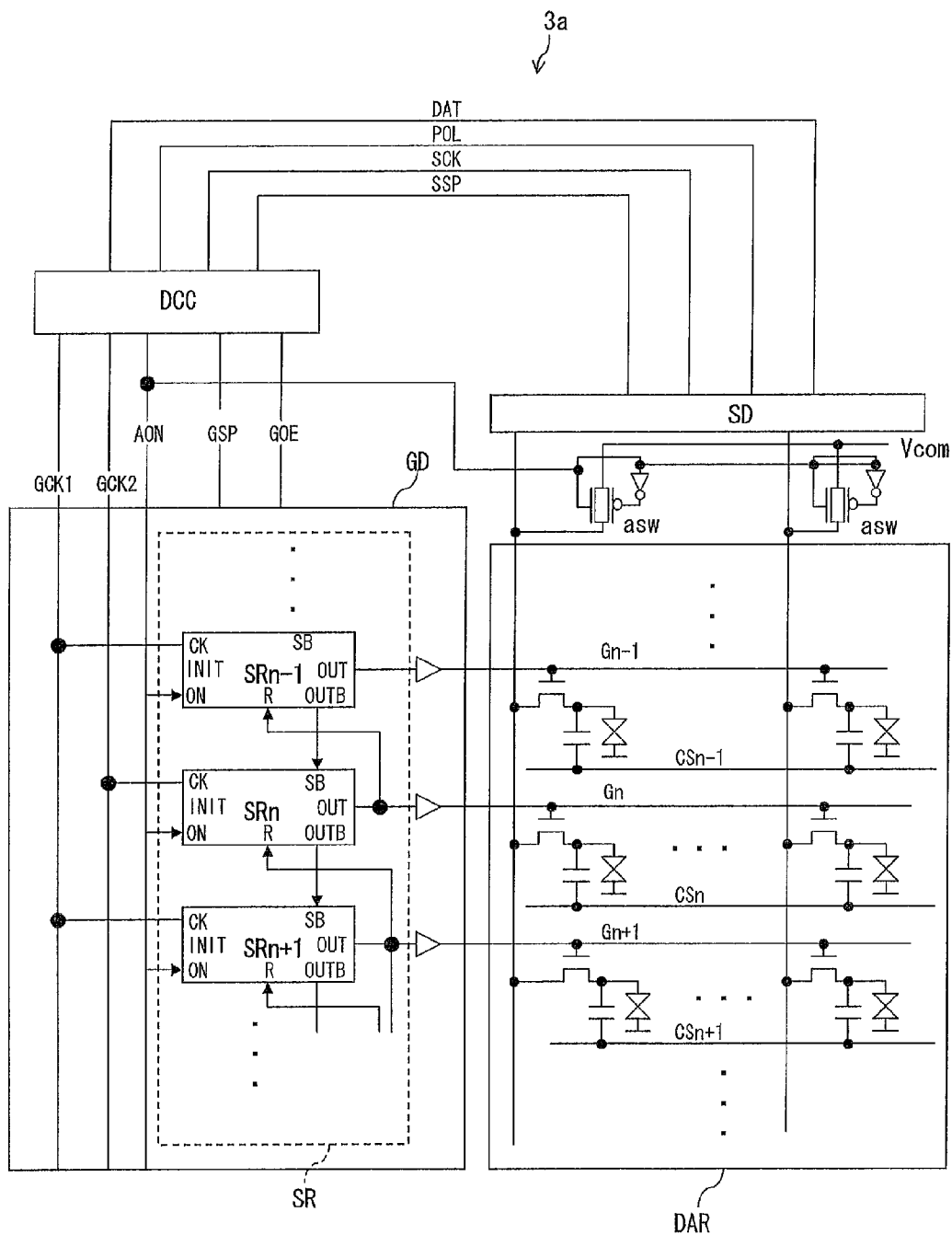
FIG. 1
Figure 4:
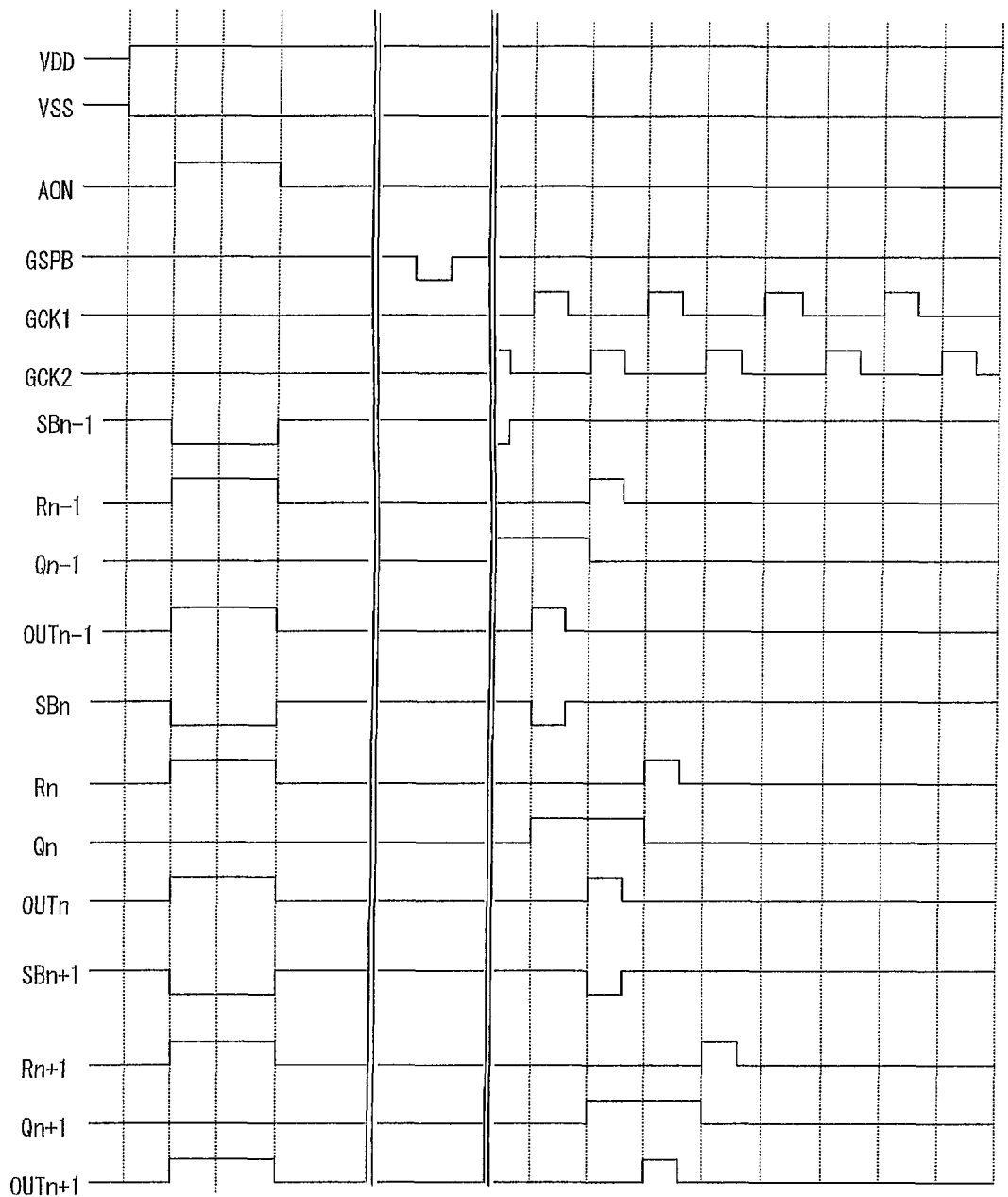

FIG. 4 is a timing chart illustrating how the liquid crystal display device of FIG. 1 is driven when turned on.

FIG. 5

Figure 5:
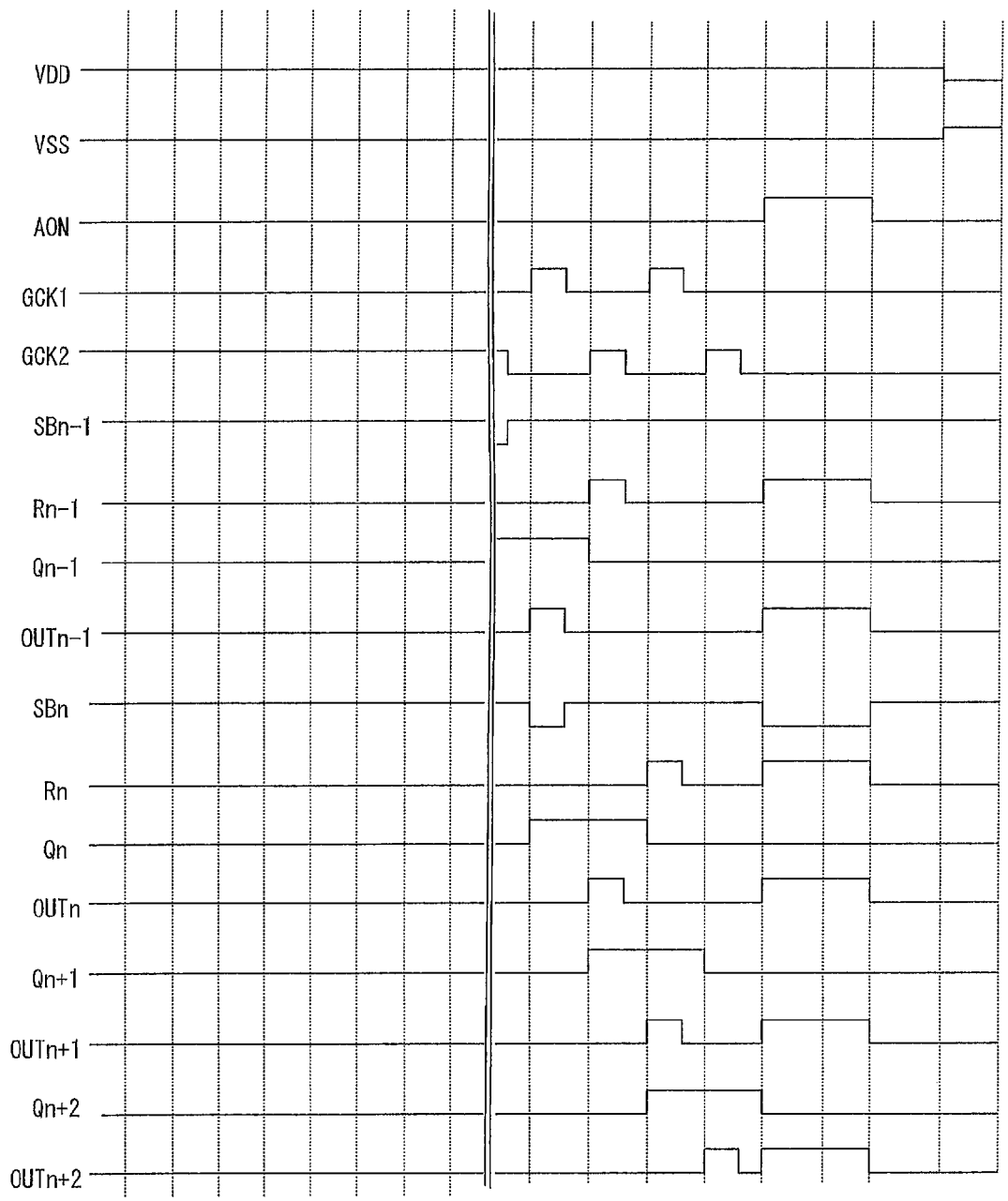

FIG. 5 is a timing chart illustrating how the liquid crystal display device of FIG. 1 is driven when turned off.

FIG. 6

Figure 6:
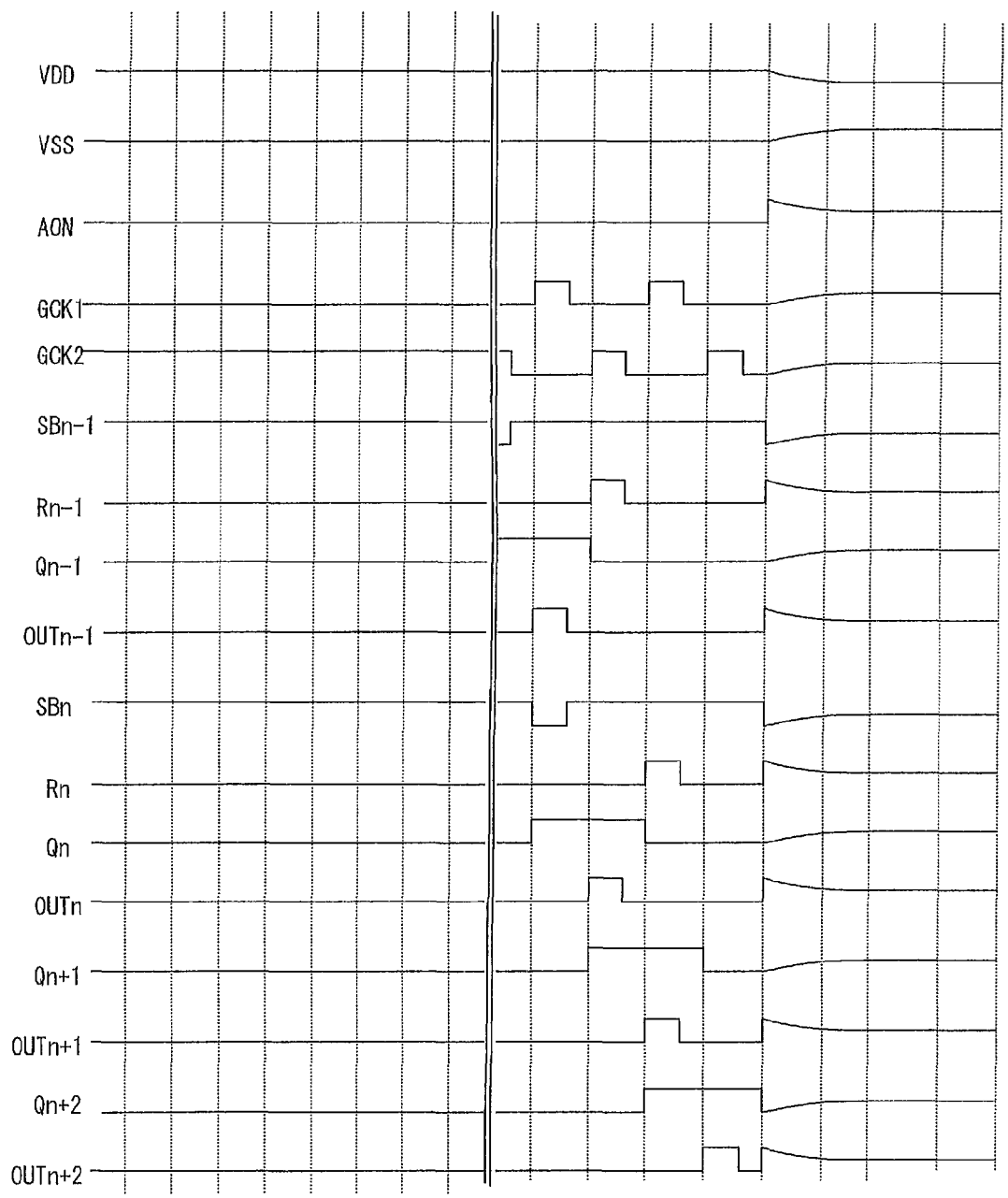

FIG. 6 is a timing chart illustrating how the liquid crystal display device of FIG. 1 is driven when forcibly shut down.

FIG. 7

Figure 7:
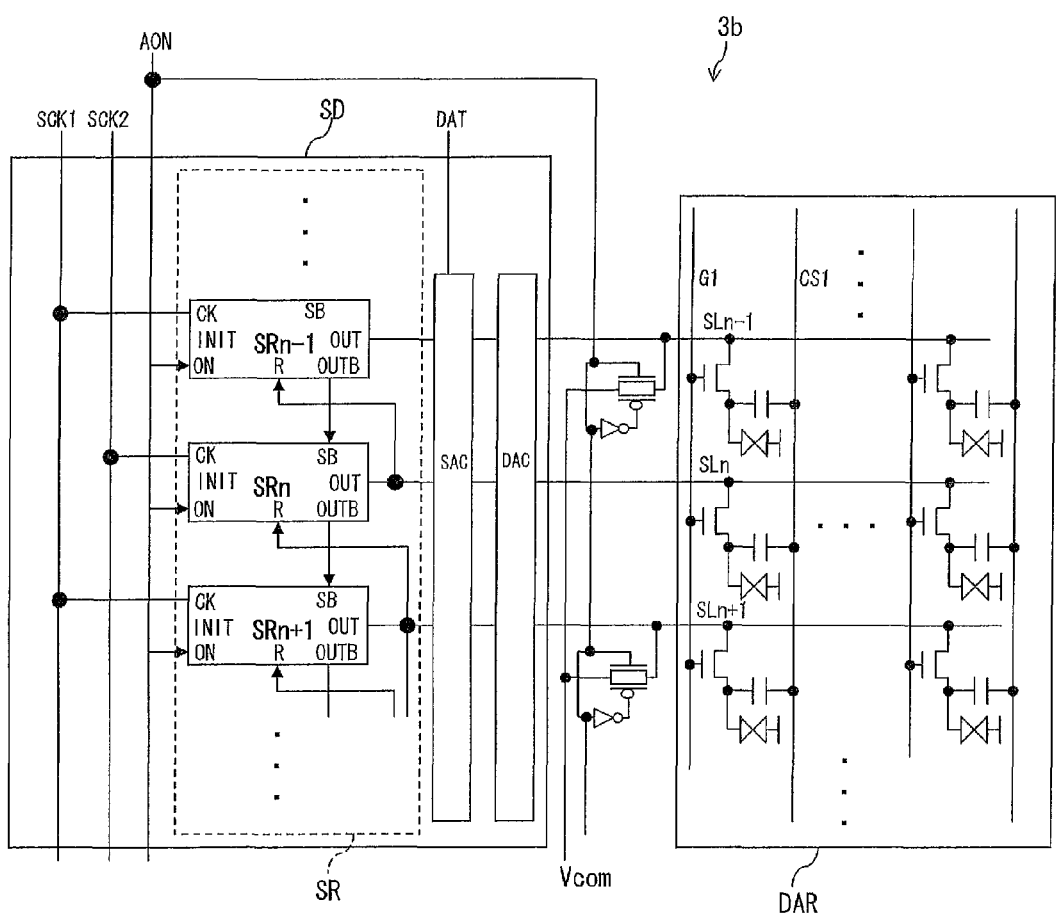

FIG. 7 is a diagram schematically illustrating another configuration of a liquid crystal display device of Embodiment 1.

FIG. 8

Figure 8:
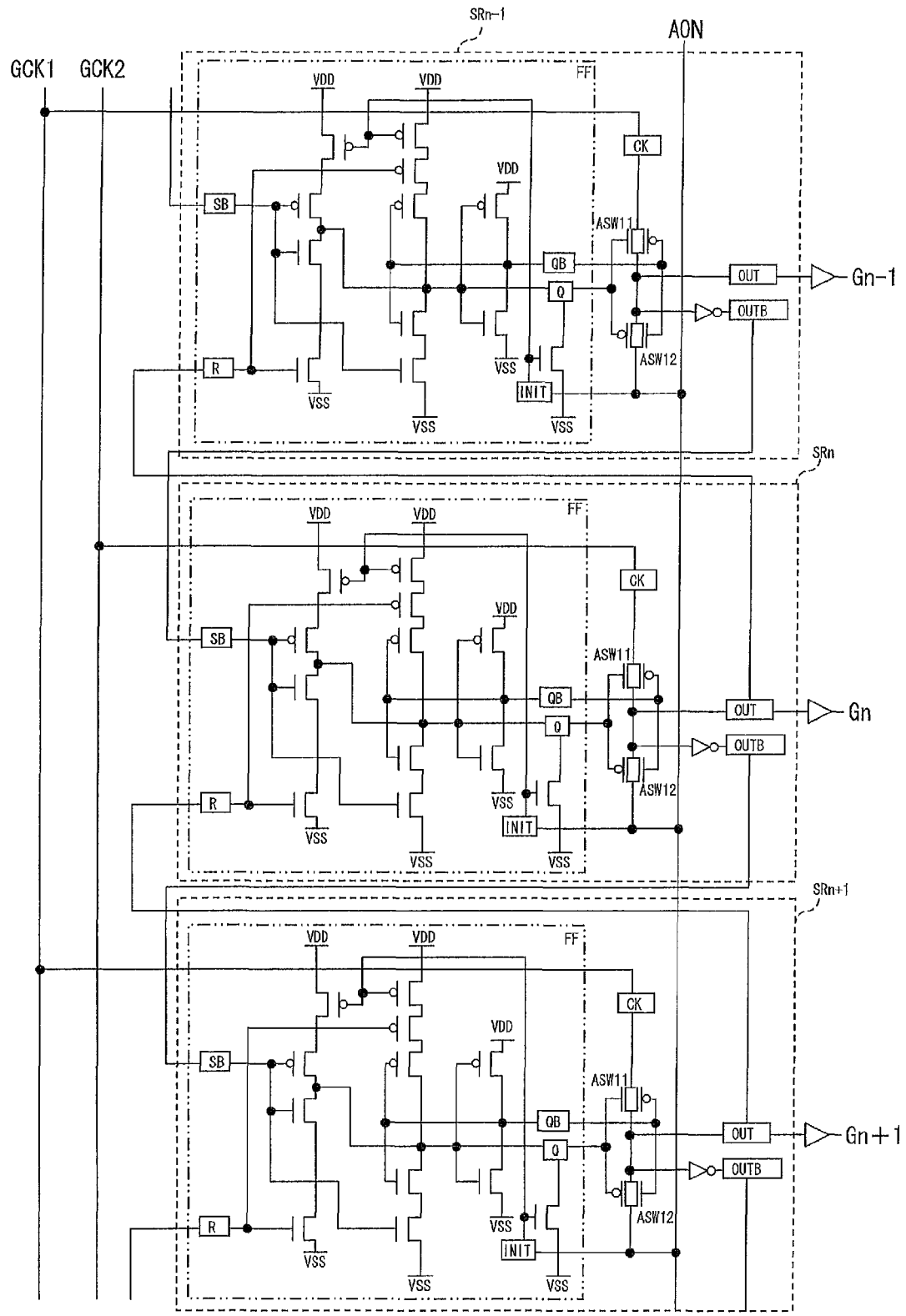

FIG. 8 is a circuit diagram illustrating a variation of the shift register illustrated in FIG. 2.

FIG. 9

(*a*) is a circuit diagram of a flip-flop of the shift register illustrated in FIG. 8, and (*b*) is a truth table for the flip-flop.

FIG. 10

Figure 10:
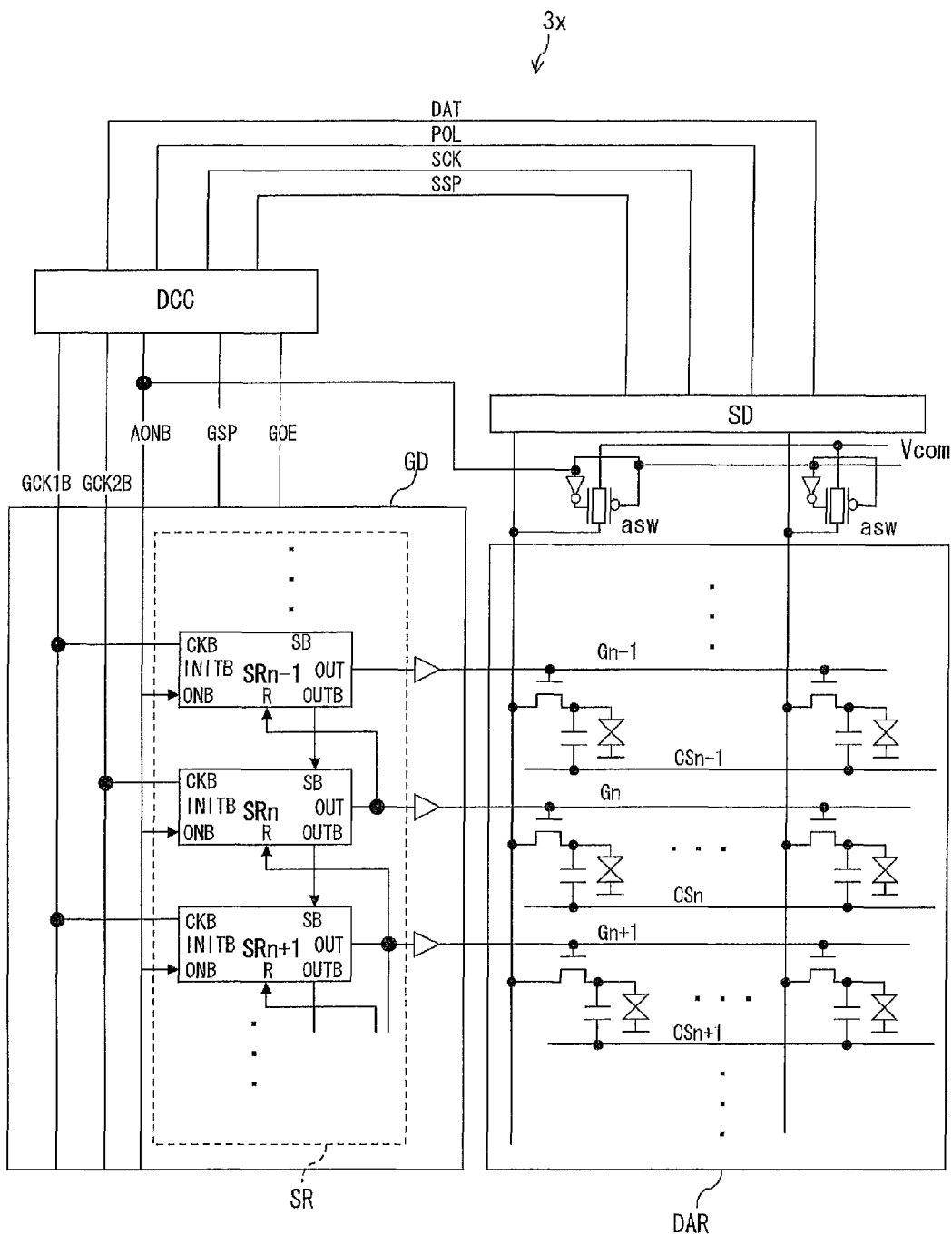

FIG. 10 is a diagram schematically illustrating still another configuration of a liquid crystal display device of Embodiment 1.

FIG. 11

Figure 11:
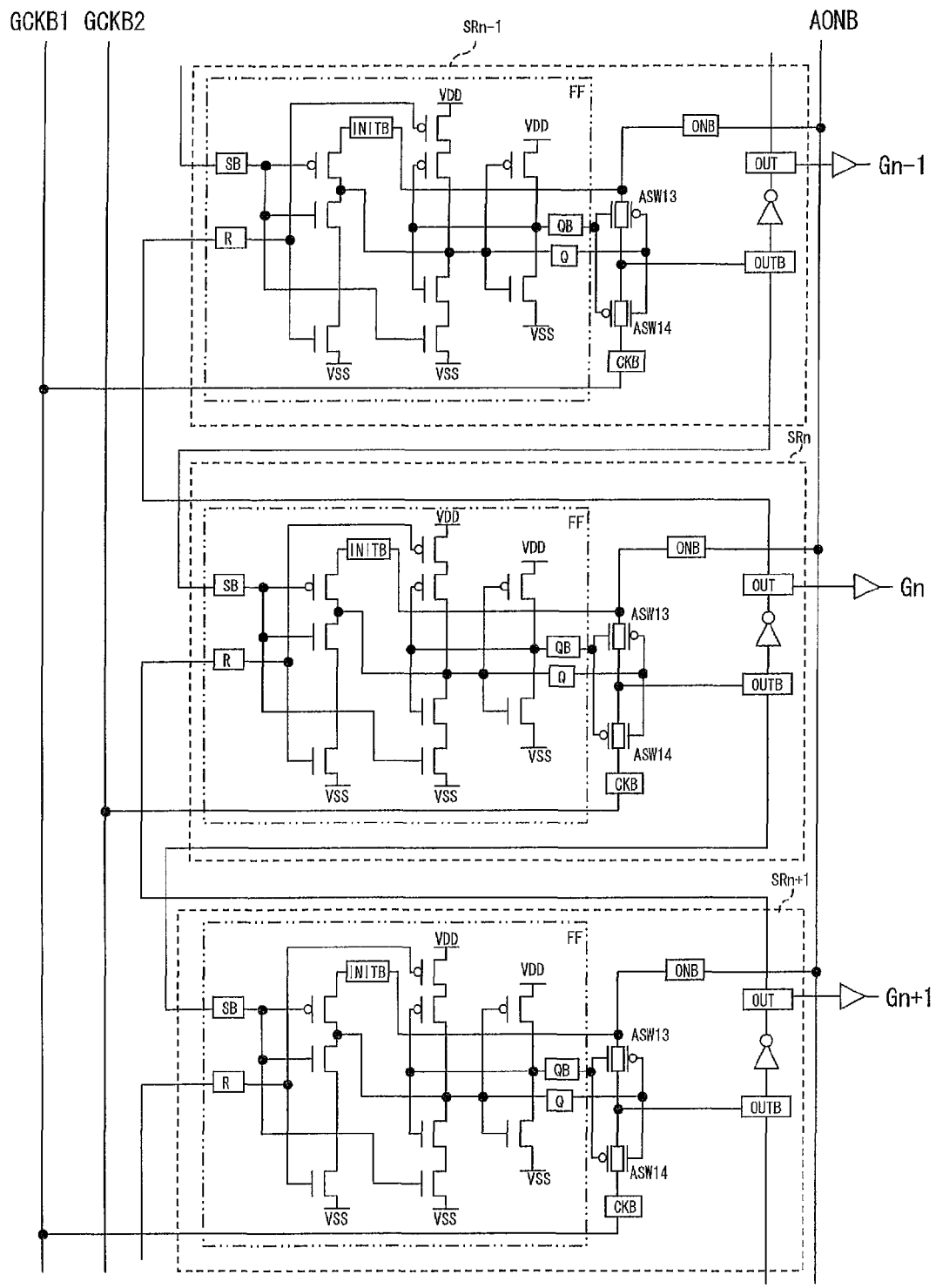

FIG. 11 is a circuit diagram illustrating a part of a shift register of the liquid crystal display device illustrated in FIG. 10.

FIG. 12

(*a*) is a circuit diagram of a flip-flop of the shift register illustrated in FIG. 11, and (*b*) is a truth table for the flip-flop.

FIG. 13

Figure 13:
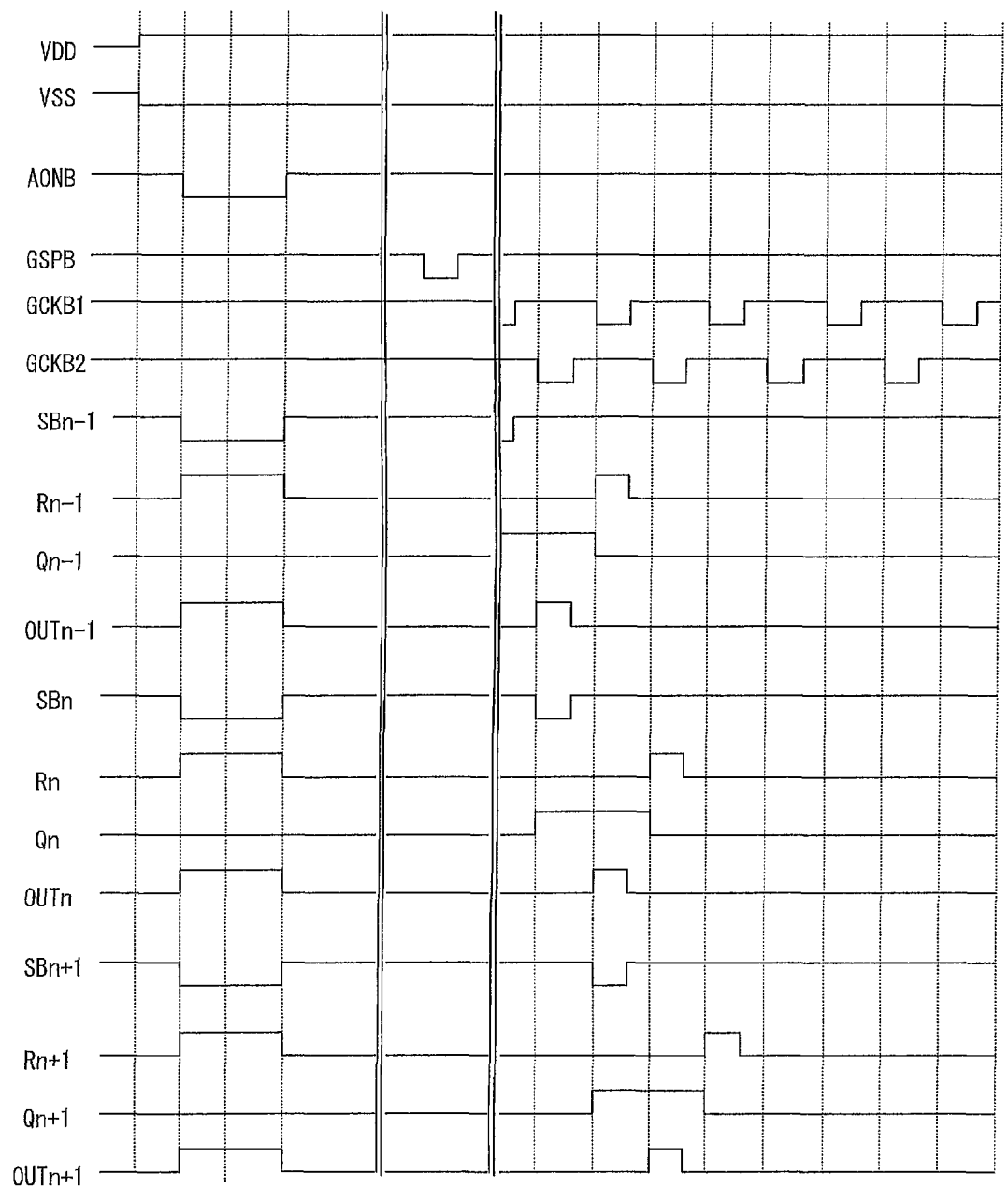

FIG. 13 is a timing chart illustrating how the liquid crystal display device of FIG. 10 is driven when turned on.

FIG. 14

Figure 14:
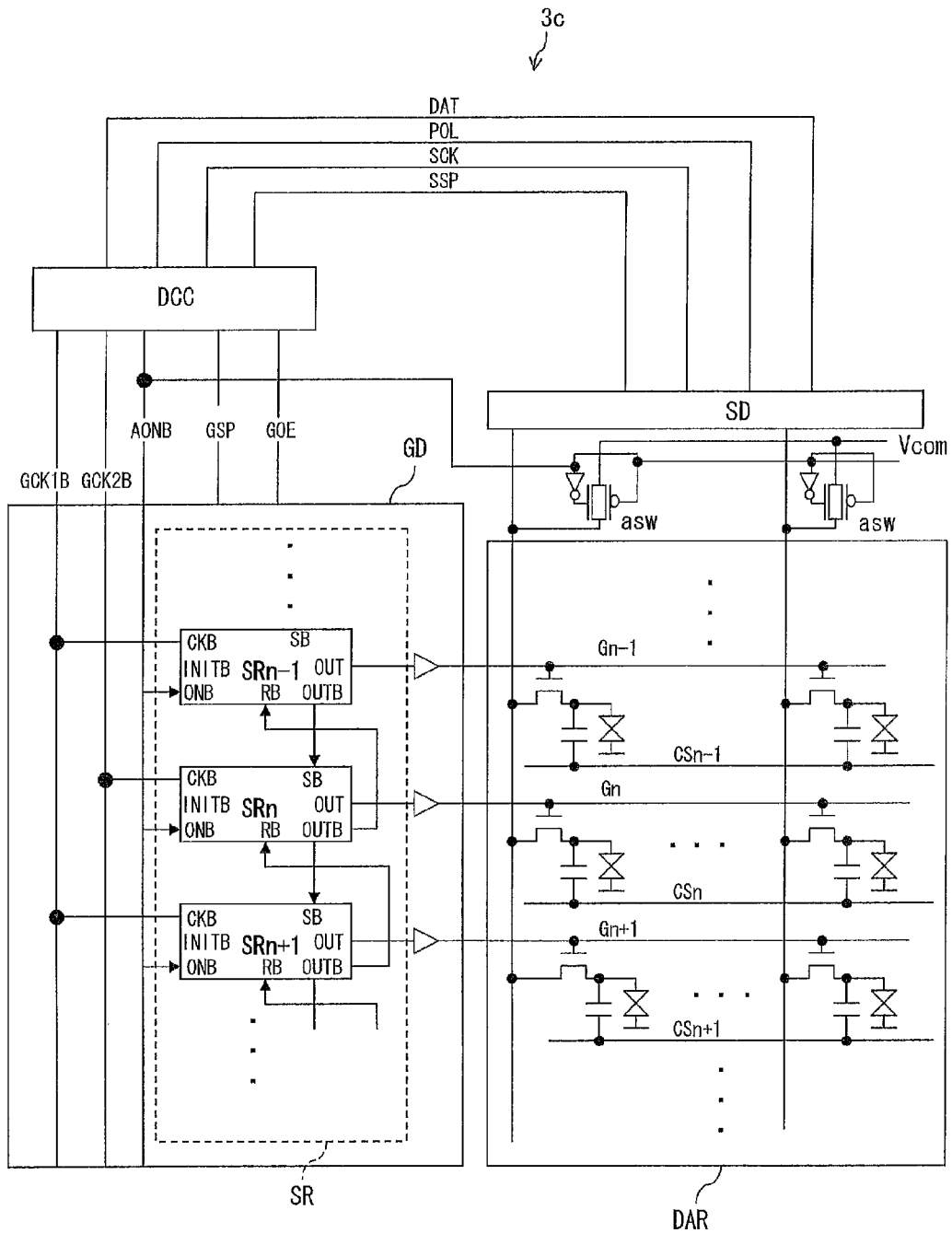

FIG. 14 is a diagram schematically illustrating yet another configuration of a liquid crystal display device of Embodiment 1.

FIG. 15

Figure 15:
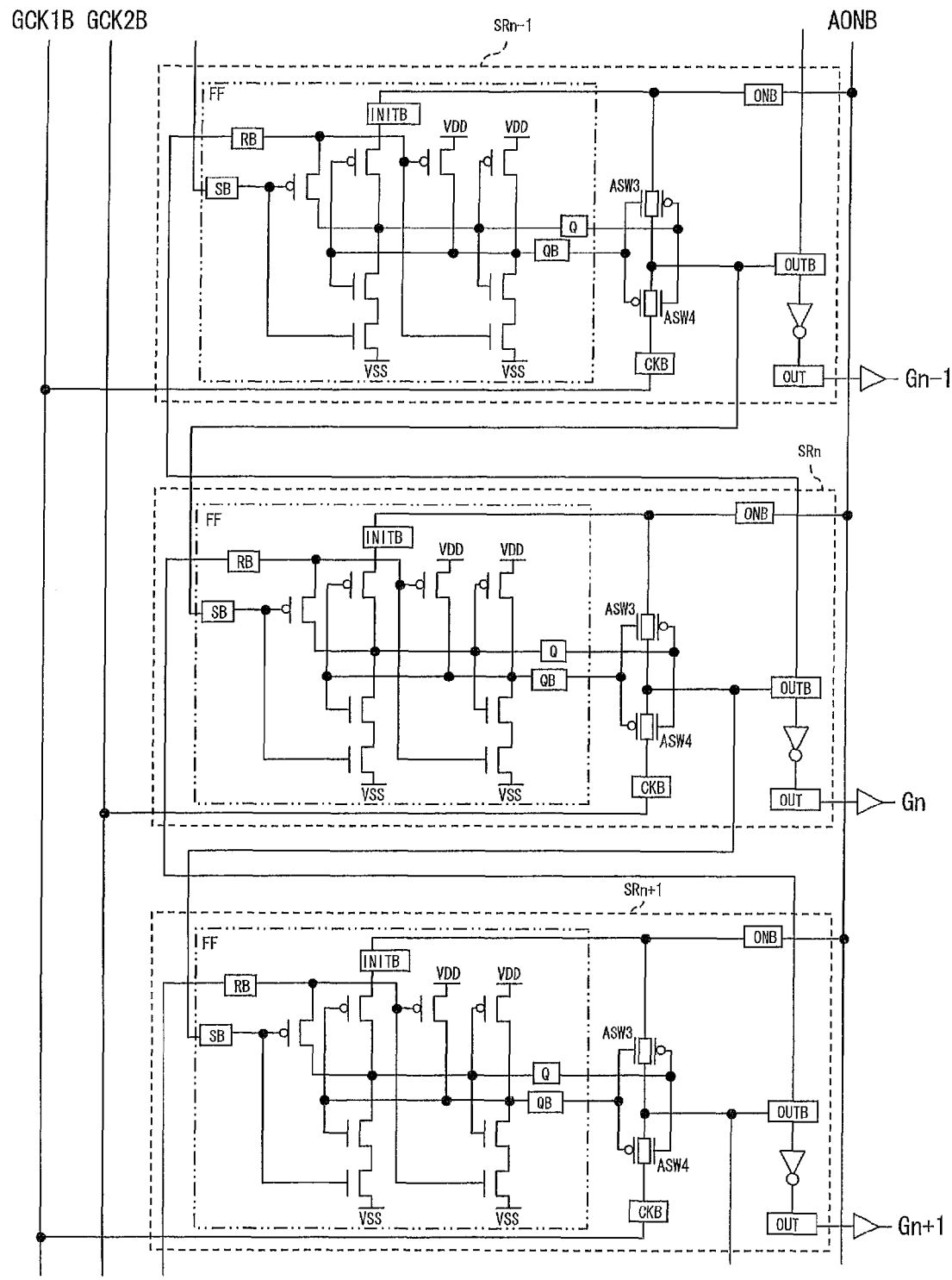

FIG. 15 is a circuit diagram illustrating a part of a shift register of the liquid crystal display device illustrated in FIG. 14.

FIG. 16

(*a*) is a circuit diagram for a flip-flop of the shift register illustrated in FIG. 15, (*b*) is an operation timing chart, and (*c*) is a truth table for the flip-flop.

FIG. 17

Figure 17:
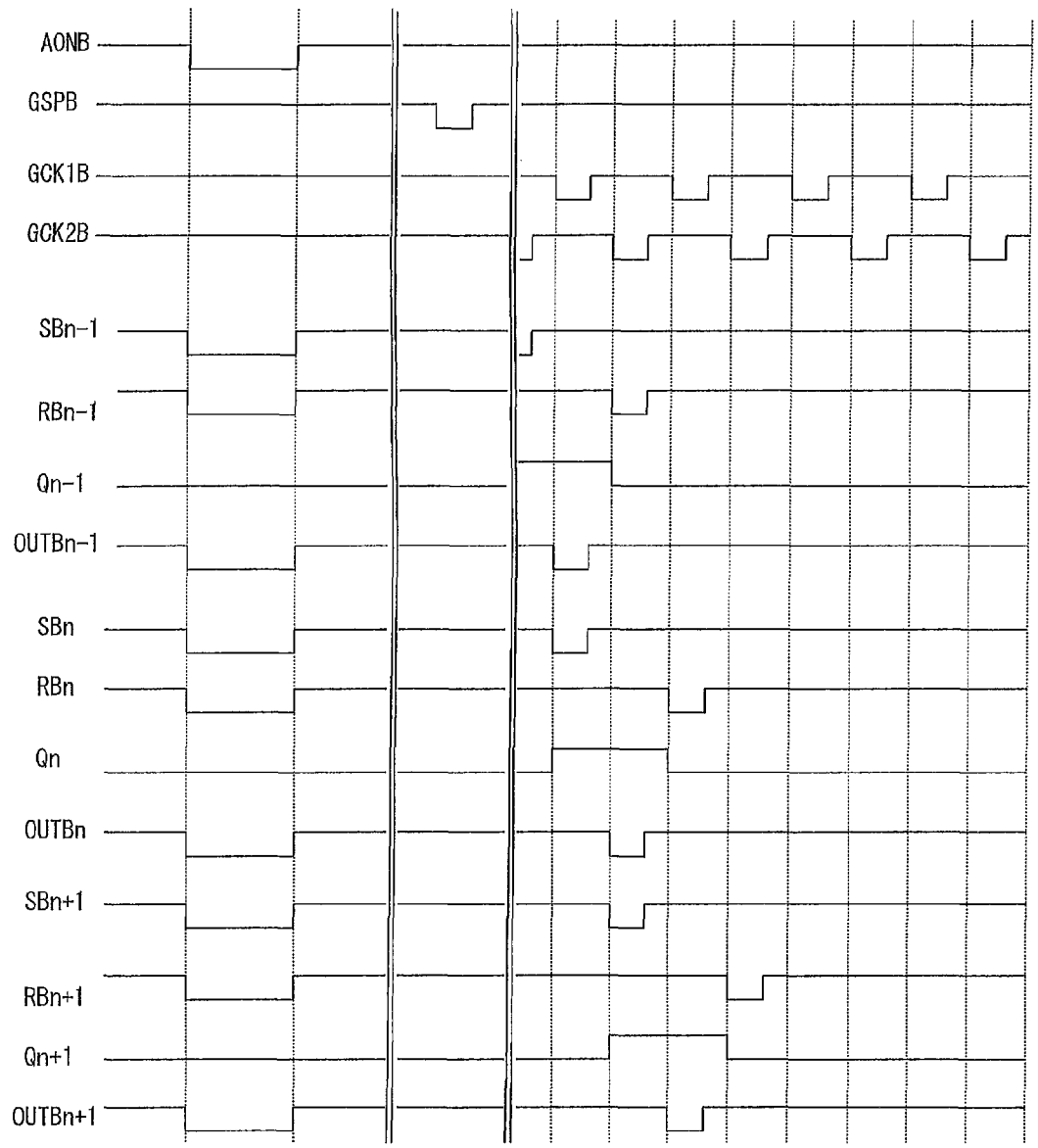

FIG. 17 is a timing chart illustrating how the liquid crystal display device of FIG. 14 is driven when turned on.

FIG. 18

Figure 18:
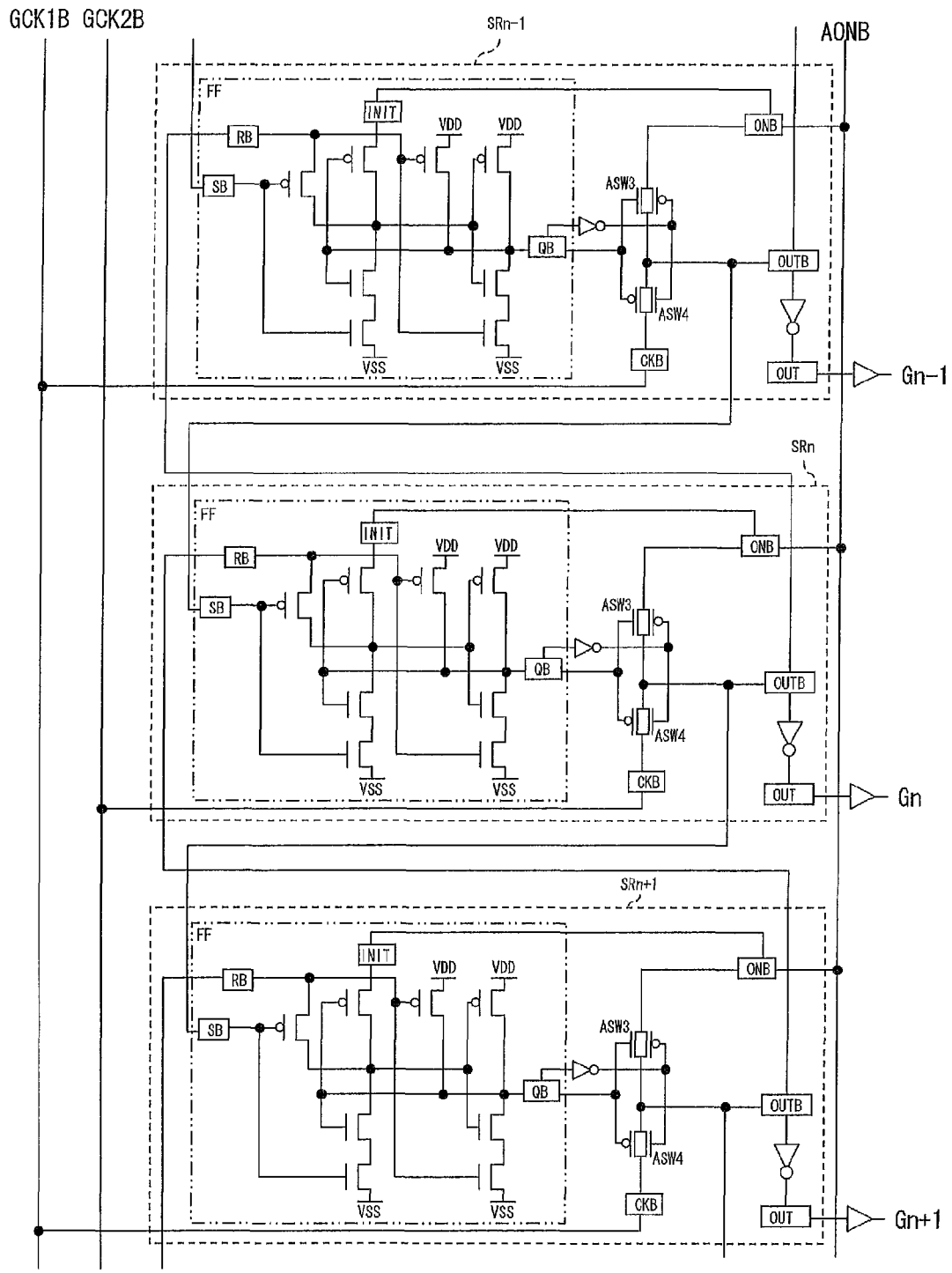

FIG. 18 is a circuit diagram illustrating a variation of the shift register illustrated in FIG. 15.

FIG. 19

Figure 19:
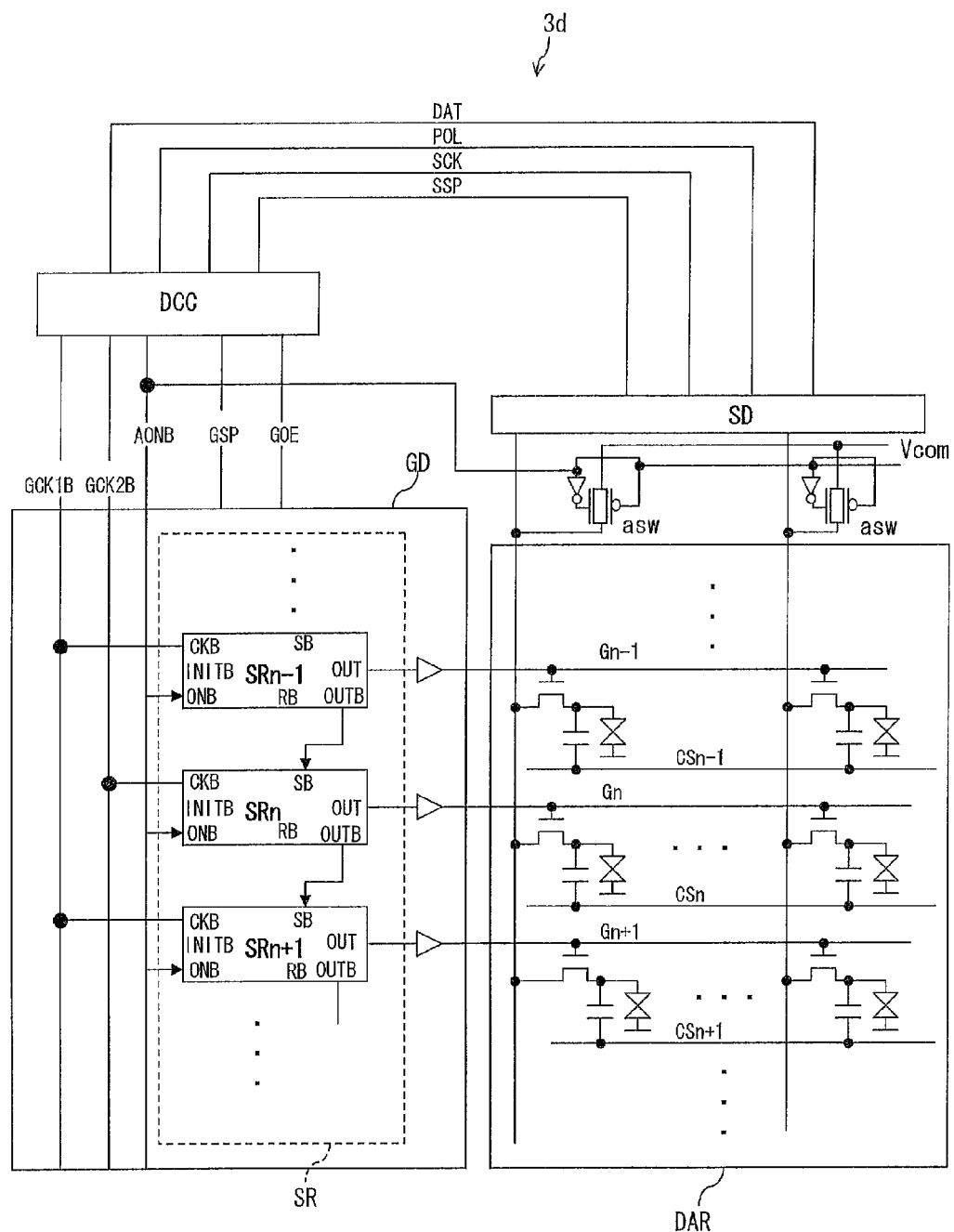

FIG. 19 is a diagram schematically illustrating a configuration of a liquid crystal display device of Embodiment 2.

FIG. 20

Figure 20:
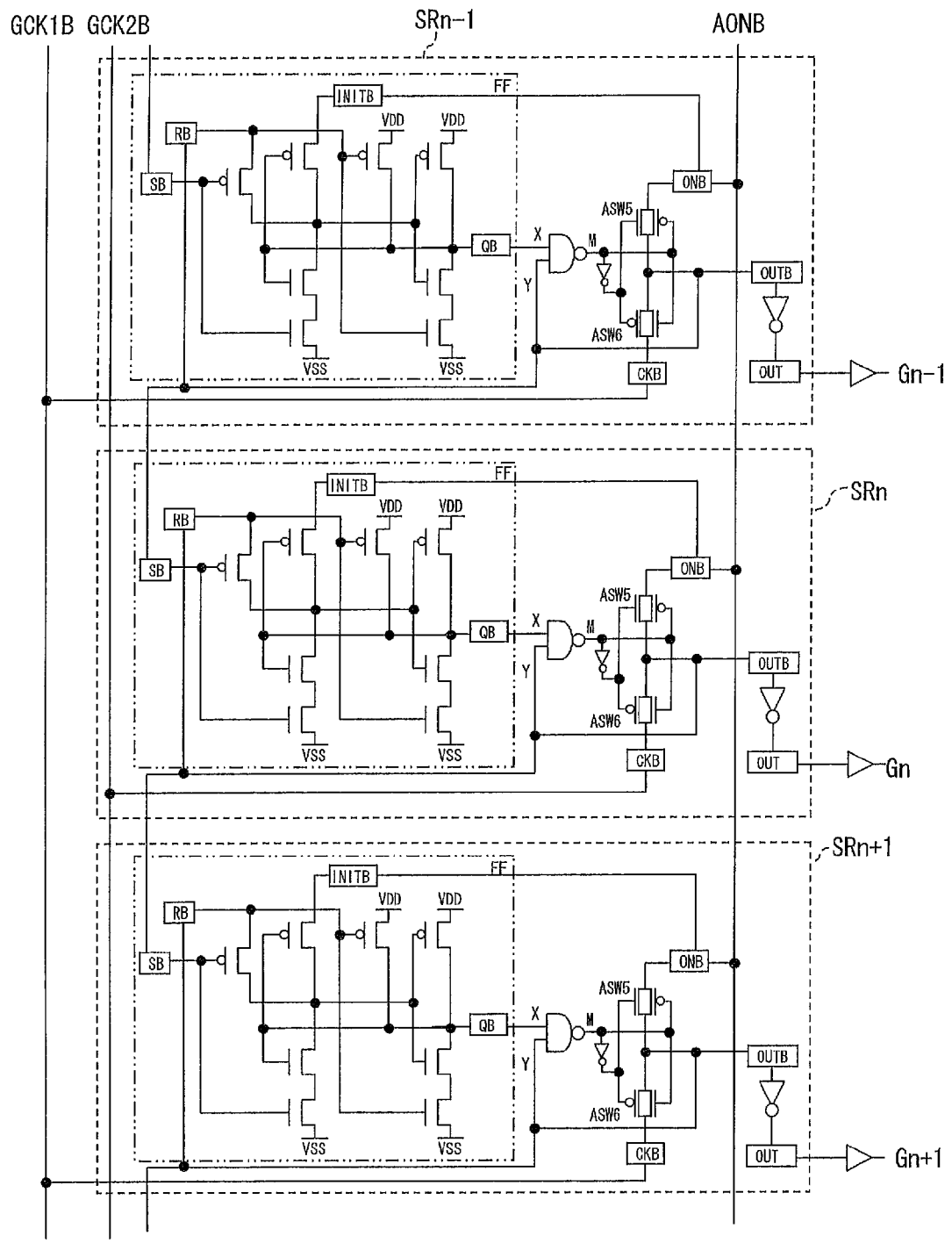

FIG. 20 is a circuit diagram illustrating a part of a shift register of the liquid crystal display device illustrated in FIG. 19.

FIG. 21

Figure 21:
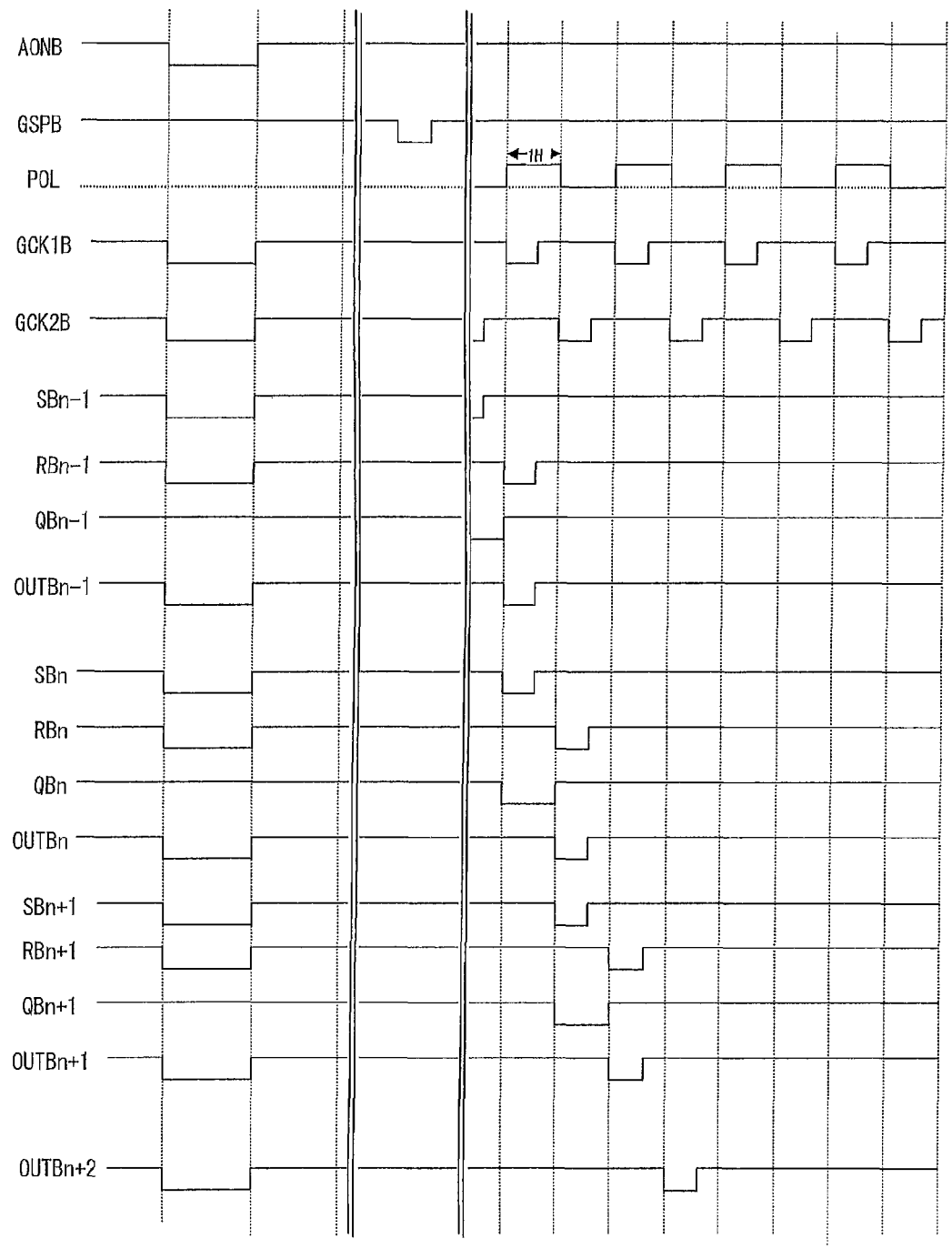

FIG. 21 is a timing chart illustrating how the liquid crystal display device of FIG. 19 is driven when turned on.

FIG. 22

Figure 22:
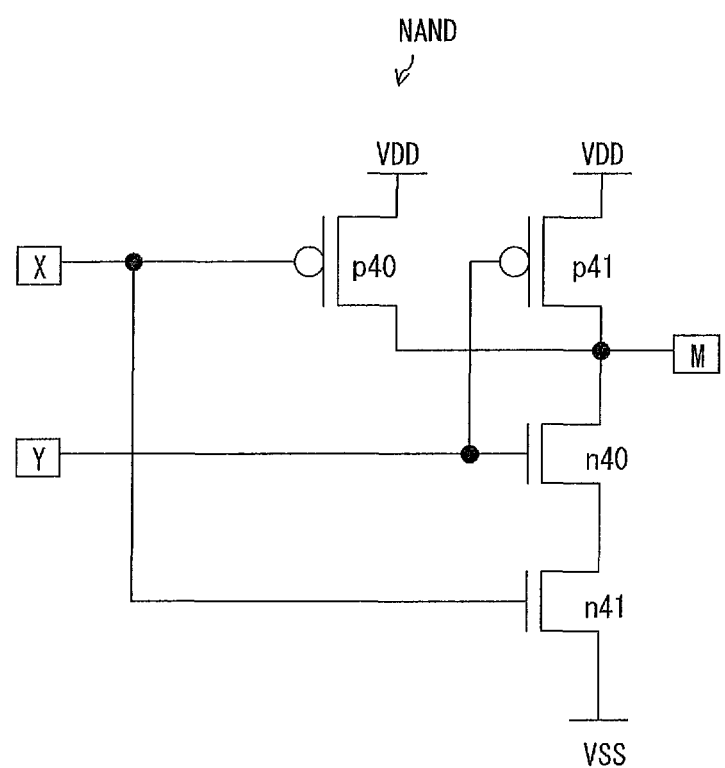

FIG. 22 is a circuit diagram illustrating a detailed configuration of a NAND of FIG. 20.

FIG. 23

Figure 23:
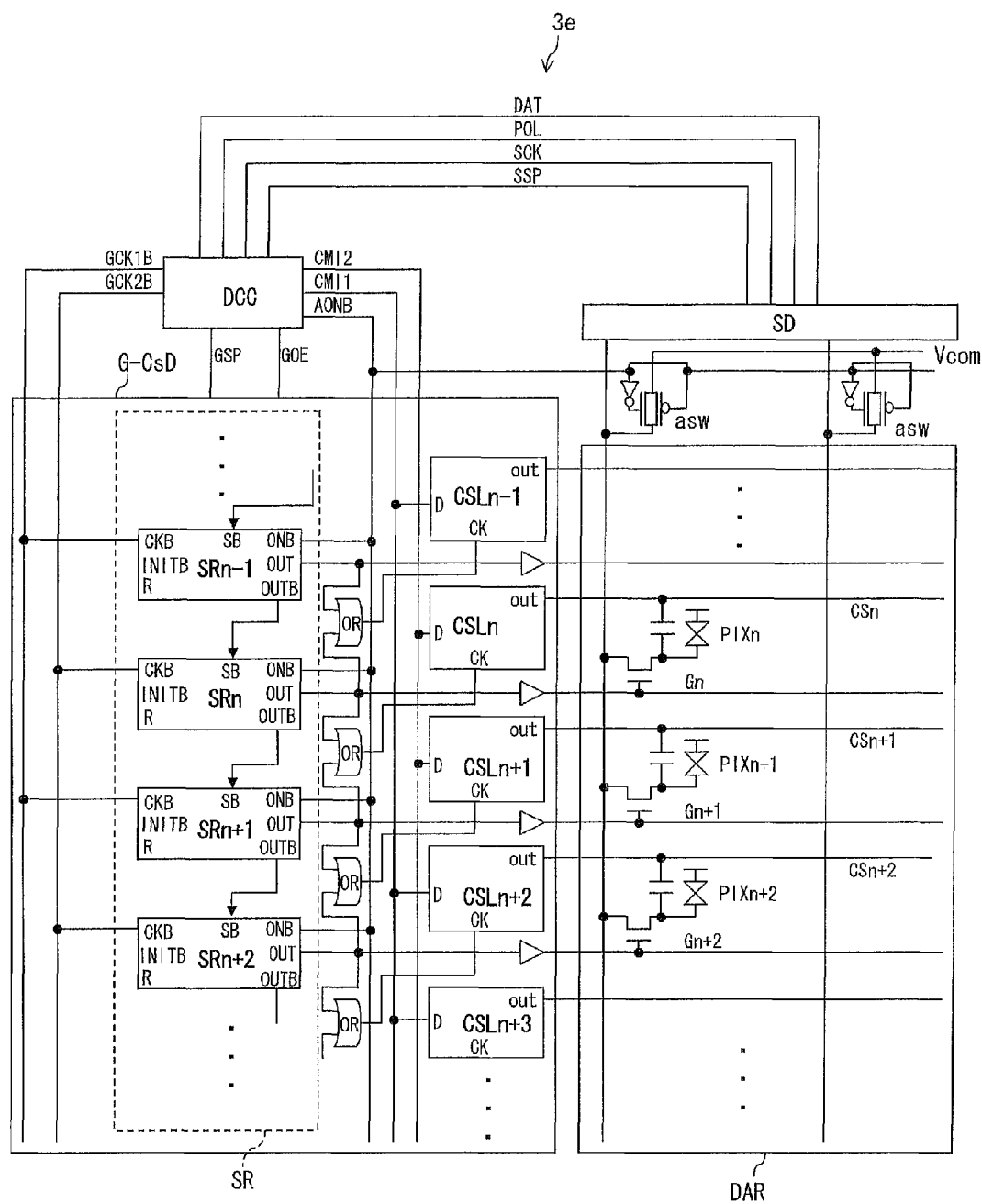

FIG. 23 is a diagram schematically illustrating a configuration of a liquid crystal display device of Embodiment 3.

FIG. 24

Figure 24:
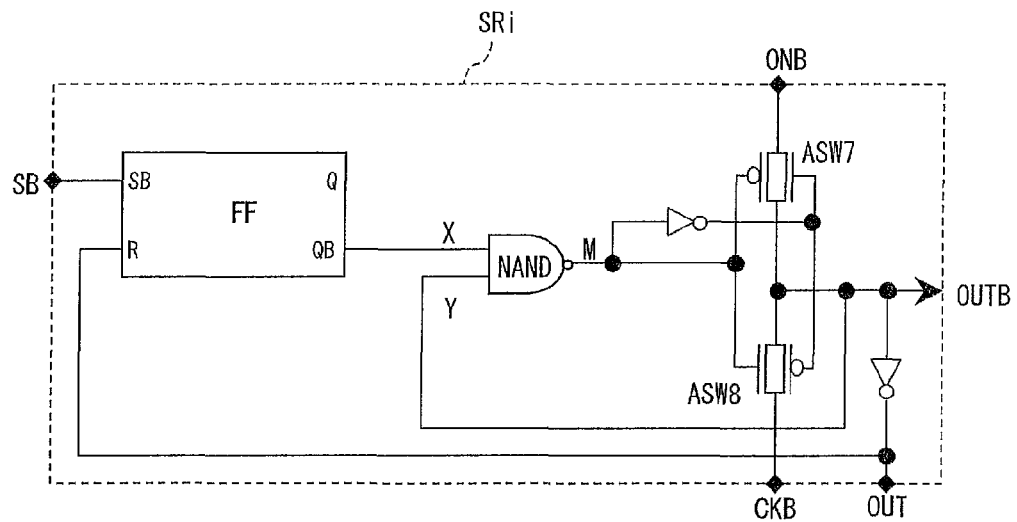

FIG. 24 is a circuit diagram illustrating each stage of a shift register of the liquid crystal display device illustrated in FIG. 23.

FIG. 25

Figure 25:
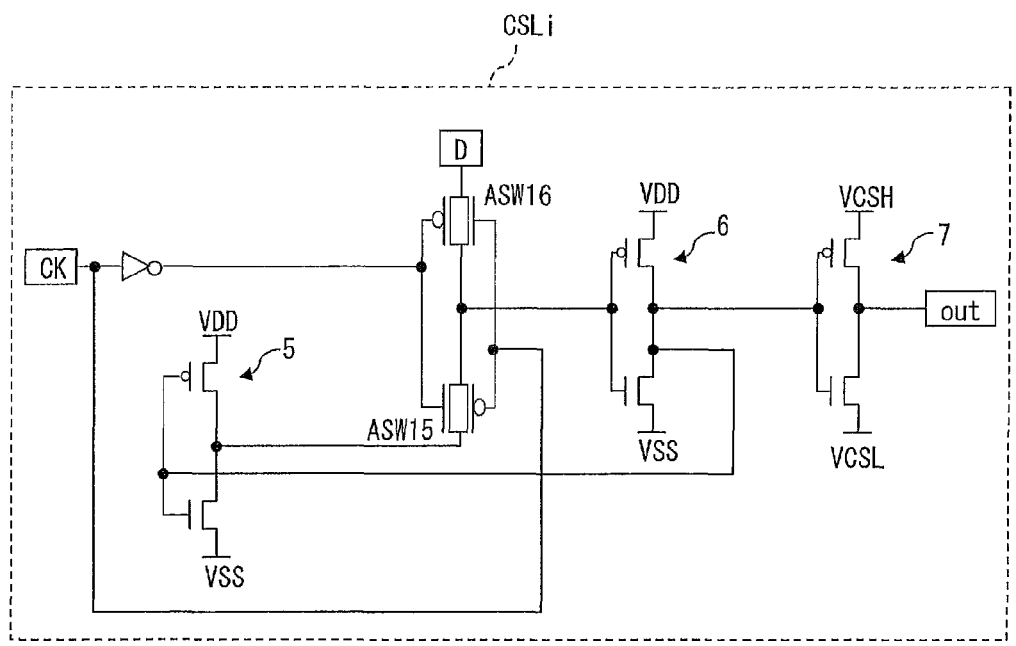

FIG. 25 is a circuit diagram illustrating a D-latch circuit of a G-CS driver of the liquid crystal display device illustrated in FIG. 23.

FIG. 26

Figure 26:
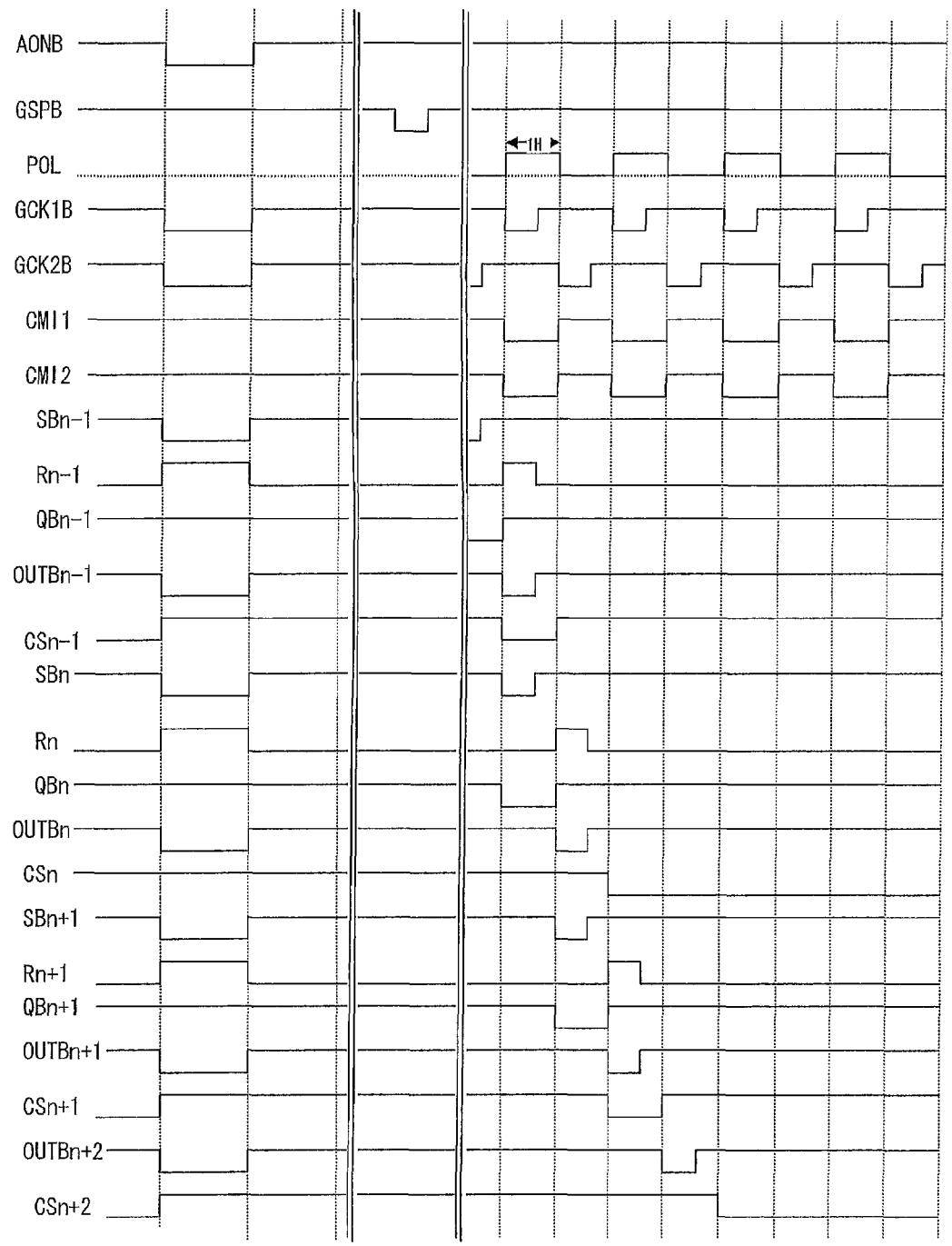

FIG. 26 is a timing chart illustrating how the liquid crystal display device of FIG. 23 is driven.

FIG. 27

Figure 27:
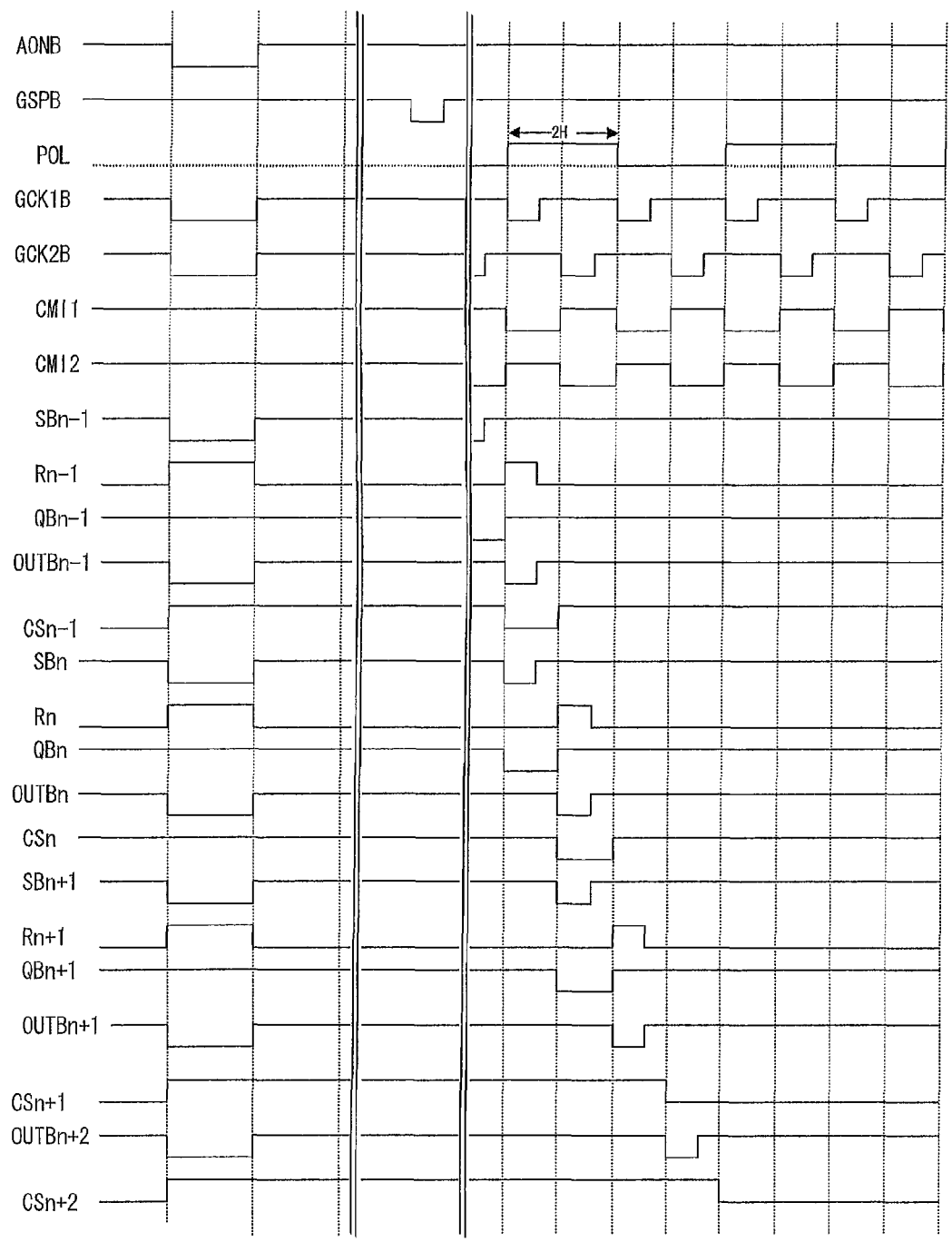

FIG. 27 is a timing chart illustrating how the liquid crystal display device of FIG. 23 is driven.

FIG. 28

Figure 28:
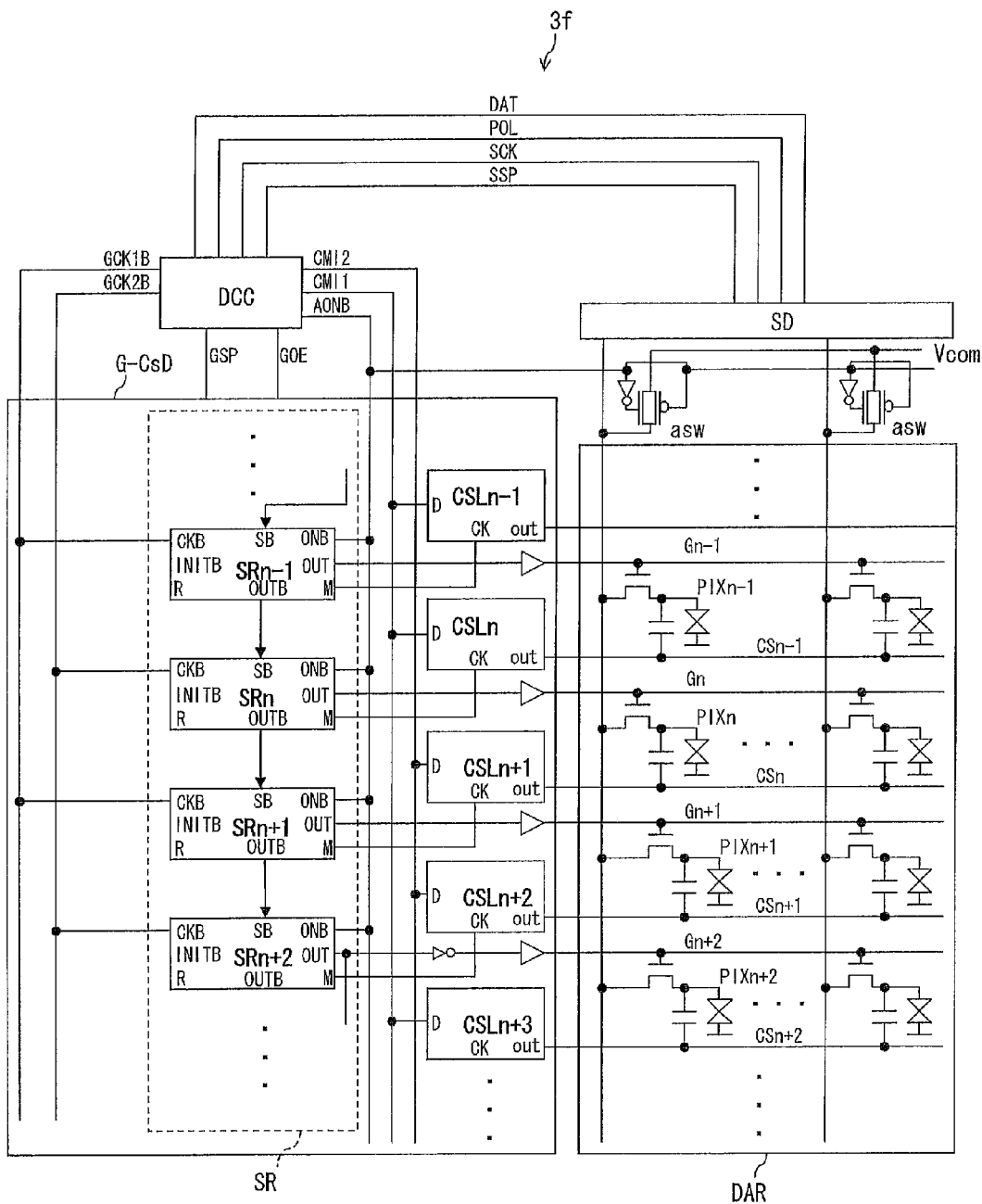

FIG. 28 is a diagram schematically illustrating a configuration of a liquid crystal display device of Embodiment 4.

FIG. 29

Figure 29:
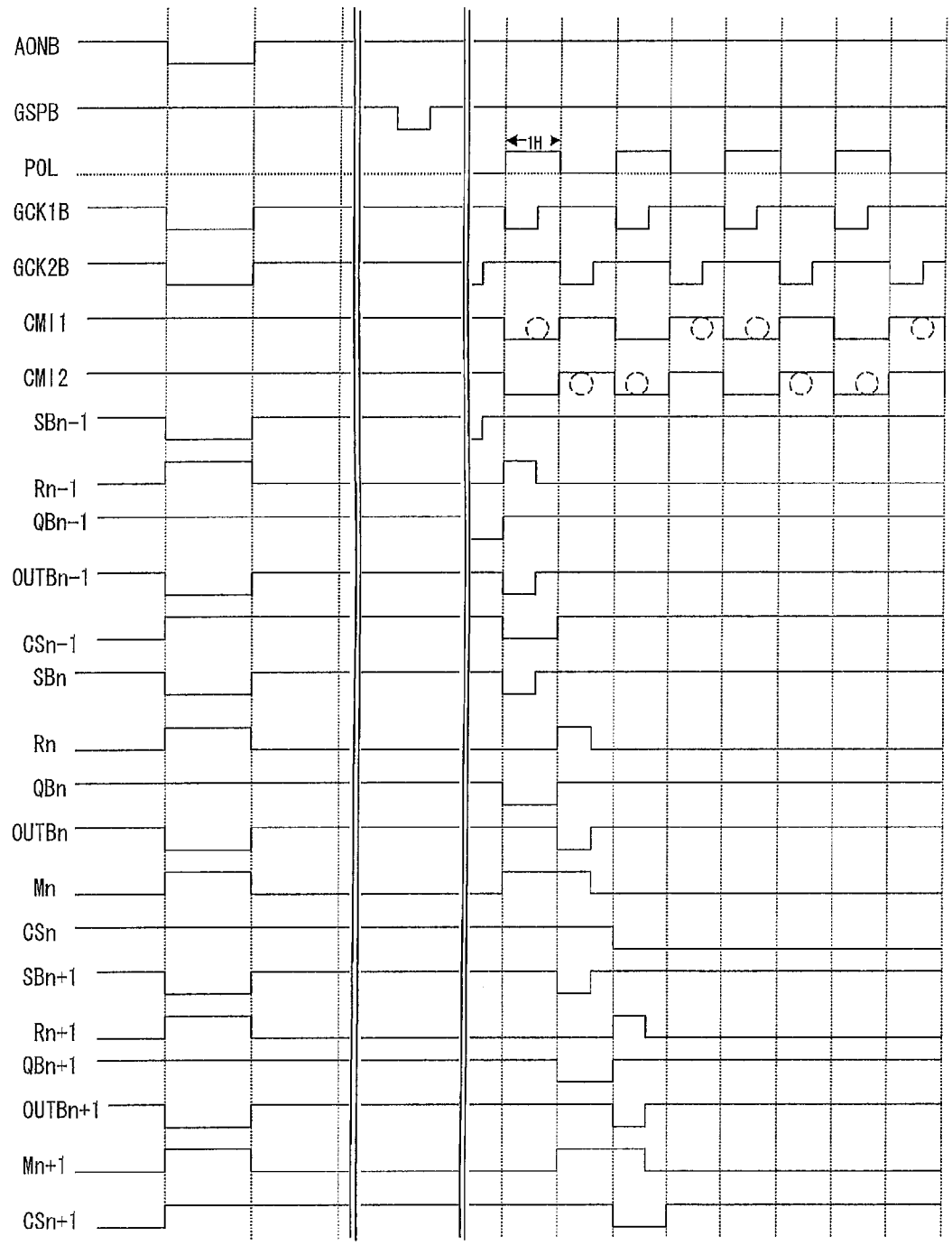

FIG. 29 is a timing chart illustrating how the liquid crystal display device of FIG. 28 is driven.

FIG. 30

Figure 30:
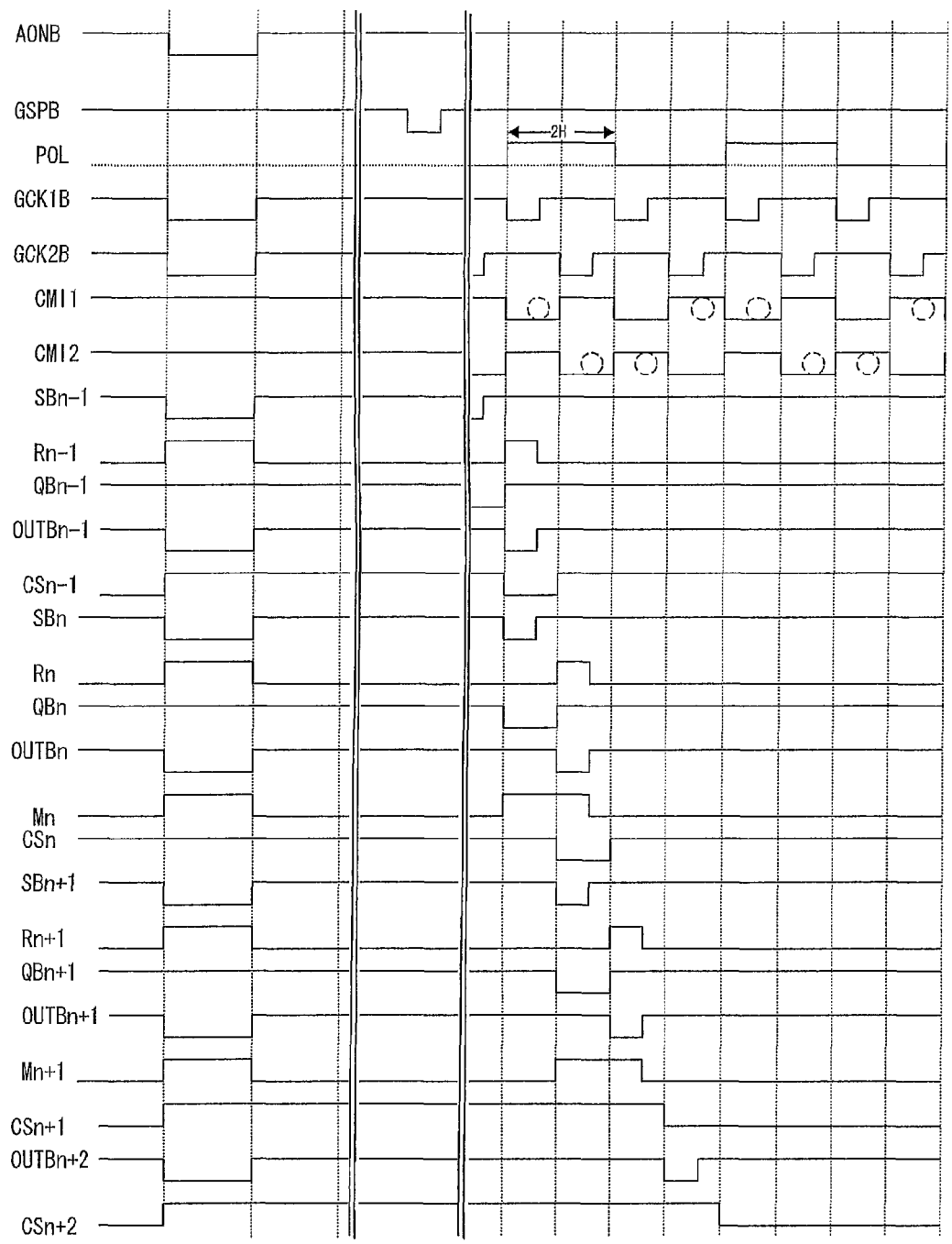

FIG. 30 is a timing chart illustrating how the liquid crystal display device of FIG. 28 is driven.

FIG. 31

Figure 31:
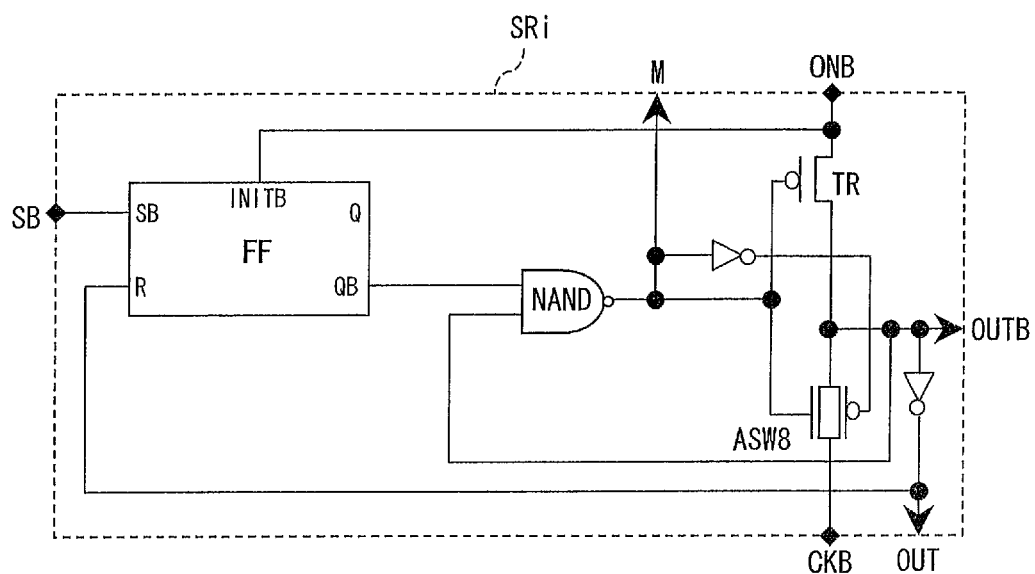

FIG. 31 is a circuit diagram illustrating an example configuration of each stage of a shift register.

FIG. 32

Figure 32:
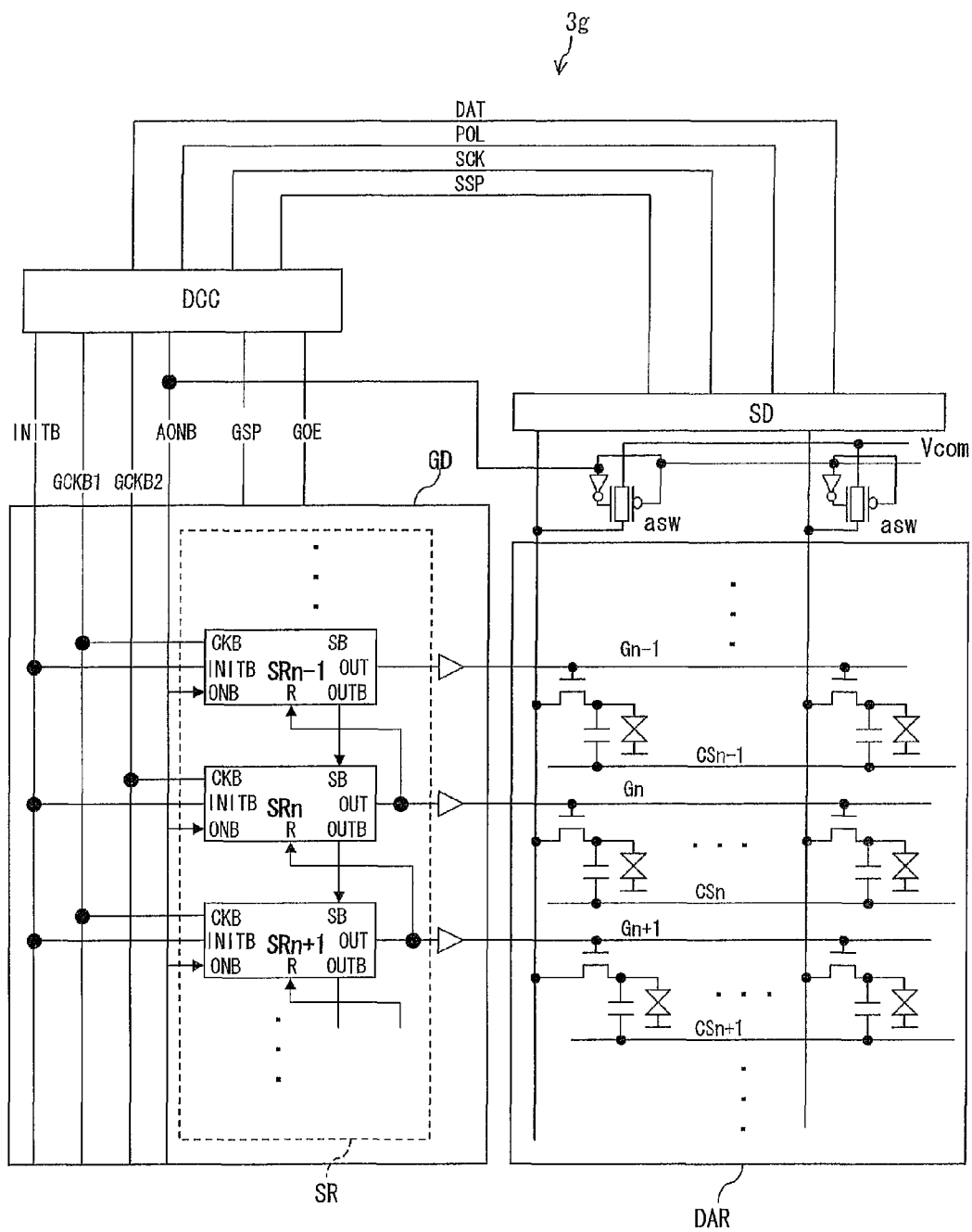

FIG. 32 is a diagram schematically illustrating a configuration of a liquid crystal display device of Embodiment 5.

FIG. 33

Figure 33:
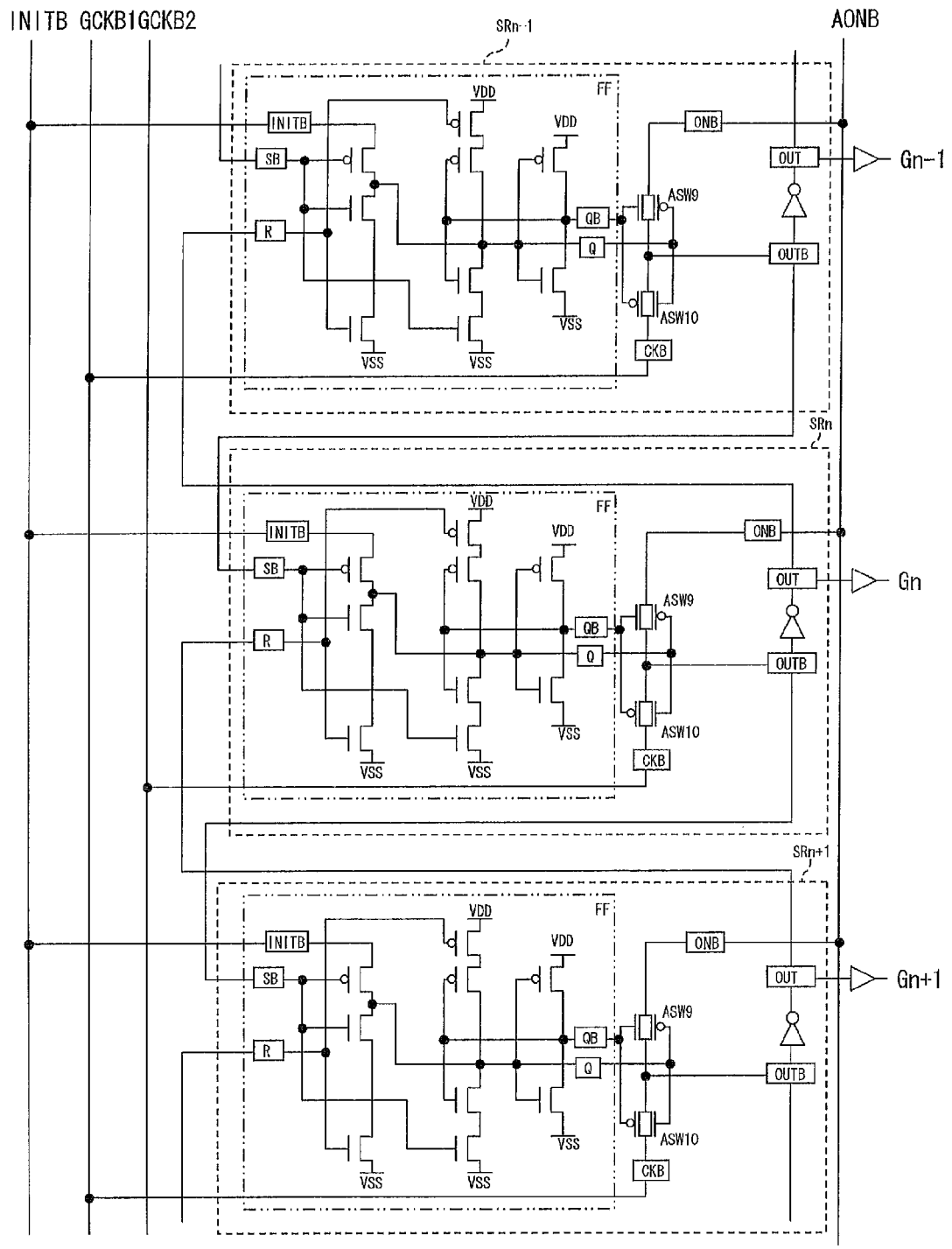

FIG. 33 is a circuit diagram illustrating a part of a shift register of the liquid crystal display device illustrated in FIG. 32.

FIG. 34

Figure 34:
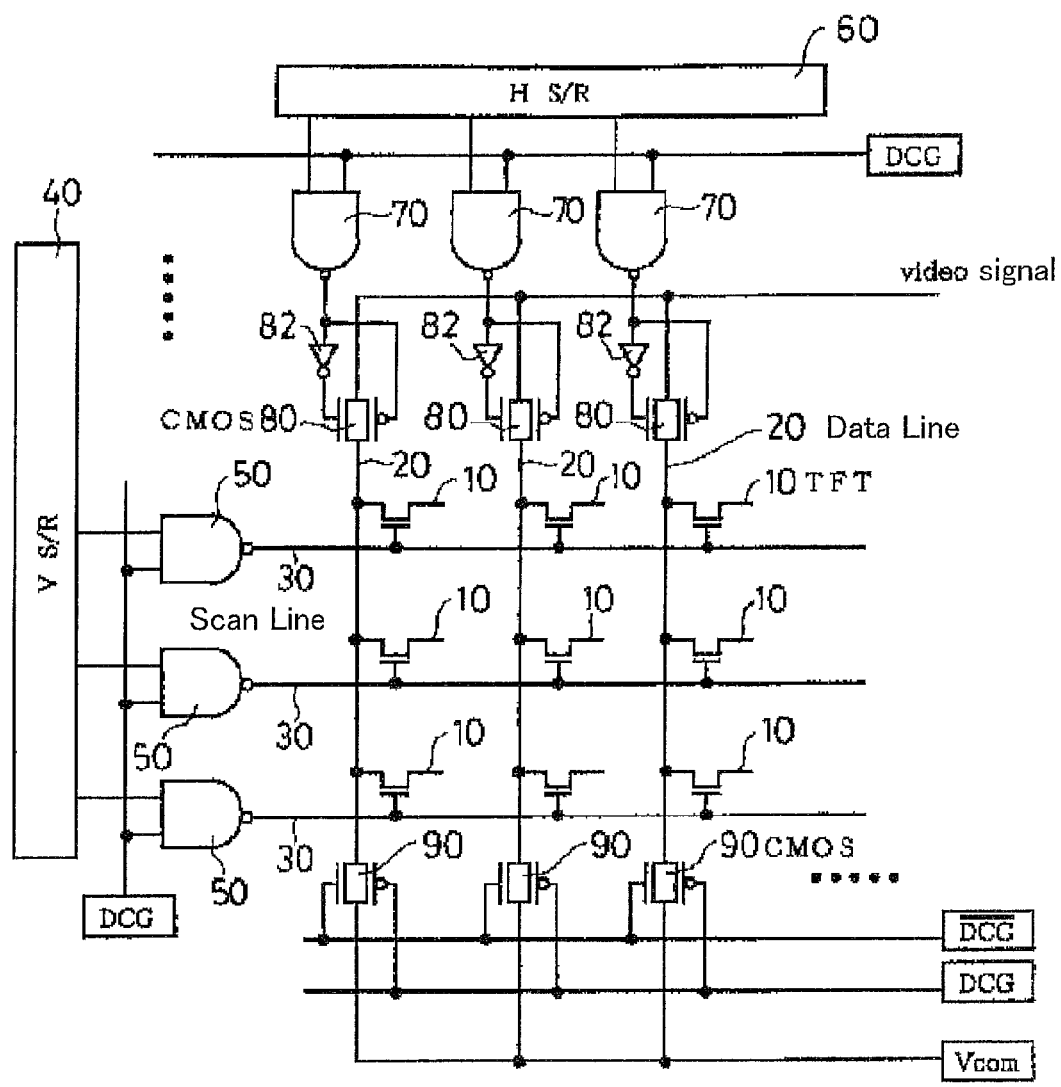

FIG. 34 is a circuit diagram illustrating a configuration of a conventional shift register.

DESCRIPTION OF EMBODIMENTS

Embodiments of the present invention are described below with reference to FIGS. 1 through 33. In the description below, a set-reset flip-flop (hereinafter referred to as FF as appropriate) has (i) a set terminal (an S terminal or an SB terminal) supplied with a set signal (an S signal or an SB signal), (ii) a reset terminal (an R terminal or an RB terminal) supplied with a reset signal (an R signal or an RB signal), (iii) an output terminal (a Q terminal) outputting a Q signal, and (iv) an inverted output terminal (a QB terminal) outputting a QB signal. The description below refers to (i) a potential of a high potential power supply (VDD) as Vdd (hereinafter referred to as High as appropriate) and (ii) a potential of a low potential power supply (VSS) as Vss (hereinafter referred to as Low as appropriate). The S signal (set signal), the R signal (reset signal), and the Q signal (output signal) are each a signal that has a High potential during its active period, whereas the SB signal (set bar signal), the RB signal (reset bar signal), and the QB signal (inverted output signal) are each a signal that has a Low potential during its active period.

Embodiment 1

FIG. 1 is a circuit diagram illustrating a configuration of a liquid crystal display device $3a$ of the present invention. The liquid crystal display device $3a$ includes: a display section DAR; a gate driver GD; a source driver SD; and a display control circuit DCC. The display control circuit DCC supplies to the gate driver GD an AON signal (simultaneous selection signal), a gate start pulse GSP, a gate-on enable signal GOE, and gate clock signals GCK1 and GCK2. The display control circuit DCC supplies to the source driver SD a source start pulse SSP, digital data DAT, a polarity signal POL, and a source clock signal SCK. The gate driver GD includes a shift register SR having a plurality of stages. The description below uses as appropriate the symbol i-th stage SRi to refer to an i-th stage (where i=1 ... n−1, n, n+1 ... ) of the shift register.

The shift register supplies from its i-th stage SRi an output signal (OUT signal) to a scanning signal line Gi in the display section DAR via a buffer. For example, the shift register supplies from its n-th stage SRn an OUT signal to a scanning signal line Gn via a buffer. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn.

The liquid crystal display device $3a$ includes an analog switch asw and an inverter in correspondence with each data signal line. The inverter has an input connected with an AON signal line. The data signal line has an end connected with a first conducting terminal of the analog switch asw, whereas a second conducting terminal of the analog switch asw is connected with a Vcom (common electrode potential) power supply. The analog switch asw has (i) a P channel side gate connected with an output of the inverter and (ii) an N channel side gate connected with the AON signal line.

FIG. 2 is a circuit diagram illustrating a detailed configuration of a part of the shift register SR. As illustrated in FIG. 2, the shift register includes, in each of its stages: a set-reset flip-flop FF including an SB terminal, an R terminal, and an INIT terminal; two analog switches ASW1 and ASW2; an inverter; a CK terminal; an ON terminal; an OUT terminal; and an OUTB terminal. The INIT terminal of the flip-flop FF is connected with the ON terminal. The Q terminal of the FF is connected with a P channel side gate of the analog switch ASW1 and with an N channel side gate of the analog switch ASW2. The QB terminal of the FF is connected with an N channel side gate of the analog switch ASW1 and with a P channel side gate of the analog switch ASW2. The analog switch ASW1 has a first conducting electrode connected with the ON terminal, whereas the analog switch ASW2 has a first conducting electrode connected with the CK terminal. The analog switch ASW1 has a second conducting electrode connected with a second conducting electrode of the analog switch ASW2 and with the OUT terminal, which is an output terminal of the stage. The OUT terminal is connected with the OUTB terminal via the inverter.

The shift register SR is arranged such that the OUTB terminal of its first stage is connected with the SB terminal of its following second stage and that the OUT terminal of the second stage is connected with the R terminal of the first stage. For example, the OUTB terminal of the n-th stage SRn is connected with the SB terminal of an (n+1)-th stage SRn+1, whereas the OUT terminal of the (n+1)-th stage SRn+1 is connected with the R terminal of the n-th stage SRn. The shift register SR has its initial stage SR1 having an SB terminal that is supplied with a GSPB signal. The gate driver GD is arranged such that the ON terminal of each stage is connected with the AON signal line and that the CK terminal of each odd-numbered stage is connected with a GCK line (that is, a line through which a GCK is supplied) that is different from a GCK line with which the CK terminal of each even-numbered stage is connected. For example, the CK terminal of the n-th stage SRn is connected with a GCK2 signal line, whereas the CK terminal of the (n+1)-th stage SRn+1 is connected with a GCK1 signal line.

Figure 3:
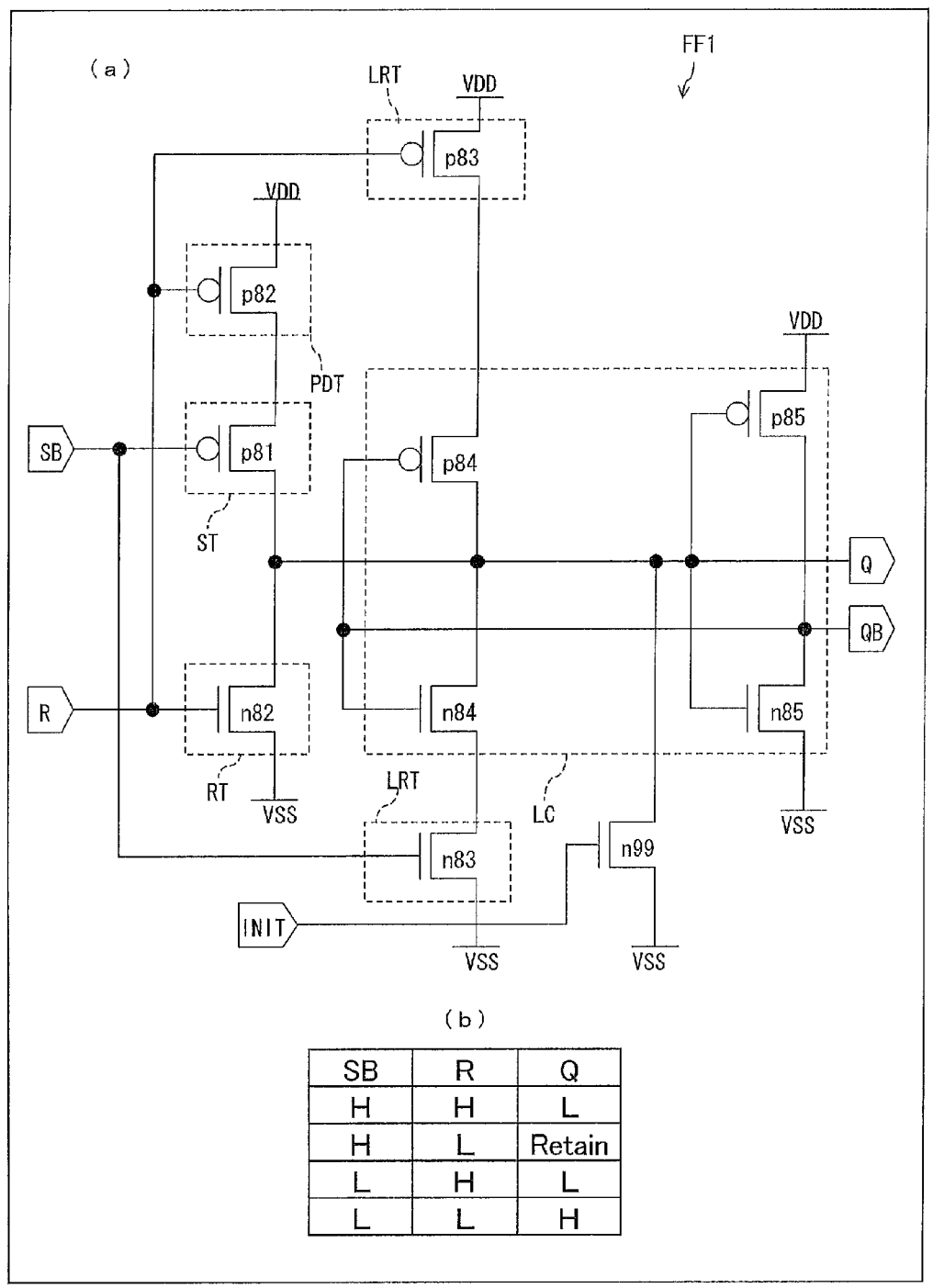
FIG. 3

The flip-flop FF of FIG. 2 is a FF1 illustrated in FIG. 3. As illustrated in FIG. 3, the FF1 includes: a P channel transistor p84 and an N channel transistor n84 constituting a CMOS circuit; a P channel transistor p85 and an N channel transistor n85 constituting a CMOS circuit; P channel transistors p81, p82, and p83; N channel transistors n82, n83, and n99; an SB terminal; an R terminal; and Q and QB terminals. The p84 has a gate connected with a gate of the n84, a drain of the p85, a drain of the n85, and the QB terminal. The p84 has a drain connected with a drain of the n84, a drain of the p81, a drain of the n82, a gate of the p85, a gate of the n85, a drain of the n99, and the Q terminal. The n84 has a source connected with a drain of the n83. The p84 has a source connected with a drain of the p83. The p81 has a source connected with a drain of the p82. The INIT terminal is connected with a gate of the n99. The SB terminal is connected with a gate of the p81 and a gate of the n83. The R terminal is connected with a gate of the n82, a gate of the p82, and a gate of the p83. The n85 has a source connected with a VSS. The p82, the p83 and the p85 each have a source connected with a VDD. The n82, the n99, and the n83 each have a source connected with the VSS. In the FF1, the p84, the n84, the p85, and the n85 constitute a latch circuit LC; the p81 serves as a set transistor ST; the n82 serves as a reset transistor RT; the p83 and the n83 each serve as a latch removing transistor LRT; and the p82 serves as a priority determining transistor PDT.

(b) of FIG. 3 is a truth table for the FF1. As illustrated in (b) of FIG. 3, the Q signal of the FF1 (i) is Low (non-active) while the SB signal is High (non-active) and the R signal is High (active), (ii) retains the current potential while the SB signal is High (non-active) and the R signal is Low (non-active), (iii) is Low (non-active) while the SB signal is Low (active) and the R signal is High (active), and (iv) is High (active) while the SB signal is Low (active) and the R signal is Low (non-active). In the flip-flop FF1, in the case where the SB signal and the R signal have both become active while the INIT terminal is High (active), the n82, the n99, and the p85 are turned on so that the Q signal becomes Low and the QB signal becomes High (non-active).

FIGS. 4 through 6 are timing charts illustrating how the liquid crystal display device 3a is driven when turned on, turned off, and forcibly shut down, respectively. In FIGS. 4 through 6, AON represents an AON signal (simultaneous selection signal); GSPB represents a gate start pulse bar signal; GCK1 represents a GCK1 signal; and GCK2 represents a GCK2 signal. Further, SBi, Ri, Qi, and OUTi (i=n−1, n, and n+1) respectively represent an SB signal (potential of the SB terminal), an R signal (potential of the R terminal), a Q signal (potential of the Q terminal), and an OUT signal (potential of the OUT terminal) in the i-th stage SRi.

When the liquid crystal display device 3a is turned on and off, a preparation operation is carried out. Specifically, the preparation operation causes the AON signal to be active (High) during a predetermined period. Since the ASW1 of each stage of the shift register SR is on, the OUT signal of each stage becomes active (High) as a result of the activation, so that all scanning signal lines are selected. Further, the analog switch asw corresponding to each data signal line is turned on due to the activation of the AON signal, so that all data signal lines are supplied with a Vcom. Since in the flip-flop of each stage, the INIT terminal supplied with the AON signal becomes active (High), the Q signal becomes Low (non-active) and the QB signal becomes High (non-active). After the above preparation operation ends (that is, after the AON signal becomes non-active), the liquid crystal display device 3a achieves a state in which the Vcom has been written to each PIX in the display section DAR and in which the shift register SR has been initialized (that is, the output of the flip-flop in each stage has become non-active).

The shift register SR of the liquid crystal display device 3a carries out the following operation during each vertical scanning period (that is, while each frame is displayed): When the SB signal supplied to a first stage has become active (=Low), the FF of the first stage is set. This causes the Q signal to be High (active), and the first stage in turn receives a GCK signal via the analog switch ASW2. When the GCK signal supplied to the first stage has become active (High), the OUT signal of the first stage becomes active (High), and the SB signal of the following second stage becomes active as well. This causes the OUT signal of the FF of the second stage to be active, and the second stage in turn receives a GCK signal. When the GCK signal of the second stage has become active (High), the FF of the first stage is reset. This causes the Q signal of the first stage to be Low (non-active) and turns on the analog switch ASW1 of the first stage. Since the AON signal is Low at that moment, the OUT signal of the first stage becomes Low (non-active) as well.

The liquid crystal display device 3a, when turned on and off, simultaneously selects all scanning signal lines so that an identical potential (for example, Vcom) is written to all pixels. This prevents an image disturbance caused when the liquid crystal display device 3a is turned on and off. In comparison with a conventional arrangement (see FIG. 34), the present arrangement (i) supplies an AON signal to the ASW1 to eliminate the need for a NAND element of FIG. 34 that receives an output signal of each stage and (ii) supplies an AON signal to the INIT terminal of each FF to eliminate the need for a component that generates and transmits a signal for initializing the shift register. This allows the gate driver to be downsized. In addition, the present arrangement initializes the shift register (that is, initializes the flip-flop of each stage) when simultaneously selecting all scanning signal lines. The present arrangement can thus complete a preparation operation more rapidly than a conventional arrangement which carries out simultaneous selection of all scanning signal lines and initialization of a shift register separately.

FIG. 7 is a circuit diagram illustrating a configuration of a liquid crystal display device 3b, which includes the shift register SR of FIG. 1 in a source driver. This configuration causes (i) the initial stage of the shift register SR to receive a source start pulse SSP and (ii) the CK terminal of each stage to receive a source clock bar signal SCK1 or SCK2. The OUT signal of the i-th stage SRi is supplied to a sampling circuit SAC. Then, data sampled on the basis of the OUT signal is supplied to a data signal line SLi of the display section DAR via a DAC. For example, the OUT signal of the n-th stage SRn is supplied to the sampling circuit SAC, and data sampled on the basis of the OUT signal is then supplied to a data signal line SLn of the display section DAR via the DAC. The data signal line SLn in the display section DAR is connected with a source of a transistor connected with a pixel electrode in a PIXn.

Figure 9:
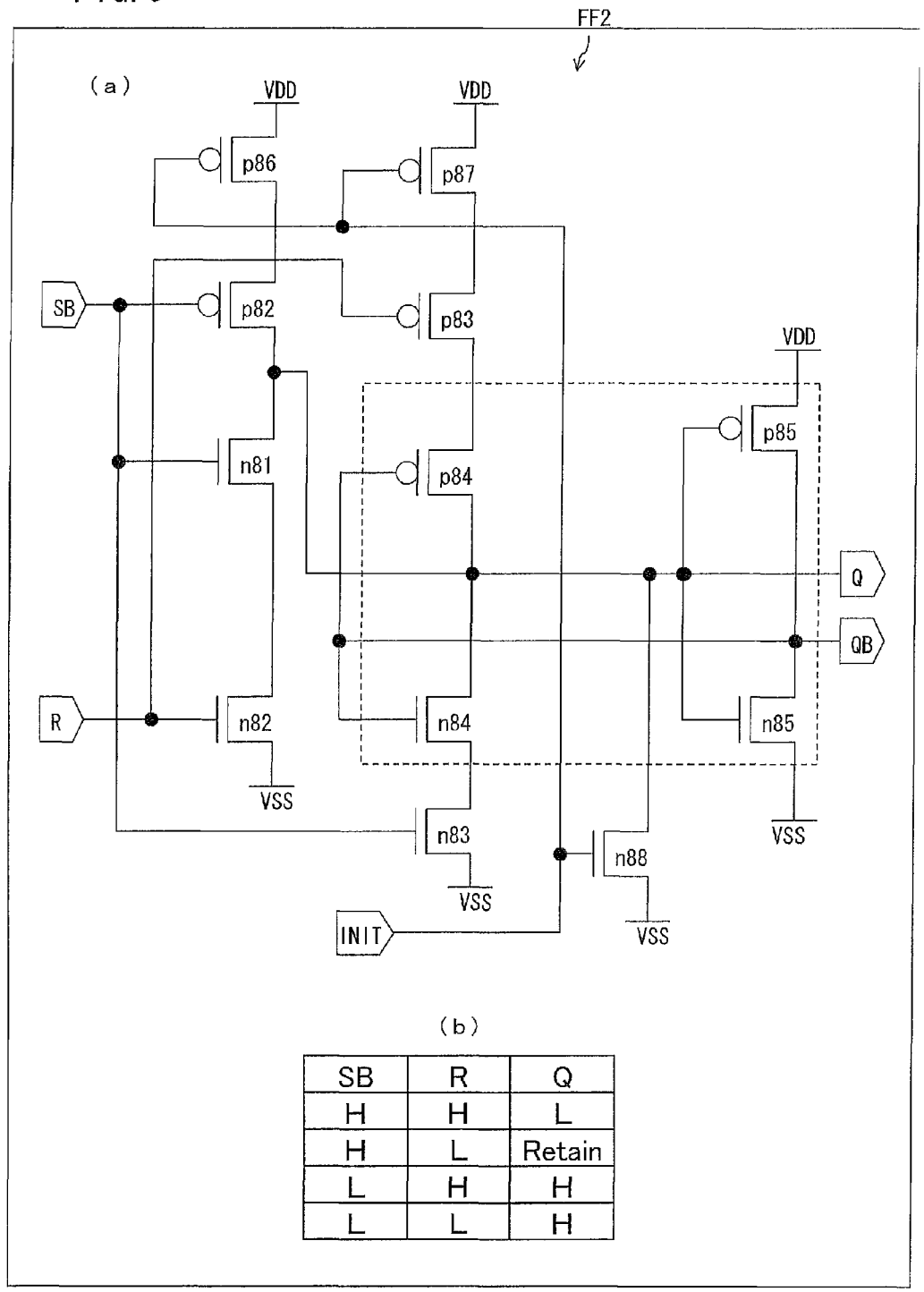

Each stage of the liquid crystal display device 3a may be configured as illustrated in FIG. 8. FIG. 8 illustrates a flip-flop FF, which is a FF2 illustrated in FIG. 9. As illustrated in FIG. 9, the flip-flop FF2 includes: a P channel transistor p84 and an N channel transistor n84 constituting a CMOS circuit; a P channel transistor p85 and an N channel transistor n85 constituting a CMOS circuit; P channel transistors p82, p83, p86, and p87; N channel transistors n81, n82, n83, and n88; an SB terminal; an R terminal; and Q and QB terminals. The p84 has a gate connected with a gate of the n84, a drain of the p85, a drain of the n85, and the QB terminal. The p84 has a drain connected with a drain of the n84, a drain of the p82, a drain of the n81, a gate of the p85, a gate of the n85, a drain of the n88, and the Q terminal. The n84 has a source connected with a drain of the n83. The p84 has a source connected with a drain of the p83. The p83 has a source connected with a drain of the p87. The p82 has a source connected with a drain of the p86. The n81 has a source connected with a drain of the p82. The INIT terminal is connected with respective gates of the n88, the p86, and the p87. The SB terminal is connected with a gate of the p82, a gate of the n81, and a gate of the n83. The R terminal is connected with a gate of the n82 and a gate of the p83. The n85 has a source connected with a VSS. The p86, the p87 and the p85 each have a source connected with a VDD. The n82, the n88, and the n83 each have a source connected with the VSS.

(b) of FIG. 9 is a truth table for the FF2. As illustrated in (b) of FIG. 9, the Q signal of the FF2 (i) is Low (non-active) while the SB signal is High (non-active) and the R signal is High (active), (ii) retains the current potential while the SB signal is High (non-active) and the R signal is Low (non-active), (iii) is High (active) while the SB signal is Low (active) and the R signal is High (active), and (iv) is High (active) while the SB signal is Low (active) and the R signal is Low (non-active). In the flip-flop FF2, in the case where the SB signal and the R signal have both become active while the INIT terminal is High (active), the p86 and the p87 are turned off and the n88 and the p85 are turned on so that the Q signal becomes Low and the QB signal becomes High (non-active).

When the liquid crystal display device 3a having the configuration of FIG. 8 is turned on and off, a preparation operation is carried out. Specifically, the preparation operation causes the AON signal to be active (High) during a predetermined period. Since the ASW1 of each stage of the shift register SR is on, the OUT signal of each stage becomes active (High) as a result of the activation, so that all scanning signal lines are selected. Further, the analog switch asw corresponding to each data signal line is turned on due to the activation of the AON signal, so that all data signal lines are supplied with a Vcom. Since in the flip-flop of each stage, the INIT terminal supplied with the AON signal becomes active (High), the Q signal becomes Low (non-active) and the QB signal becomes High (non-active). After the above preparation operation ends (that is, after the AONB signal becomes non-active), the liquid crystal display device 3a achieves a state in which the Vcom has been written to each PIX in the display section DAR and in which the shift register SR has been initialized (that is, the output of the flip-flop in each stage has become non-active).

The arrangement of FIG. 8 causes setting of the flip-flop FF to have priority over resetting thereof. Thus, when the simultaneous selection ends (that is, when the AON signal returns from an active state to a non-active state), the SB signal is more likely to become non-active before the R signal. The arrangement of FIG. 8 thus prevents a malfunction, that is, prevents the shift register from carrying out, after its initialization, a set operation due to the R signal becoming non-active before the SB signal.

FIG. 10 is a circuit diagram illustrating a configuration of a liquid crystal display device 3x. The liquid crystal display device 3x includes: a display section DAR; a gate driver GD; a source driver SD; and a display control circuit DCC. The display control circuit DCC supplies to the gate driver GD an AONB signal (simultaneous selection signal), a gate start pulse GSP, a gate-on enable signal GOE, and gate clock signals GCK1 and GCK2. The display control circuit DCC supplies to the source driver SD a source start pulse SSP, digital data DAT, a polarity signal POL, and a source clock signal SCK. The gate driver GD includes a shift register SR having a plurality of stages. The description below uses as appropriate the symbol i-th stage SRi to refer to an i-th stage (where i=1 ... n−1, n, n+1 ... ) of the shift register.

The shift register supplies from its i-th stage SRi an output signal (OUT signal) to a scanning signal line Gi in the display section DAR via a buffer. For example, the shift register supplies from its n-th stage SRn an OUT signal to a scanning signal line Gn via a buffer. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn.

The liquid crystal display device 3x includes an analog switch asw and an inverter in correspondence with each data signal line. The inverter has an input connected with an AON signal line. The data signal line has an end connected with a first conducting terminal of the analog switch asw, whereas a second conducting terminal of the analog switch asw is connected with a Vcom (common electrode potential) power supply. The analog switch asw has (i) an N channel side gate connected with an output of the inverter and (ii) a P channel side gate connected with the AONB signal line.

FIG. 11 is a circuit diagram illustrating a detailed configuration of a part of the shift register SR. As illustrated in FIG. 11, the shift register includes, in each of its stages: a set-reset flip-flop FF including an SB terminal, an R terminal, and an INITB terminal; two analog switches ASW13 and ASW14; an inverter; a CKB terminal; an ONB terminal; an OUT terminal; and an OUTS terminal. The INITB terminal of the flip-flop FF is connected with the ONB terminal. The Q terminal of the FF is connected with a P channel side gate of the analog switch ASW13 and with an N channel side gate of the analog switch ASW14. The QB terminal of the FF is connected with an N channel side gate of the analog switch ASW13 and with a P channel side gate of the analog switch ASW14. The analog switch ASW13 has a first conducting electrode connected with the ONB terminal, whereas the analog switch ASW14 has a first conducting electrode connected with the CKB terminal. The analog switch ASW13 has a second conducting electrode connected with a second conducting electrode of the analog switch ASW14 and with the OUTB terminal, which is an output terminal of the stage. The OUTB terminal is connected with the OUT terminal via the inverter.

The shift register SR is arranged such that the OUTB terminal of a first stage is connected with the SB terminal of its following second stage and that the OUT terminal of the second stage is connected with the R terminal of the first stage. For example, the OUTB terminal of the n-th stage SRn is connected with the SB terminal of an (n+1)-th stage SRn+1, whereas the OUT terminal of the (n+1)-th stage SRn+1 is connected with the R terminal of the n-th stage SRn. The shift register SR has its initial stage SR1 having an SB terminal that is supplied with a GSPB signal. The gate driver GD is arranged such that the ONB terminal of each stage is connected with the AONB signal line and that the CKB terminal of each odd-numbered stage is connected with a GCK line (that is, a line through which a GCK is supplied) that is different from a GCK line with which the CKB terminal of each even-numbered stage is connected. For example, the CKB terminal of the n-th stage SRn is connected with a GCK2B signal line, whereas the CKB terminal of the (n+1)-th stage SRn+1 is connected with a GCK1B signal line.

Figure 12:
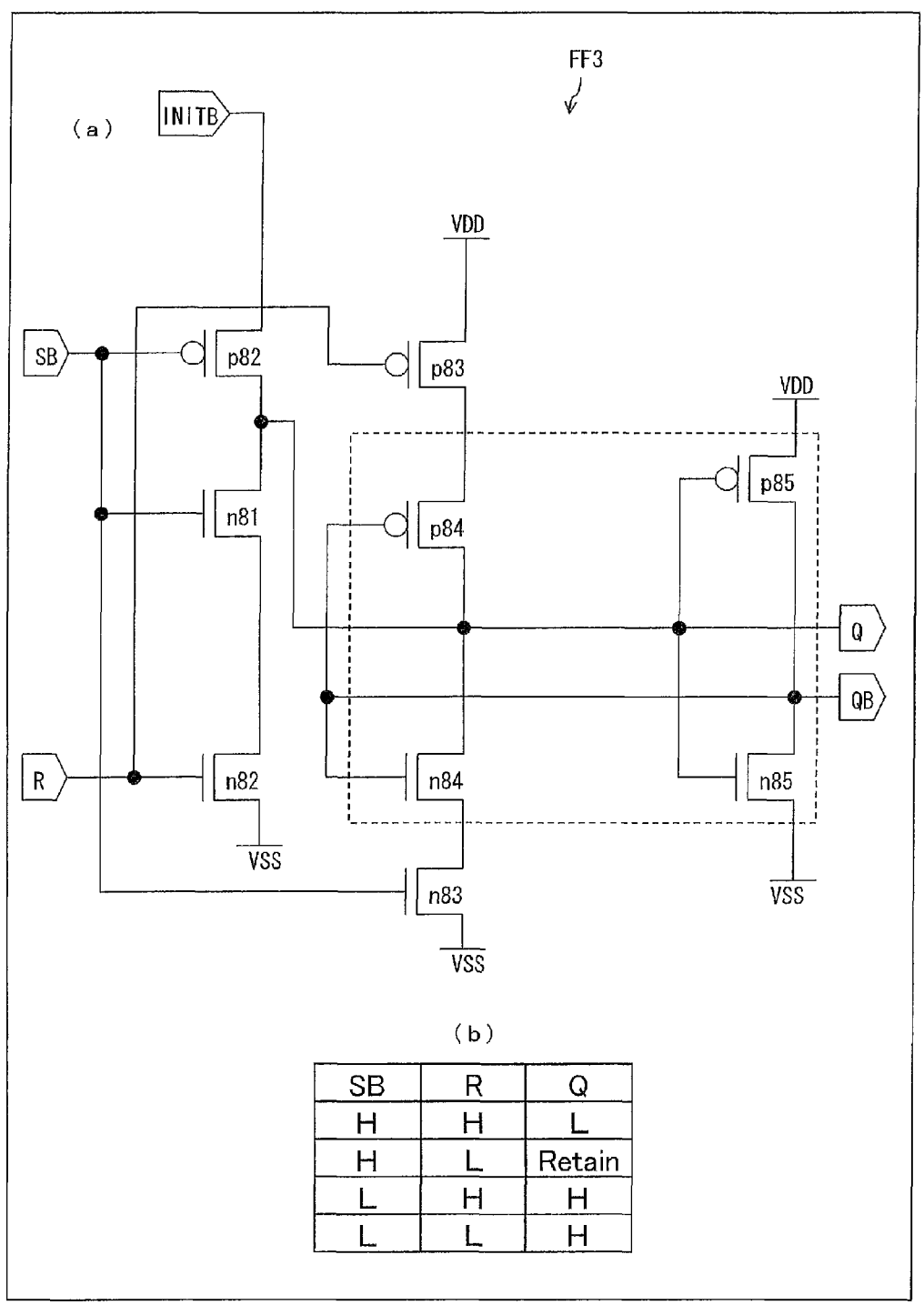

FIG. 11 illustrates a flip-flop FF, which is a FF3 illustrated in FIG. 12. As illustrated in FIG. 12, the flip-flop FF3 includes: a P channel transistor p84 and an N channel transistor n84 constituting a CMOS circuit; a P channel transistor p85 and an N channel transistor n85 constituting a CMOS circuit; P channel transistors p82 and p83; N channel transistors n81, n82, and n83; an SB terminal; an R terminal; and Q and QB terminals. The p84 has a gate connected with a gate of the n84, a drain of the p85, a drain of the n85, and the QB terminal. The p84 has a drain connected with a drain of the n84, a drain of the p82, a drain of the n81, a gate of the p85, a gate of the n85, and the Q terminal. The n84 has a source connected with a drain of the n83. The n84 has a source connected with a drain of the n83. The n81 has a source connected with a drain of the n82. The INITB terminal is connected with a source of the p82. The SB terminal is connected with a gate of the p82, a gate of the n81, and a gate of the n83. The R terminal is connected with a gate of the n82 and a gate of the p83. The n85 has a source connected with a VSS. The p83 and the p85 each have a source connected with a VDD. The n82, the n83, and the n85 each have a source connected with the VSS.

(b) of FIG. 12 is a truth table for the FF3. As illustrated in (b) of FIG. 12, the Q signal of the FF3 (i) is Low (non-active) while the SB signal is High (non-active) and the R signal is High (active), (ii) retains the current potential while the SB signal is High (non-active) and the R signal is Low (non-active), (iii) is High (active) while the SB signal is Low (active) and the R signal is High (active), and (iv) is High (active) while the SB signal is Low (active) and the R signal is Low (non-active). In the flip-flop FF3, in the case where the SB signal and the R signal have both become active while the INITB terminal is Low (active), the p85 is turned on so that the Q signal becomes Low and the QB signal becomes High (non-active). Further, during the simultaneous selection period (that is, while the INITB signal is Low; the SB signal is Low; and the R signal is High), the Q signal has a Vss+Vth (that is, a threshold voltage of the p82), and the QB signal has a Vdd (High).

FIG. 13 is a timing chart illustrating how the liquid crystal display device 3x is driven turned on. In FIG. 13, AONB represents an AONB signal (simultaneous selection signal); GSPB represents a gate start pulse bar signal; GCK1B represents a GCK1B signal; and GCK2B represents a GCK2B signal. Further, SBi, Ri, Qi, and OUTi (i=n−1, n, and n+1) respectively represent an SB signal (potential of the SB terminal), an R signal (potential of the R terminal), a Q signal (potential of the Q terminal), and an OUT signal (potential of the OUT terminal) in the i-th stage SRi.

When the liquid crystal display device 3x is turned on, a preparation operation is carried out. Specifically, the preparation operation causes the AONB signal to be active (Low) during a predetermined period. Since the ASW13 of each stage of the shift register SR is on, the OUT signal of each stage becomes active (High) as a result of the activation, so that all scanning signal lines are selected. Further, the analog switch asw corresponding to each data signal line is turned on due to the activation of the AON signal, so that all data signal lines are supplied with a Vcom. Since in the flip-flop of each stage, the INITB terminal supplied with the AONB signal becomes active (Low), the Q signal becomes Low (non-active) and the QB signal becomes High (non-active). After the above preparation operation ends (that is, after the AONB signal becomes non-active), the liquid crystal display device 3x achieves a state in which the Vcom has been written to each PIX in the display section DAR and in which the shift register SR has been initialized (that is, the output of the flip-flop in each stage has become non-active).

The liquid crystal display device 3x, when turned on and off, simultaneously selects all scanning signal lines so that an identical potential (for example, Vcom) is written to all pixels. This prevents an image disturbance caused when the liquid crystal display device 3x is turned on and off. In comparison with a conventional arrangement (see FIG. 34), the present arrangement (i) supplies an AONB signal to the ASW13 to eliminate the need for a NAND element of FIG. 34 that receives an output signal of each stage and (ii) supplies an AONB signal to the INITB terminal of each FF to eliminate the need for a component that generates and transmits a signal for initializing the shift register. This allows the gate driver to be downsized. In addition, the present arrangement initializes the shift register (that is, initializes the flip-flop of each stage) when simultaneously selecting all scanning signal lines. The present arrangement can thus complete a preparation operation more rapidly than a conventional arrangement which carries out simultaneous selection of all scanning signal lines and initialization of a shift register separately. Further, the present arrangement causes setting of the flip-flop FF to have priority over resetting thereof. Thus, when the simultaneous selection ends (that is, when the AONB signal returns from an active state to a non-active state), the SB signal is more likely to become non-active before the R signal. The present arrangement thus prevents a malfunction, that is, prevents the shift register from carrying out, after its initialization, a set operation due to the R signal becoming non-active before the SB signal.

FIG. 14 is a circuit diagram illustrating a configuration of a liquid crystal display device 3c, which is a variation of the liquid crystal display device 3x.

FIG. 15 is a circuit diagram illustrating a detailed configuration of a part of a shift register SR included in the liquid crystal display device 3c. As illustrated in FIG. 15, the shift register includes, in each of its stages: a set-reset flip-flop FF including an SB terminal, an RB terminal, and an INITB terminal; two analog switches ASW3 and ASW4; an inverter; a CKB terminal; an ONB terminal; an OUT terminal; and an OUTB terminal. The INITB terminal of the flip-flop FF is connected with the ONB terminal. The Q terminal of the FF is connected with a P channel side gate of the analog switch ASW3 and with an N channel side gate of the analog switch ASW4. The QB terminal of the FF is connected with an N channel side gate of the analog switch ASW3 and with a P channel side gate of the analog switch ASW4. The analog switch ASW3 has a first conducting electrode connected with the ONB terminal, whereas the analog switch ASW4 has a first conducting electrode connected with the CKB terminal. The analog switch ASW3 has a second conducting electrode connected with a second conducting electrode of the analog switch ASW4 and with the OUTB terminal, which is an output terminal of the stage. The OUTB terminal is connected with the OUT terminal via the inverter.

The shift register SR is arranged such that the OUTB terminal of a first stage is connected with the SB terminal of its following second stage and that the OUTB terminal of the second stage is connected with the RB terminal of the first stage. For example, the OUTB terminal of the n-th stage SRn is connected with the SB terminal of an (n+1)-th stage SRn+1, whereas the OUTB terminal of the (n+1)-th stage SRn+1 is connected with the RB terminal of the n-th stage SRn. The shift register SR has its initial stage SR1 having an SB terminal that is supplied with a GSPB signal. The gate driver GD is arranged such that the ONB terminal of each stage is connected with the AONB signal line and that the CKB terminal of each odd-numbered stage is connected with a GCKB line (that is, a line through which a gate clock signal GCK is supplied) that is different from a GCKB line with which the CKB terminal of each even-numbered stage is connected. For example, the CKB terminal of the n-th stage SRn is connected with a GCK2B signal line, whereas the CKB terminal of the (n+1)-th stage SRn+1 is connected with a GCK1B signal line.

Figure 16:
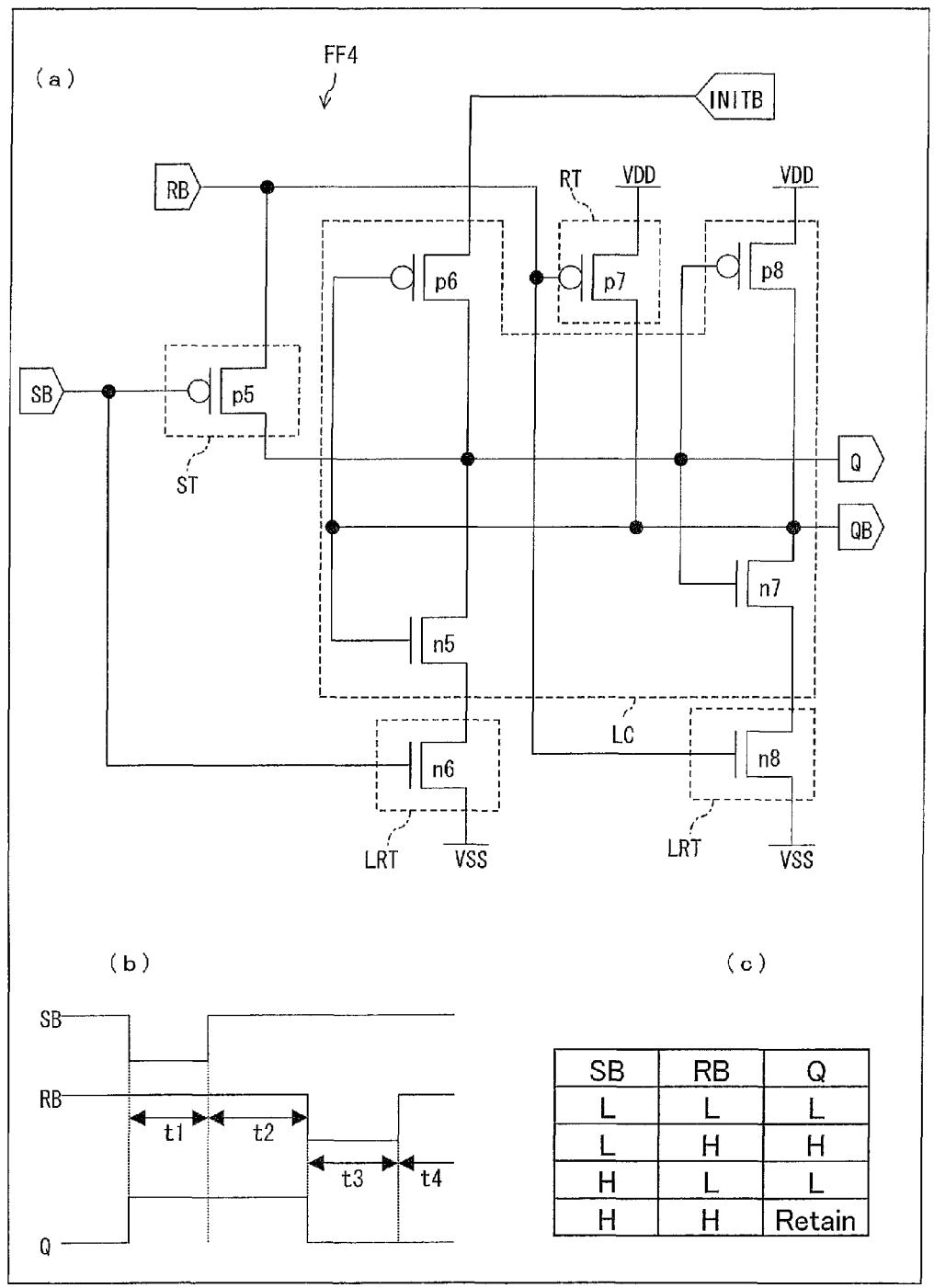

The flip-flop FF of FIG. 15 is a FF4 illustrated in FIG. 16. As illustrated in FIG. 16, the FF4 includes: a P channel transistor p6 and an N channel transistor n5 constituting a CMOS circuit; a P channel transistor p8 and an N channel transistor n7 constituting a CMOS circuit; P channel transistors p5 and p7; N channel transistors n6 and n8; an INITB terminal; an SB terminal; an RB terminal; and Q and QB terminals. The p6 has a gate connected with a gate of the n5, a drain of the p7, a drain of the p8, a drain of the n7, and the QB terminal. The p6 has a drain connected with a drain of the n5, a drain of the p5, a gate of the p8, a gate of the n7, and the Q terminal. The n5 has a source connected with a drain of the n6. The n7 has a source connected with a drain of the n8. The SB terminal is connected with a gate of the p5 and a gate of the n6. The RB terminal is connected with a source of the p5, a gate of the p7, and a gate of the n8. The INITB terminal is connected with a source of the p6. The p7 and the p8 each have a source connected with a VDD. The n6 and the n8 each have a source connected with a VSS. In the FF4, the p6, the n5, the p8, and the n7 constitute a latch circuit LC; the p5 serves as a set transistor ST; the p7 serves as a reset transistor RT; the n6 and the n8 each serve as a latch removing transistor (release transistor) LRT.

(b) of FIG. 16 is a timing chart illustrating how the FF4 operates. (c) of FIG. 16 is a truth table for the FF4. As illustrated in (b) and (c) of FIG. 16, the Q signal of the FF4 (i) is Low (non-active) while the SB signal is Low (active) and the RB signal is Low (active), (ii) is High (active) while the SB signal is Low (active) and the RB signal is High (non-active), (iii) is Low (non-active) while the SB signal is High (non-active) and the RB signal is Low (active), and (iv) retains the current potential while the SB signal is High (non-active) and the RB signal is High (non-active).

During a period t1 of (b) of FIG. 16, for example, the Q terminal is supplied with a Vdd of the RB terminal, the n7 is turned on, and the QB terminal is supplied with a Vss (Low). During a period t2, the SB signal is High, so that the p5 is turned off and that the n6 is turned on. This causes the state of t1 to be retained. During a period t3, the RB signal is Low, so that the p7 is turned on and that the QB terminal is supplied with a Vdd (High). Further, during the period t3, the n5 is turned on, so that the Q terminal is supplied with the Vss. In the case where the SB signal and the RB signal have both become Low (active) while the INITB terminal is Low (active), the p7 is turned on, so that the QB terminal is supplied with the Vdd (High) and that the Q terminal is supplied with a Vss+Vth (that is, a threshold voltage of the p5) via the p5.

The liquid crystal display device 3c is, when turned on, driven as illustrated in FIG. 17. The arrangement of FIG. 15 causes the Q signal to have Vss+Vth and the QB signal to have Vdd (High) during the simultaneous selection period (that is, while the INITB terminal is Low; the SB signal is Low; and the RB signal is Low). Thus, the output of each flip-flop is preferably only the QB signal, that is, a configuration illustrated in FIG. 18 is preferable. Specifically, (i) the QB signal and (ii) a signal obtained by inverting the QB signal with an inverter are preferably supplied to the analog switches ASW3 and ASW4, respectively.

Embodiment 2

FIG. 19 is a circuit diagram illustrating a configuration of a liquid crystal display device 3d of the present invention. The liquid crystal display device 3d includes: a display section DAR; a gate driver GD; a source driver SD; and a display control circuit DCC. The display control circuit DCC supplies to the gate driver GD an AONB signal (simultaneous selection signal), a gate start pulse GSP, a gate-on enable signal GOE, and gate clock signals GCK1B and GCK2B. The display control circuit DCC supplies to the source driver SD a source start pulse SSP, digital data DAT, a polarity signal POL, and a source clock signal SCK. The gate driver GD includes a shift register SR having a plurality of stages. The description below uses as appropriate the symbol i-th stage SRi to refer to an i-th stage (where i=1 . . . n−1, n, n+1 . . . ) of the shift register.

The shift register supplies from its i-th stage SRi an output signal (OUT signal) to a scanning signal line Gi in the display section DAR via a buffer. For example, the shift register supplies from its n-th stage SRn an OUTB signal to a scanning signal line Gn via a buffer. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn.

The liquid crystal display device 3d includes an analog switch asw and an inverter in correspondence with each data signal line. The inverter has an input connected with an AONB signal line. The data signal line has an end connected with a first conducting terminal of the analog switch asw, whereas a second conducting terminal of the analog switch asw is connected with a Vcom (common electrode potential) power supply. The analog switch asw has (i) an N channel side gate connected with an output of the inverter and (ii) a P channel side gate connected with the AONB signal line.

FIG. 20 is a circuit diagram illustrating a detailed configuration of a part of the shift register SR. As illustrated in FIG. 20, the shift register includes, in each of its stages: a flip-flop FF including an INITB terminal, an SB terminal, and an RB terminal; two analog switches ASW5 and ASW6 (gate circuits); a NAND (logic circuit); an inverter; a CKB terminal; an ONB terminal; and an OUTS terminal. The INITB terminal of the flip-flop FF is connected with the ONB terminal. The QB terminal of the FF is connected with a first input of the NAND. The NAND has an output connected with an input of the inverter, a P channel side gate of the analog switch ASW5, and an N channel side gate of the analog switch ASW6. The inverter has an output connected with an N channel side gate of the analog switch ASW5 and a P channel side gate of the analog switch ASW6. The analog switch ASW5 has a first conducting electrode connected with the ONB terminal, whereas the analog switch ASW6 has a first conducting electrode connected with the CKB terminal. The analog switch ASW5 has a second conducting electrode connected with (i) a second conducting electrode of the analog switch ASW6, (ii) the OUTB terminal, which is an output terminal of the stage, (iii) a second input of the NAND, and (iv) the RB terminal of the FF. In each of the stages, the analog switches ASW5 and ASW6 (gate circuits) and the NAND (logic circuit) constitute a signal generating circuit for generating an OUTB signal.

The shift register SR is arranged such that the OUTB terminal of a first stage is connected with the SB terminal of its following second stage. For example, the OUTB terminal of the n-th stage SRn is connected with the SB terminal of an (n+1)-th stage SRn+1, and the OUTB terminal of the (n+1)-th stage SRn+1 is connected with the SB terminal of the (n+2)-th stage SRn+2. The shift register SR has its initial stage SR1 having an SB terminal that is supplied with a GSPB signal. The gate driver GD is arranged such that the ONB terminal of each stage is connected with the AONB signal line and that the CKB terminal of each odd-numbered stage is connected with a GCKB line (that is, a line through which a gate clock signal GCKB is supplied) that is different from a GCKB line with which the CKB terminal of each even-numbered stage is connected. For example, the CKB terminal of the n-th stage SRn is connected with a GCK2B signal line, whereas the CKB terminal of the (n+1)-th stage SRn+1 is connected with a GCK1B signal line.

FIG. 21 is a timing chart illustrating how the liquid crystal display device 3d is driven when turned on. The liquid crystal display device 3d carries out a preparation operation before displaying an initial frame (vertical scanning period) of a display image. Specifically, the preparation operation causes the AONB signal to be active (Low) for a predetermined period, during which each GCKB signal remains active (Low). When the AONB signal has become active (Low), the OUTB signal becomes active (Low) because the ASW5 is on, so that all scanning signal lines are selected. During this period, the analog switch asw corresponding to each data signal line is on, so that all data signal lines are supplied with a Vcom. Further, during this period, the SB signal and the RB signal of the flip-flop of each stage become active, so that the QB signal becomes High (non-active). Once the OUTB signal of each stage of the shift register has become active, a feedback signal to the NAND becomes Low, so that the ASW5 is turned off and the ASW6 is turned on (each stage receives either the GCK1B or the GCK2B). After the above preparation operation ends (that is, after the AONB signal becomes non-active), the liquid crystal display device 3d achieves a state in which the Vcom has been written to each PIX in the display section DAR and in which the shift register SR has been initialized (that is, the output of the flip-flop in each stage has become non-active).

The liquid crystal display device 3d carries out the following operation during each vertical scanning period (that is, while each frame is displayed): When the SB signal supplied to a first stage of the shift register SR has become active (=Low), an output of the FF of the first stage is set so that the output is active and that the first stage receives a GCKB signal. When the GCKB signal of the first stage has become active (=Low), the OUTB signal of the first stage becomes active (=Low), the SB signal of the following second stage also becomes active, and the FF of the first stage is reset, so that the QB signal of the first stage becomes High (non-active). During this period, the OUTB signal of the first stage is Low (that is, an output of the NAND is High), so that the first stage continues to receive the GCKB signal. When the GCKB signal has become High (non-active), the OUTB signal of the first stage becomes High and the output of the NAND becomes Low. The OUTB terminal thereafter outputs the AONB signal, so that the OUTB signal is High (non-active).

The liquid crystal display device 3d, when turned on and off, simultaneously selects all scanning signal lines so that an identical potential (for example, Vcom) is written to all pixels. This prevents an image disturbance caused when the liquid crystal display device 3d is turned on and off. In comparison with a conventional arrangement (see FIG. 34), the present arrangement supplies an AONB signal to the ASW5 to eliminate the need for a NAND element of FIG. 34 that receives an output signal of each stage. This allows the gate driver to be downsized. In addition, the present arrangement initializes the shift register (that is, initializes the flip-flop of each stage) when simultaneously selecting all scanning signal lines. The present arrangement can thus complete a preparation operation more rapidly than a conventional arrangement which carries out simultaneous selection of all scanning signal lines and initialization of a shift register separately. Further, the present arrangement allows each stage to reset itself. This makes it possible to simplify a connection between stages.

In the configuration of FIG. 20 (in which the FF has priority for resetting and in which each stage of the shift register resets itself), the OUTB signal may be fed back to the RB terminal of the flip-flop before being fed back to the NAND. The NAND of FIG. 20 is thus preferably configured as illustrated in FIG. 22. Specifically, the NAND is preferably configured such that a P channel transistor p40 has (i) a source connected with a VDD, (ii) a gate serving as an input X of the NAND, and (iii) a drain serving as an output M of the NAND; a P channel transistor p41 has (i) a source connected with the VDD, (ii) a gate serving as an input Y of the NAND, and (iii) a drain connected with a source of an N channel transistor n40; the N channel transistor n40 has (i) a gate connected with the input Y and (ii) a drain connected with a source of an N channel transistor n41; the N channel transistor n41 has (i) a gate connected with the input X and (ii) a drain connected with a VSS; and the P channel transistors p40 and p41 each have a driving capability higher than that of either of the N channel transistors n40 and n41. This configuration causes the OUTS signal to remain active (=Low) until the QB signal becomes sufficiently non-active (High), and consequently prevents the OUTB signal from being fed back to the RB terminal of the FF before being fed back to the NAND.

Embodiment 3

FIG. 23 is a circuit diagram illustrating a configuration of a liquid crystal display device 3e of the present invention. The liquid crystal display device 3e is a liquid crystal display device based on so-called CC (charge coupled) driving, and includes: a display section DAR; a gate-Cs driver G-CsD; a source driver SD; and a display control circuit DCC. The display control circuit DCC supplies to the gate driver GD a gate start pulse GSP, a gate-on enable signal GOE, an AONB signal (simultaneous entire selection signal), CS inversion signals CMI1 and CMI2, and gate clock signals GCK1B and GCK2B. The display control circuit DCC supplies to the source driver SD a source start pulse SSP, digital data DAT, a polarity signal POL, and a source clock signal SCK. The gate-Cs driver G-CsD includes: a shift register SR having a plurality of stages; and a plurality of D-latch circuits CSL. The gate-Cs driver G-CsD includes an OR circuit and a D-latch circuit CSL in correspondence with each stage of the shift register. The description below uses as appropriate the symbol i-th stage SRi to refer to an i-th stage (where i=1 ... n-1, n, n+1 ...) of the shift register. The gate-Cs driver G-CsD thus includes a D-latch circuit CSLi in correspondence with the i-th stage SRi of the shift register.

The shift register supplies from its i-th stage SRi an output signal (OUT signal) to a scanning signal line Gi in the display section DAR via a buffer, and the D-latch circuit CSLi, corresponding to the i-th stage SRi, supplies an output signal (that is, an out signal or a CS signal) to a storage capacitor line CSi in the display section DAR. For example, the shift register supplies from its n-th stage SRn an OUTB signal to a scanning signal line Gn via a buffer, and the D-latch circuit CSLn corresponding to the n-th stage SRn supplies an output signal (that is, an out signal or a CS signal) to a storage capacitor line CSn in the display section DAR. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn.

The liquid crystal display device 3e includes an analog switch asw and an inverter in correspondence with each data signal line. The inverter has an input connected with an AONB signal line. The data signal line has an end connected with a first conducting terminal of the analog switch asw, whereas a second conducting terminal of the analog switch asw is connected with a Vcom (common electrode potential) power supply. The analog switch asw has (i) an N channel side gate connected with an output of the inverter and (ii) a P channel side gate connected with the AONB signal line.

FIG. 24 is a circuit diagram illustrating a configuration of the i-th stage SRi of the shift register SR illustrated in FIG. 23. As illustrated in FIG. 24, the shift register includes, in each of its stages: a flip-flop FF (any of the above flip-flops FF1 through FF4) including an SB terminal and an R terminal; two analog switches ASW7 and ASW8; a NAND; an inverter; a CKB terminal; and an ONB terminal. The QB terminal of the flip-flop FF is connected with a first input of the NAND. The NAND has an output (M) connected with (i) an input of the inverter, (ii) a P channel side gate of the analog switch ASW7, and (iii) an N channel side gate of the analog switch ASW8. The inverter has an output connected with (i) an N channel side gate of the analog switch ASW7 and (ii) a P channel side gate of the analog switch ASW8. The analog switch ASW7 has a first conducting electrode connected with the ONB terminal, whereas the analog switch ASW8 has a first conducting electrode connected with the CKB terminal. The analog switch ASW7 has a second conducting electrode connected with (i) a second conducting electrode of the analog switch ASW8, (ii) the OUTB terminal, which is an output terminal of the stage, (iii) a second input of the NAND, and (iv) the R terminal of the FF. The OUTB terminal is connected with the OUT terminal via an inverter.

The i-th stage SRi is arranged such that during a period in which the QB signal (that is, a first input X of the NAND) of the flip-flop FF is High (non-active), (i) in the case where the OUTB signal (that is, a second input Y of the NAND) is High (non-active), the output (M) of the NAND is Low (that is, the analog switch ASW7 is on and the analog switch ASW8 is off), so that the OUTB terminal is supplied with the AONB signal (which is non-active and has a Vdd), and (ii) in the case where the OUTB signal (that is, the second input Y of the NAND) is Low (active), the output (M) of the NAND is High (that is, the analog switch ASW7 is off and the analog switch ASW8 is on), so that the i-th stage SRi receives a GCKB signal and thus outputs it. Further, the i-th stage SRi is arranged such that during a period in which the QB signal of the flip-flop FF is Low (active), since the first input X of the NAND is Low and the second input Y of the NAND is Low, the output (M) of the NAND is High (that is, the analog switch ASW7 is off and the analog switch ASW8 is on), so that the i-th stage SRi receives a GCKB signal and thus outputs it. This arrangement indicates that the NAND, the inverter, and the analog switches ASW1 and ASW2 (gate circuits) constitute a signal generating circuit for generating the OUTB signal, particularly the analog switches ASW7 and ASW8 constitute a gate circuit for receiving either the AONB signal or the clock signal in accordance with the output M of the NAND.

FIG. 25 is a circuit diagram illustrating a configuration of the D-latch circuit CSLi, which corresponds to the i-th stage SRi of the shift register SR illustrated in FIG. 23. As illustrated in FIG. 25, the D-latch circuit CSLi includes: three CMOS circuits 5 through 7; analog switches ASW15 and ASW16; an inverter; a CK terminal; a D terminal; and an out terminal. The CMOS circuits 5 and 6 are each configured such that (i) a single P channel transistor and a single N channel transistor have respective gates connected with each other and respective drains connected with each other and that (ii) the P channel transistor has a source connected with a VDD, whereas the N channel transistor has a source connected with a VSS. The CMOS circuit 7 is configured such that (i) a single P channel transistor and a single N channel transistor have respective gates connected with each other and respective drains connected with each other and that (ii) the P channel transistor has a source connected with a power supply VCSH, whereas the N channel transistor has a source connected with a power supply VCSL. The ck terminal is connected with (i) an input of the inverter, (ii) an N channel side gate of the analog switch ASW16, and (iii) a P channel side gate of the analog switch ASW15. The inverter has an output connected with (i) a P channel side gate of the analog switch ASW16 and (ii) an N channel side gate of the analog switch ASW15. The CMOS circuit 5 is connected, on its drain side, with a first conducting terminal of the analog switch ASW15. The analog switch ASW16 has a first conducting terminal connected with the D terminal. The analog switch ASW15 has a second conducting terminal connected with (i) a second conducting terminal of the analog switch ASW16 and (ii) the CMOS circuit 6 on its gate side. The CMOS circuit 5 is connected, on its gate side, with the CMOS circuit 6 on its drain side. The CMOS circuit 6 is connected, on its drain side, with the CMOS circuit 7 on its gate side. The CMOS circuit 7 is connected, on its drain side, with the out terminal.

The D-latch circuit CSLi, while a ck signal (that is, a signal supplied to the ck terminal) is active (High), receives a D signal (that is, a signal supplied to the D terminal) and latches it. Specifically, (i) in the case where the D signal has turned from Low to High while the ck signal is active, the potential of an out signal (that is, a signal supplied from the out terminal) rises from a potential of the power supply VCSL to a potential of the power supply VCSH, and thereafter maintains the potential of the power supply VCSH, and (ii) in the case where the D signal has turned from High to Low while the ck signal is active, the potential of the out signal (that is, a signal supplied from the out terminal) falls from the potential of the power supply VCSH to the potential of the power supply VCSL, and thereafter maintains the potential of the power supply VCSL.

The G-CsD of the liquid crystal display device 3e is configured such that (i) the OUTB terminal of a first stage is connected with the SB terminal of the following second stage, (ii) the OUT terminal of the first stage is connected with a first input terminal of an OR circuit corresponding to the first stage, whereas the OUT terminal of the second stage is connected with a second input terminal of the OR circuit corresponding to the first stage, and (iii) the OR circuit corresponding to the first stage has an output connected with the ck terminal of a D-latch circuit corresponding to the first stage. For example, the G-CsD is configured such that (i) the OUTB terminal of the n-th stage SRn is connected with the SB terminal of the (n+1)-th stage SRn+1, (ii) the OUT terminal of the n-th stage SRn is connected with a first input terminal of an OR circuit corresponding to the n-th stage SRn, whereas the OUT terminal of the (n+1)-th stage SRn+1 is connected with a second input terminal of the OR circuit corresponding to the n-th stage SRn, and (iii) the OR circuit corresponding to the n-th stage SRn has an output connected with the ck terminal of the D-latch circuit CSLn corresponding to the n-th stage SRn. The shift register SR has its initial stage having an SB terminal that is supplied with a GSPB signal.

The G-CsD of the liquid crystal display device 3e is further configured such that (i) the CKB terminal of each odd-numbered stage is connected with a GCK line (that is, a line through which a GCK is supplied) that is different from a GCK line with which the CKB terminal of each even-numbered stage is connected, and that (ii) the ONB terminal of each stage is connected with a common AONB line (that is, a line through which the AON signal is supplied). For example, the CKB terminal of the n-th stage SRn is connected with a GCK2B signal line, whereas the CKB terminal of the (n+1)-th stage SRn+1 is connected with a GCK1B signal line, and the ONB terminal of each of the n-th stage SRn and the (n+1)-th stage SRn+1 is connected with a common AONB signal line. Further, each set of two D terminals of respective D-latch circuits corresponding to two consecutive stages is connected with a CMI line (that is, a line through which a CMI signal is supplied) different from a CMI line with which the following set is connected. For example, the D-latch circuit CSLn corresponding to the n-th stage SRn has a D terminal connected with a CMI2 signal line; a D-latch circuit CSLn+1 corresponding to the (n+1)-th stage SRn+1 has a D terminal connected with the CMI2 signal line; a D-latch circuit CSLn+2 corresponding to a (n+2) stage SRn+2 has a D terminal connected with a CMI1 signal line; and a D-latch circuit CSLn+3 corresponding to a (n+3) stage SRn+3 has a D terminal connected with the CMI1 signal line.

FIG. 26 is a timing chart illustrating how the liquid crystal display device 3e is driven. FIG. 26 illustrates a driving method in which (i) the polarity signal POL has a cycle of one horizontal scanning period 1 H (that is, each data signal line is supplied with a data signal having a polarity that is inverted every 1 H) and (ii) the CMI1 and the CMI2 are identical to each other in phase.

The liquid crystal display device 3e carries out a display preparation operation before displaying an initial frame of a display image (that is, before an initial vertical scanning period). Specifically, the preparation operation causes the AONB signal to be active (Low) for a predetermined period, during which each GCKB signal remains active (Low) and each CMI signal remains High (or Low). This causes the AONB signal to be supplied from the OUTB terminal via the ASW7 in each stage of the shift register SR. The OUTB signal of each stage thus becomes active (Low), so that all scanning signal lines are selected. During this period, the analog switch asw corresponding to each data signal line is on, so that all data signal lines are supplied with a Vcom. Further, in each stage of the flip-flop, the INITB terminal supplied with the AONB signal is active (Low), so that the Q signal becomes Low (non-active) and the QB signal becomes High (non-active). Once the OUTB signal of each stage of the shift register has become active, a feedback signal to the NAND becomes Low, so that the ASW7 is turned off and the ASW8 is turned on (each stage receives either the GCK1B or the GCK2B). Further, the output of the OR circuit corresponding to each stage is also active (High). This causes (i) each D-latch circuit to latch either the CMI1 signal (Low) or the CMI2 signal (Low) and (ii) the out signal (CS signal) supplied to each storage capacitor line to have the potential of the power supply VCSL. After the above display preparation operation ends, the liquid crystal display device 3e achieves a state in which (i) the Vcom has been written to each PIX in the display section DAR, (ii) the FF in each stage of the shift register has a non-active (High) QB output, and (iii) the out signal of each D-latch circuit (that is, the potential of each storage capacitor line) has the potential of the power supply VCSL.

The liquid crystal display device 3e carries out the following operation when displaying its initial frame (that is, during its initial vertical scanning period): When the SB signal supplied to a first stage of the shift register SR has become active (=Low), an output of the FF of the first stage is set so that the output is active and that the first stage receives a GCKB signal. When the GCKB signal of the first stage has become active (=Low), the OUTB signal of the first stage becomes active (=Low), the SB signal of the following second stage also becomes active, and the FF of the first stage is reset, so that the QB signal of the first stage becomes High (non-active). During this period, the OUTB signal of the first stage is Low (that is, an output of the NAND is High), so that the first stage continues to receive the GCKB signal. When the GCKB signal has become High (non-active), the OUTB signal of the first stage becomes High and the output of the NAND becomes Low. The OUTB terminal thereafter outputs the AONB signal, so that the OUTB signal is High (non-active).

When the OUTB signal of the first stage has become active (which causes the OR circuit corresponding to the first stage to have an active output), the D-latch circuit corresponding to the first stage latches either the CMI1 signal or the CMI2 signal. Further, when the OUTB signal of the second stage has become active (which causes the OR circuit corresponding to the first stage to have an active output), the D-latch circuit corresponding to the first stage latches either the CMI1 signal or the CMI2 signal again. This causes the potential of an out signal of the D-latch circuit corresponding to the first stage (that is, the potential of a storage capacitor line corresponding to the first stage) to, after the OUTB signal of the first stage has become non-active (that is, after selection of the scanning signal line corresponding to the first stage has ended), (i) rise from the potential of the power supply VCSL to the potential of the power supply VCSH (in which case a data signal having a positive polarity is written to a pixel corresponding to the first stage) or (ii) fall from the potential of the power supply VCSH to the potential of the power supply VCSL (in which case a data signal having a negative polarity is written to the pixel corresponding to the first stage).

For example, when the OUTB signal of the n-th stage SRn has become active (which causes the OR circuit corresponding to the n-th stage SRn to have an active output), the D-latch circuit CSLn corresponding to the n-th stage SRn latches the CMI2 signal. Further, when the OUTB signal of the (n+1)-th stage SRn+1 has become active (which causes the OR circuit corresponding to the n-th stage SRn to have an active output), the D-latch circuit CSLn latches the CMI2 signal again. This causes the potential of the out signal of the D-latch circuit CSLn corresponding to the n-th stage SRn (that is, the potential of a storage capacitor line CSn corresponding to the n-th stage SRn) to, after the OUTB signal of the n-th stage SRn has become non-active (that is, after selection of the scanning signal line Gn corresponding to the n-th stage SRn has started and then ended), fall from the potential of the power supply VCSH to the potential of the power supply VCSL. During this period, a data signal having a negative polarity has been written to the pixel PIXn corresponding to the n-th stage SRn as indicated by "POL." The fall of the potential of the storage capacitor line CSn thus causes an effective potential to be lower than a potential of the data signal (that is, increases a luminance of the pixel PIXn).

When the OUTB signal of the (n+1)-th stage SRn+1 has become active, the D-latch circuit CSLn+1 corresponding to the (n+1)-th stage SRn+1 latches the CMI2 signal. Further, when the OUTB signal of the (n+2) stage SRn+2 has become active, the D-latch circuit CSLn+1 latches the CMI2 signal again. This causes the potential of the out signal of the D-latch circuit CSLn+1 corresponding to the (n+1)-th stage SRn+1 (that is, the potential of the storage capacitor line CSn+1) to, after the OUTB signal of the (n+1)-th stage SRn+1 has become non-active (that is, selection of the scanning signal line Gn+1 has started and then ended) rise from the potential of the power supply VCSL to the potential of the power supply VCSH. During this period, a data signal having a positive polarity has been written to a pixel PIXn+1 corresponding to the (n+1)-th stage SRn+1 as indicated by "POL." The rise of the potential of the storage capacitor line CSn+1 thus causes an effective potential to be higher than a potential of the data signal (that is, increases a luminance of the pixel PIXn+1).

When the OUTB signal of the (n+2) stage SRn+2 has become active, the D-latch circuit CSLn+2 corresponding to the (n+2) stage SRn+2 latches the CMI1 signal. Further, when the OUTB signal of the (n+3) stage SRn+3 has become active, the D-latch circuit CSLn+2 latches the CMI1 signal again. This causes the potential of the out signal of the D-latch circuit CSLn+2 corresponding to the (n+2) stage SRn+2 (that is, the potential of the storage capacitor line CSn+2) to, after the OUTB signal of the (n+2) stage SRn+2 has become non-active (that is, after selection of the scanning signal line Gn+2 has started and then ended), fall from the potential of the power supply VCSH to the potential of the power supply VCSL. During this period, a data signal having a negative polarity has been written to a pixel PIXn+2 corresponding to the (n+2) stage SRn+2 as indicated by "POL." The fall of the potential of the storage capacitor line CSn+2 thus causes an effective potential to be higher than a potential of the data signal (that is, increases a luminance of the pixel PIXn+2).

A display operation similar to the above for the initial frame is carried out for the second frame and its subsequent frames. Since, however, the POL has a phase that is shifted by half the cycle every frame, each pixel is supplied with a data signal having a polarity that is inverted every frame. The rise and fall of the out signal of a D-latch circuit CSLi (that is, the potential of a storage capacitor line CSi) switch every frame accordingly.

The liquid crystal display device 3e, when turned on and off, simultaneously selects all scanning signal lines so that an identical potential (for example, Vcom) is written to all pixels. This prevents an image disturbance caused when the liquid crystal display device 3e is turned on and off. In comparison with a conventional arrangement (see FIG. 34), the present arrangement (i) supplies an AONB signal to the ASW7 to eliminate the need for a NAND element of FIG. 34 that receives an output signal of each stage and (ii) supplies an AONB signal to the INITB terminal of each FF to eliminate the need for a component that generates and transmits a signal for initializing the shift register. This allows the gate driver to be downsized. Further, the present arrangement causes setting of the flip-flop FF to have priority over resetting thereof. Thus, when the simultaneous selection ends (that is, when the AONB signal returns from an active state to a non-active state), the SB signal is more likely to become non-active before the R signal. The present arrangement thus prevents a malfunction, that is, prevents the shift register from carrying out, after its initialization, a set operation due to the R signal becoming non-active before the SB signal. In addition, the present arrangement initializes the shift register (that is, initializes the flip-flop of each stage) when simultaneously selecting all scanning signal lines. The present arrangement can thus complete a preparation operation more rapidly than a conventional arrangement which carries out simultaneous selection of all scanning signal lines and initialization of a shift register separately. Further, the present arrangement allows each stage to reset itself. This makes it possible to simplify a connection between stages. Furthermore, the present arrangement allows CC driving to be appropriately carried out with respect to each pixel row even for an initial frame. This prevents an image disturbance (that is, unevenness in the shape of a lateral stripe) caused in an initial frame, the image disturbance having been a problem with conventional CC driving.

What is more outstanding about the present arrangement is the following advantages of the liquid crystal display device 3e: As illustrated in FIG. 27, simply shifting the phase of the CMI2 signal (from the phrase illustrated in FIG. 26) by half a cycle switches the cycle of the polarity signal POL to 2 H (by which each data signal line is supplied with a data signal having a polarity that is inverted every 2 H), and CC driving can be appropriately carried out with respect to each pixel row even for an initial frame. In other words, in the liquid crystal display device 3e, simply controlling respective phases of the CS inversion signals CMI1 and CMI2 can switch the cycle of the polarity signal POL from 1 H to 2 H, and an image disturbance caused by the switch can be reduced significantly.

Embodiment 4

FIG. 28 is a circuit diagram illustrating a configuration of a liquid crystal display device 3f of the present invention. The liquid crystal display device 3f is a liquid crystal display device based on so-called CC (charge coupled) driving, and includes: a display section DAR; a gate-Cs driver G-CsD; a source driver SD; and a display control circuit DCC. The display control circuit DCC supplies to the gate driver GD a gate start pulse GSP, a gate-on enable signal GOE, an AONB signal (simultaneous selection signal), CS inversion signals CMI1 and CMI2, and gate clock signals GCK1B and GCK2B. The display control circuit DCC supplies to the source driver SD a source start pulse SSP, digital data DAT, a polarity signal POL, and a source clock signal SCK. The gate-Cs driver G-CsD includes: a shift register SR having a plurality of stages; and a plurality of D-latch circuits CSL. The gate-Cs driver G-CsD includes an inverter, a D-latch circuit CSL, and a buffer in correspondence with each stage of the shift register. The description below uses as appropriate the symbol i-th stage SRi to refer to an i-th stage (where i=1 . . . n−1, n, n+1 . . . ) of the shift register. The gate-Cs driver G-CsD thus includes a D-latch circuit CSLi in correspondence with the i-th stage SRi of the shift register.

The shift register supplies from its i-th stage SRi an output signal (OUT signal) to a scanning signal line Gi in the display section DAR via a buffer, and the D-latch circuit CSLi, corresponding to the i-th stage SRi, supplies an output signal (that is, an out signal or a CS signal) to a storage capacitor line CSi−1 in the display section DAR. For example, the shift register supplies from its n-th stage SRn an OUTB signal to a scanning signal line Gn via a buffer, and the D-latch circuit CSLn corresponding to the n-th stage SRn supplies an output signal (that is, an out signal or a CS signal) to a storage capacitor line CSn−1 in the display section DAR. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn. The scanning signal line Gn−1 in the display section DAR is connected with a gate of a transistor connected with a pixel electrode in a PIXn−1. The pixel electrode in the PIXn−1 forms a storage capacitor (auxiliary capacitor) together with a storage capacitor line CSn−1.

The liquid crystal display device $3f$ includes an analog switch asw and an inverter in correspondence with each data signal line. The inverter has an input connected with an AONB signal line. The data signal line has an end connected with a first conducting terminal of the analog switch asw, whereas a second conducting terminal of the analog switch asw is connected with a Vcom (common electrode potential) power supply. The analog switch asw has (i) an N channel side gate connected with an output of the inverter and (ii) a P channel side gate connected with the AONB signal line.

The i-th stage SRi of the shift register SR illustrated in FIG. 28 is configured as illustrated in FIG. 24, whereas the D-latch circuit CSLi is configured as illustrated in FIG. 25.

The shift register SR in the G-CsD of the liquid crystal display device $3f$ is configured such that (i) the OUTB terminal of a first stage is connected with the SB terminal of the following second stage and (ii) an M terminal of the first stage is connected with the ck terminal of a D-latch circuit corresponding to the first stage. For example, the G-CsD is configured such that (i) the OUTB terminal of the n-th stage SRn is connected with the SB terminal of the (n+1)-th stage SRn+1 and (ii) an M terminal of the n-th stage SRn is connected with the ck terminal of the D-latch circuit CSLn corresponding to the n-th stage SRn. The shift register SR has its initial stage having an SB terminal that is supplied with a GSPB signal.

The G-CsD is further configured such that (i) the CKB terminal of each odd-numbered stage is connected with a GCK line (that is, a line through which a GCK is supplied) that is different from a GCK line with which the CKB terminal of each even-numbered stage is connected, and that (ii) the ONB terminal of each stage is connected with a common AONB line (that is, a line through which the AON signal is supplied). For example, the CKB terminal of the n-th stage SRn is connected with a GCK2B signal line, whereas the CKB terminal of the (n+1)-th stage SRn+1 is connected with a GCK1B signal line, and the ONB terminal of each of the n-th stage SRn and the (n+1)-th stage SRn+1 is connected with a common AONB signal line. Further, each set of two D terminals of respective D-latch circuits corresponding to two consecutive stages is connected with a CMI line (that is, a line through which a CMI signal is supplied) different from a CMI line with which the following set is connected. For example, a D-latch circuit CSLn−1 corresponding to a (n−1) stage SRn−1 has a D terminal connected with a CMI1 signal line; the D-latch circuit CSLn corresponding to the n-th stage SRn has a D terminal connected with the CMI1 signal line; a D-latch circuit CSLn+1 corresponding to the (n+1)-th stage SRn+1 has a D terminal connected with a CMI2 signal line; a D-latch circuit CSLn+2 corresponding to a (n+2) stage SRn+2 has a D terminal connected with the CMI2 signal line; and a D-latch circuit CSLn+3 corresponding to a (n+3) stage SRn+3 has a D terminal connected with the CMI1 signal line.

FIG. 29 is a timing chart illustrating how the liquid crystal display device $3f$ is driven. FIG. 29 illustrates a driving method in which (i) the polarity signal POL has a cycle of one horizontal scanning period 1 H (that is, each data signal line is supplied with a data signal having a polarity that is inverted every 1 H) and (ii) the CMI1 and the CMI2 are identical to each other in phase.

The liquid crystal display device $3f$ carries out a display preparation operation before displaying an initial frame of a display image (that is, before an initial vertical scanning period). Specifically, the preparation operation causes the AONB signal to be active (Low) for a predetermined period, during which each GCKB signal remains active (Low) and each CMI signal remains High (or Low). This causes the AONB signal to be supplied from the OUTB terminal via the ASW7 (see FIG. 24) in each stage of the shift register SR. The OUTB signal of each stage thus becomes active (Low), so that all scanning signal lines are selected. During this period, the analog switch asw corresponding to each data signal line is on, so that all data signal lines are supplied with a Vcom. Further, in each stage of the flip-flop, the INITB terminal supplied with the AONB signal is active (Low), so that the Q signal becomes Low (non-active) and the QB signal becomes High (non-active). Once the OUTB signal of each stage of the shift register has become active, a feedback signal to the NAND becomes Low, so that the ASW7 is turned off and the ASW8 is turned on (each stage receives either the GCK1B or the GCK2B). Further, an M signal (that is, a signal supplied from the M terminal) of each stage is also active (High). This causes (i) each D-latch circuit to latch either the CMI1 signal (Low) or the CMI2 signal (Low) and (ii) the out signal (CS signal) supplied to each storage capacitor line to have the potential of the power supply VCSL. After the above display preparation operation ends, the liquid crystal display device $3f$ achieves a state in which (i) the Vcom has been written to each PIX in the display section DAR, the flip-flop in each stage of the shift register has a non-active (High) QB output, and (iii) the out signal of each D-latch circuit (that is, the potential of each storage capacitor line) has the potential of the power supply VCSL.

The liquid crystal display device $3f$ carries out the following operation when displaying its initial frame (that is, during its initial vertical scanning period): When the SB signal supplied to a first stage of the shift register SR has become active (=Low), an output of the FF of the first stage is set so that the output is active and that the first stage receives a GCKB signal. When the GCKB signal of the first stage has become active (=Low), the OUTB signal of the first stage becomes active (=Low), the SB signal of the following second stage also becomes active, and the FF of the first stage is reset, so that the QB signal of the first stage becomes High (non-active). During this period, the OUTB signal of the first stage is Low (that is, an output of the NAND is High), so that the first stage continues to receive the GCKB signal. When the GCKB signal has become High (non-active), the OUTB signal of the first stage becomes High and the output of the NAND becomes Low. The OUTB terminal thereafter outputs the AONB signal, so that the OUTB signal is High (non-active).

When the M signal of the second stage has become active, the D-latch circuit corresponding to the second stage latches either the CMI1 signal or the CMI2 signal. This causes the potential of an out signal of the D-latch circuit corresponding to the first stage (that is, the potential of a storage capacitor line corresponding to the first stage) to, after the OUTB signal of the first stage has become non-active (that is, after selection of the scanning signal line corresponding to the first stage has ended), (i) rise from the potential of the power supply VCSL to the potential of the power supply VCSH (in which case a data signal having a positive polarity is written to a pixel corresponding to the first stage or (ii) fall from the potential of the power supply VCSH to the potential of the power supply VCSL (in which case a data signal having a negative polarity is written to the pixel corresponding to the first stage).

For example, when the M signal of the n-th stage SRn has become active, the D-latch circuit CSLn corresponding to the n-th stage SRn latches the CMI2 signal. This causes the potential of the out signal of the D-latch circuit CSLn (that is, the potential of a storage capacitor line CSn−1) to, after the OUT signal of the (n−1) stage SRn−1 has become non-active (that is, after selection of the scanning signal line Gn−1 has started and then ended), rise from the potential of the power supply VCSL to the potential of the power supply VCSH. During this period, a data signal having a positive polarity has been written to the pixel PIXn−1 corresponding to the (n−1) stage SRn−1 as indicated by "POL." The rise of the potential of the storage capacitor line CSn−1 thus causes an effective potential to be higher than a potential of the data signal (that is, increases a luminance of the pixel PIXn−1).

When the M signal of the (n+1)-th stage SRn+1 has become active, the D-latch circuit CSLn+1 corresponding to the (n+1)-th stage SRn+1 latches the CMI2 signal. This causes the potential of the out signal of the D-latch circuit CSLn+1 (that is, the potential of the storage capacitor line CSn) to, after the OUT signal of the n-th stage SRn has become non-active (that is, selection of the scanning signal line Gn corresponding to the n-th stage SRn has started and then ended) fall from the potential of the power supply VCSH to the potential of the power supply VCSL. During this period, a data signal having a negative polarity is written to a pixel PIXn corresponding to the n-th stage SRn as indicated by "POL." The fall of the potential of the storage capacitor line CSn thus causes an effective potential to be lower than a potential of the data signal (that is, increases a luminance of the pixel PIXn).

When the M signal of the (n+2) stage SRn+2 has become active, the D-latch circuit CSLn+2 corresponding to the (n+2) stage SRn+2 latches the CMI1 signal. This causes the potential of the out signal of the D-latch circuit CSLn+2 (that is, the potential of the storage capacitor line CSn+1) to, after the OUT signal of the (n+1) stage SRn+1 has become non-active (that is, after selection of the scanning signal line Gn+1 has started and then ended), rise from the potential of the power supply VCSL to the potential of the power supply VCSH. During this period, a data signal having a positive polarity is written to a pixel PIXn+1 corresponding to the (n+1) stage SRn+1 as indicated by "POL." The rise of the potential of the storage capacitor line CSn+1 thus causes an effective potential to be higher than a potential of the data signal (that is, increases a luminance of the pixel PIXn+1).

A display operation similar to the above for the initial frame is carried out for the second frame and its subsequent frames. Since, however, the POL has a phase that is shifted by half the cycle every frame, each pixel electrode PIXi is supplied with a data signal having a polarity that is inverted every frame. The rise and fall of the out signal of a D-latch circuit CSLi (that is, the potential of a storage capacitor line CSi) switch every frame accordingly.

The liquid crystal display device 3f, when turned on and off, simultaneously selects all scanning signal lines so that an identical potential (for example, Vcom) is written to all pixels. This prevents an image disturbance caused when the liquid crystal display device 3f is turned on and off. In comparison with a conventional arrangement (see FIG. 34), the present arrangement (i) supplies an AONB signal to the ASW7 to eliminate the need for a NAND element of FIG. 34 that receives an output signal of each stage and (ii) supplies an AONB signal to the INITB terminal of each FF to eliminate the need for a component that generates and transmits a signal for initializing the shift register. This allows the gate driver to be downsized. Further, the present arrangement causes setting of the flip-flop FF to have priority over resetting thereof. Thus, when the simultaneous selection ends (that is, when the AON signal returns from an active state to a non-active state), the SB signal is more likely to become non-active before the R signal. The present arrangement thus prevents a malfunction, that is, prevents the shift register from carrying out, after its initialization, a set operation due to the R signal becoming non-active before the SB signal. Further, the present arrangement allows each stage to reset itself. This makes it possible to simplify a connection between stages. In addition, the present arrangement causes an internal signal (that is, the M signal) of the shift register to be supplied to the ck terminal of each D-latch circuit. This eliminates the need for a NOR circuit or an OR circuit in the G-Cs driver, and thus allows the G-Cs driver to be downsized further. Furthermore, the present arrangement allows CC driving to be appropriately carried out with respect to each pixel row even for an initial frame. This prevents an image disturbance (that is, unevenness in the shape of a lateral stripe) caused in an initial frame, the image disturbance having been a problem with conventional CC driving.

What is more outstanding about the present arrangement is the following advantages of the liquid crystal display device 3f: As illustrated in FIG. 30, simply shifting the phase of the CMI2 signal (from the phrase illustrated in FIG. 29) by half a cycle switches the cycle of the polarity signal POL to 2 H (by which each data signal line is supplied with a data signal having a polarity that is inverted every 2 H), and CC driving can be appropriately carried out with respect to each pixel row even for an initial frame. In other words, in the liquid crystal display device 3f, simply controlling respective phases of the CS inversion signals CMI1 and CMI2 can switch the cycle of the polarity signal POL from 1 H to 2 H, and an image disturbance caused by the switch can be reduced significantly.

The stages of the shift register of each of the liquid crystal display devices 3e and 3f (see FIG. 24) may be varied in configuration as illustrated in FIG. 31. Specifically, the ASW7 in FIG. 24 may alternatively be a single channel (P channel) transistor TR. This allows the shift register to be downsized further.

Embodiment 5

FIG. 32 is a circuit diagram illustrating a configuration of a liquid crystal display device 3g of the present invention. The liquid crystal display device 3g includes: a display section DAR; a gate driver GD; a source driver SD; and a display control circuit DCC. The display control circuit DCC supplies to the gate driver GD an INITB signal (initialization signal), an AONB signal (simultaneous selection signal), a gate start pulse GSP, a gate-on enable signal GOE, and gate clock signals GCK1 and GCK2. The display control circuit DCC supplies to the source driver SD a source start pulse SSP, digital data DAT, a polarity signal POL, and a source clock signal SCK. The gate driver GD includes a shift register SR having a plurality of stages. The description below uses as appropriate the symbol i-th stage SRi to refer to an i-th stage (where i=1 ... n−1, n, n+1 ... ) of the shift register.

The shift register supplies from its i-th stage SRi an output signal (OUT signal) to a scanning signal line Gi in the display section DAR via a buffer. For example, the shift register supplies from its n-th stage SRn an OUT signal to a scanning signal line Gn via a buffer. The scanning signal line Gn in the display section DAR is connected with a gate of a transistor connected with a pixel electrode in a PIXn. The pixel electrode in the PIXn forms a storage capacitor (auxiliary capacitor) together with a storage capacitor line CSn.

The liquid crystal display device 3g includes an analog switch asw and an inverter in correspondence with each data signal line. The inverter has an input connected with an AONB signal line. The data signal line has an end connected with a first conducting terminal of the analog switch asw, whereas a second conducting terminal of the analog switch asw is connected with a Vcom (common electrode potential) power supply. The analog switch asw has (i) an N channel side gate connected with an output of the inverter and (ii) a P channel side gate connected with the AONB signal line.

FIG. 33 is a circuit diagram illustrating a detailed configuration of a part of the shift register SR. As illustrated in FIG. 33, the shift register includes, in each of its stages: a set-reset flip-flop FF (the FF3 illustrated in FIG. 12) including an SB terminal, an R terminal, and an INITB terminal; two analog switches ASW9 and ASW10; an inverter; a CKB terminal; an ONB terminal; an OUTB terminal; and an OUT terminal. The Q terminal of the flip-flop FF is connected with a P channel side gate of the analog switch ASW9 and with an N channel side gate of the analog switch ASW10. The QB terminal of the FF is connected with an N channel side gate of the analog switch ASW9 and with a P channel side gate of the analog switch ASW10. The analog switch ASW9 has a first conducting electrode connected with the ONB terminal, whereas the analog switch ASW10 has a first conducting electrode connected with the CKB terminal. The analog switch ASW9 has a second conducting electrode connected with a second conducting electrode of the analog switch ASW10 and with the OUTB terminal, which is an output terminal of the stage. The OUTB terminal is connected with the OUT terminal via the inverter.

The shift register SR is arranged such that the OUTB terminal of a first stage is connected with the SB terminal of its following second stage and that the OUT terminal of the second stage is connected with the R terminal of the first stage. For example, the OUTB terminal of the n-th stage SRn is connected with the SB terminal of an (n+1)-th stage SRn+1, whereas the OUT terminal of the (n+1)-th stage SRn+1 is connected with the R terminal of the n-th stage SRn. The shift register SR has its initial stage SR1 having an SB terminal that is supplied with a GSPB signal. The gate driver GD is arranged such that (i) the INITB terminal of the flip-flop of each stage is connected with an INITB signal line, (ii) the ONB terminal of each stage is connected with the AONB signal line, and (iii) the CKB terminal of each odd-numbered stage is connected with a GCKB line (that is, a line through which a GCKB is supplied) that is different from a GCKB line with which the CKB terminal of each even-numbered stage is connected. For example, the CKB terminal of the n-th stage SRn is connected with a GCK2B signal line, whereas the CKB terminal of the (n+1)-th stage SRn+1 is connected with a GCK1B signal line.

When the liquid crystal display device 3g is turned on and off, a preparation operation is carried out. Specifically, the preparation operation causes the AONB signal and the INITB signal to be simultaneously active (Low) during a predetermined period. Since the ASW9 of each stage of the shift register SR is on, the OUT signal of each stage becomes active (High) as a result of the activation, so that all scanning signal lines are selected. Further, the analog switch asw corresponding to each data signal line is turned on due to the activation of the AON signal, so that all data signal lines are supplied with a Vcom. Since in the flip-flop of each stage, the INITB signal becomes active (Low), the Q signal becomes Low (non-active) and the QB signal becomes High (non-active). After the above preparation operation ends (that is, after the AONB signal becomes non-active), the liquid crystal display device 3g achieves a state in which the Vcom has been written to each PIX in the display section DAR and in which the shift register SR has been initialized (that is, the output of the flip-flop in each stage has become non-active).

The shift register SR of the liquid crystal display device 3g carries out the following operation during each vertical scanning period (that is, while each frame is displayed): When the SB signal supplied to a first stage has become active (=Low), the FF of the first stage is set. This causes the Q signal to be High (active), and the first stage in turn receives a GCKB signal via the analog switch ASW10. When the GCKB signal supplied to the first stage has become active (Low), the OUTB signal of the first stage becomes active (Low), and the SB signal of the following second stage becomes active as well. This causes the OUTB signal of the FF of the second stage to be active, and the second stage in turn receives a GCKB signal. When the GCKB signal of the second stage has become active (Low), the FF of the first stage is reset. This causes the Q signal of the first stage to be Low (non-active) and turns on the analog switch ASW9 of the first stage. Since the AONB signal is High at that moment, the OUTB signal of the first stage becomes High (non-active) as well.

The liquid crystal display device 3g, when turned on and off, simultaneously selects all scanning signal lines so that an identical potential (for example, Vcom) is written to all pixels. This prevents an image disturbance caused when the liquid crystal display device 3g is turned on and off. In comparison with a conventional arrangement (see FIG. 34), the present arrangement supplies an AONB signal to the ASW9 to eliminate the need for a NAND element of FIG. 34 that receives an output signal of each stage. This allows the gate driver to be downsized. Further, the present arrangement causes setting of the flip-flop FF to have priority over resetting thereof. Thus, when the simultaneous selection ends (that is, when the AONB signal returns from an active state to a non-active state), the SB signal is more likely to become non-active before the R signal. The present arrangement thus prevents a malfunction, that is, prevents the shift register from carrying out, after its initialization, a set operation due to the R signal becoming non-active before the SB signal. In addition, the present arrangement initializes the shift register (that is, initializes the flip-flop of each stage) when simultaneously selecting all scanning signal lines. The present arrangement can thus complete a preparation operation more rapidly than a conventional arrangement which carries out simultaneous selection of all scanning signal lines and initialization of a shift register separately.

The gate driver, the source driver, or the gate-CS driver may be formed in a monolithic manner (on an identical substrate) with a pixel circuit of the display section.

The present specification uses the term "drain terminal" to refer to a first one of the two conducting electrodes of a transistor (that is, a P channel or N channel transistor), the first one being an output side conducting electrode.

A shift register of the present invention is a shift register for a display driving circuit that simultaneously selects signal lines at, for example, a predetermined timing, the shift register comprising, in a stage thereof: a flip-flop including an initialization terminal; and a signal generating circuit that receives a simultaneous selection signal and that generates an output signal of said stage by use of an output of the flip-flop, wherein: the output signal of said stage becomes active due to an activation of the simultaneous selection signal so as to be active during a period of the simultaneous selection; while the initialization terminal of the flip-flop is active, the output of the flip-flop is non-active regardless of a state of another input terminal (of the flip-flop); and the initialization terminal receives the simultaneous selection signal.

The above arrangement allows a simultaneous selection signal to be used as a signal for initializing a shift register, and thus eliminates the need to additionally generate such a signal and supply the signal to each stage. This makes it possible to downsize a display driving circuit (that is, various display drivers) including a shift register.

The shift register of the present invention may be arranged such that the flip-flop is a set-reset flip-flop; and the output of the flip-flop is non-active while the initialization terminal, a set terminal, and a reset terminal of the flip-flop are active.

The shift register of the present invention may be arranged such that the signal generating circuit includes a gate circuit that selectively receives a first signal corresponding to a supplied switching signal and that uses the first signal as the output signal of said stage.

The shift register of the present invention may be arranged such that the output of the flip-flop is supplied to the gate circuit as the switching signal.

The shift register of the present invention may be arranged such that the signal generating circuit further includes a logic circuit; the output of the flip-flop is supplied to the logic circuit; an output of the logic circuit is supplied to the gate circuit as the switching signal; and the output signal of said stage is fed back to the logic circuit and to the reset terminal of the flip-flop.

The shift register of the present invention may be arranged such that the gate circuit selectively receives either the simultaneous selection signal or a clock signal.

A shift register for a display driving circuit that simultaneously selects signal lines, the shift register comprising, in a stage thereof: a set-reset flip-flop; and a signal generating circuit that receives a simultaneous selection signal and that generates an output signal of said stage by use of an output of the flip-flop, wherein: the signal generating circuit includes a gate circuit that selectively outputs the simultaneous selection signal or a clock signal as the output signal of said stage in response to a supplied switching signal.

According to the above arrangement, causing the simultaneous selection signal to be active causes the output signal of each stage of the shift register to be active. The arrangement thus eliminates the need for a conventional logic circuit to which an output signal of each stage is supplied. The arrangement consequently downsizes a display driving circuit (that is, various display drivers) including a shift register.

The shift register of the present invention may be arranged such that the gate circuit selectively outputs the simultaneous selection signal or a clock signal as the output signal of said stage in response to the output of the flip-flop.

The shift register of the present invention may be arranged such that the signal generating circuit further includes a logic circuit; the output of the flip-flop is supplied to the logic circuit; the output signal of said stage is fed back to the logic circuit and to the flip-flop; and the gate circuit selectively outputs the simultaneous selection signal or the clock signal as the output signal of said stage in response to an output of the logic circuit.

The shift register of the present invention may be arranged such that the logic circuit includes a NAND element.

The shift register of the present invention may be arranged such that the NAND element includes P channel transistors and N channel transistors; and the P channel transistors each have a driving capability higher than a driving capability of any of the N channel transistors.

The shift register of the present invention may be arranged such that before the simultaneous selection ends, the flip-flop of said stage receives a set signal and a reset signal that are both active; and after the simultaneous selection ends, the set signal becomes non-active before the reset signal becomes non-active.

The shift register of the present invention may be arranged such that the flip-flop includes: a first CMOS circuit including a first P channel transistor and a second N channel transistor that have respective gate terminals connected with each other and that have respective drain terminals connected with each other; a second CMOS circuit including a third P channel transistor and a fourth N channel transistor that have respective gate terminals connected with each other and that have respective drain terminals connected with each other; an input transistor; input terminals; a first output terminal; and a second output terminal; a gate side of the first CMOS circuit, a drain side of the second CMOS circuit, and the first output terminal are connected with one another; a gate side of the second CMOS circuit, a drain side of the first CMOS circuit, and the second output terminal are connected with one another; the input transistor has a gate terminal and a source terminal that are connected with different input terminals, and has a drain terminal connected with the output terminal.

The shift register of the present invention may be arranged such that the input transistor is a P channel transistor; and the source terminal of the input transistor is connected with an input terminal for a signal that has, while non-active, a first potential and that has, while active, a second potential lower than the first potential.

The shift register of the present invention may be arranged such that the input transistor is an N channel transistor; and the source terminal of the input transistor is connected with an input terminal for a signal that has, while active, a first potential and that has, while non-active, a second potential lower than the first potential.

A display driving circuit of the present invention is a display driving circuit, including: the shift register according to any one of claims 1 to 15.

A display driving circuit of the present invention is a display driving circuit, including: the shift register (which resets itself), wherein: the clock signal remains active during a period of the simultaneous selection.

A display panel of the present invention is a display panel, including: the display driving circuit; and a pixel circuit formed in a monolithic manner with the display driving circuit.

A display device of the present invention is a display device, including: the shift register according.

A display driving circuit of the present invention is a display driving circuit for use in a display device that supplies, to a storage capacitor line which forms a capacitor together with a pixel electrode included in a pixel, a modulation signal corresponding to a polarity of a signal potential that has been written to the pixel electrode, the display driving circuit including: the shift register, wherein: a retention circuit is provided in correspondence with said stage of the shift register; the retention circuit is supplied with a retention target signal; the retention circuit corresponding to said stage, when a control signal generated in said stage becomes active, receives the retention target signal and retains the retention target signal; the output signal of said stage is supplied to a scanning signal line connected with a pixel corresponding to said stage; and an output of the retention circuit corresponding to said stage is supplied, as the modulation signal, to a storage capacitor line which forms a capacitor together with a pixel electrode included in a pixel corresponding to a first stage prior to said stage.

A display driving circuit of the present invention is a display driving circuit for use in a display device that supplies, to a storage capacitor line which forms a capacitor together with a pixel electrode included in a pixel, a modulation signal corresponding to a polarity of a signal potential that has been written to the pixel electrode, the display driving circuit including: the shift register, wherein: a retention circuit is provided in correspondence with said stage of the shift register; the retention circuit is supplied with a retention target signal; the retention circuit corresponding to a second stage, when a control signal generated in the second stage becomes active, receives the retention target signal and retains the retention target signal; an output of the retention circuit corresponding to the first stage is supplied, as the modulation signal, to a storage capacitor line; and a control signal generated in said stage becomes active before an initial vertical scanning period of a display image.

A display driving circuit of the present invention is a display driving circuit for use in a display device that supplies, to a storage capacitor line which forms a capacitor together with a pixel electrode included in a pixel, a modulation signal corresponding to a polarity of a signal potential that has been written to the pixel electrode, the display driving circuit including: the shift register, wherein: a retention circuit is provided in correspondence with said stage of the shift register; the retention circuit is supplied with a retention target signal; the output signal of said stage and an output signal of a third stage subsequent to said stage are supplied to a logic circuit; the retention circuit corresponding to said stage, when an output of the logic circuit becomes active, receives the retention target signal and retains the retention target signal; the output signal of said stage is supplied to a scanning signal line connected to a pixel corresponding to said stage; an output of the retention circuit corresponding to said stage is supplied, as the modulation signal, to a storage capacitor line which forms a capacitor together with a pixel electrode included in the pixel corresponding to said stage; and the retention target signal supplied to a first set of retention circuits is different in phase from the retention target signal supplied to a second set of retention circuits.

A display driving circuit of the present invention is a display driving circuit for use in a display device that includes a pixel electrode connected, via a switching element, with a data signal line and with a scanning signal line and that supplies, to a storage capacitor line which forms a capacitor together with the pixel electrode, a modulation signal corresponding to a polarity of a signal potential that has been written to the pixel electrode, the display driving circuit including: the shift register, wherein: the display driving circuit switches between (i) a first mode in which a polarity of a signal potential supplied to a data signal line is inverted every n horizontal scanning periods (where n is a natural number) and (ii) a second mode in which the polarity of the signal potential supplied to the data signal line is inverted every m horizontal scanning periods (where m is a natural number different from n).

The present invention is not limited to the above embodiments, but further encompasses (i) embodiments achieved by appropriately modifying the above embodiments on the basis of known techniques and common general technical knowledge and (ii) embodiments achieved by combining such embodiments. Further, the operational advantages and the like described in the above embodiments are merely examples.

INDUSTRIAL APPLICABILITY

The shift register of the present invention is suitably usable as any of various drivers, particularly a driver for a liquid crystal display device.

REFERENCE SIGNS LIST $3a$ to $3g$ liquid crystal display device
ASW1, ASW2, and asw analog switch
SR shift register
SRi i-th stage of the shift register
DCC display control circuit
GD gate driver
SD source driver
G-CsD gate-Cs driver
DAR display section
Gn scanning signal line
CSn storage capacitor line
PIXn pixel
CSLi D-latch circuit corresponding to the i-th stage of the SR
FF flip-flop
ST set transistor (input transistor)
RT reset transistor (input transistor)
LRT latch removing transistor
LC latch circuit
POL (data) polarity signal
CMI1 and CMI2 CS inversion signal

The invention claimed is:

1. A shift register for a display driving circuit that simultaneously selects signal lines, the shift register comprising, in a stage thereof:
a flip-flop including an initialization terminal; and
a signal generating circuit that receives a simultaneous selection signal and that generates an output signal of said stage by use of an output of the flip-flop,
wherein
the output signal of said stage becomes active due to an activation of the simultaneous selection signal so as to be active during a period of the simultaneous selection;
while the initialization terminal of the flip-flop is active, the output of the flip-flop is non-active regardless of a state of another input terminal of the flip-flop;
the initialization terminal is configured to receive the simultaneous selection signal;
the flip-flop is a set-reset flip-flop;
the output of the flip-flop (a) is active in a set period in which a set terminal is active and a reset terminal is non-active, (b) is non-active in a reset period in which the set terminal is non-active and the reset terminal is active, and (c) is non-active while the set terminal is the same state as the set period, the reset terminal is the same state as the reset period, and the initialization terminal is active; and
the signal generating circuit includes an analog switch configured to supply (i) the simultaneous selection signal to an output terminal of said stage while the output of the flip-flop is non-active, and (ii) a clock signal to the output terminal of said stage while the output of the flip-flop is active.

2. The shift register according to claim 1,
wherein:
the flip-flop is configured to supply the output of the flip-flop to the analog switch.

3. The shift register according to claim 2,
wherein:
the output of the flip-flop is supplied to the gate circuit as the switching signal.

4. The shift register according to claim 1,
wherein:
the signal generating circuit further includes a logic circuit,
the flip-flop is configured to supply the output of the flip-flop to the logic circuit;
the logic circuit is configured to supply an output of the logic circuit to the analog switch; and
the output signal of said stage is fed back to the logic circuit and to the reset terminal of the flip-flop.

5. The shift register according to claim 1,
wherein:
the gate circuit selectively outputs the simultaneous selection signal or a clock signal as the output signal of said stage in response to the output of the flip-flop.

6. The shift register according to claim 4,
wherein:
the logic circuit includes a NAND element.

7. The shift register according to claim 6,
wherein:
the NAND element includes P channel transistors and N channel transistors; and
the P channel transistors each have a driving capability higher than a driving capability of any of the N channel transistors.

8. The shift register according to claim 1,
wherein:
before the simultaneous selection ends, the flip-flop of said stage receives a set signal and a reset signal that are both active; and
after the simultaneous selection ends, the set signal becomes non-active before the reset signal becomes non-active.

9. The shift register according to claim 1,
wherein:
the flip-flop includes:
a first CMOS circuit including a first P channel transistor and a second N channel transistor that have respective gate terminals connected with each other and that have respective drain terminals connected with each other;
a second CMOS circuit including a third P channel transistor and a fourth N channel transistor that have respective gate terminals connected with each other and that have respective drain terminals connected with each other;
an input transistor;
input terminals;
a first output terminal; and
a second output terminal,
a gate side of the first CMOS circuit, a drain side of the second CMOS circuit, and the first output terminal are connected with one another,
a gate side of the second CMOS circuit, a drain side of the first CMOS circuit, and the second output terminal are connected with one another,
the input transistor has a gate terminal and a source terminal that are connected with different input terminals, and has a drain terminal connected with the output terminal.

10. The shift register according to claim 9,
wherein:
the input transistor is a P channel transistor; and
the source terminal of the input transistor is connected with an input terminal for a signal that has, while non-active, a first potential and that has, while active, a second potential lower than the first potential.

11. The shift register according to claim 9,
wherein:
the input transistor is an N channel transistor; and
the source terminal of the input transistor is connected with an input terminal for a signal that has, while active, a first potential and that has, while non-active, a second potential lower than the first potential.

12. A display driving circuit, comprising:
the shift register according to claim 1.

13. A display panel, comprising:
the display driving circuit according to claim 12; and
a pixel circuit formed in a monolithic manner with the display driving circuit.

14. A display device, comprising:
the shift register according to claim 1.

15. A display driving circuit for use in a display device that supplies, to a storage capacitor line which forms a capacitor together with a pixel electrode included in a pixel, a modulation signal corresponding to a polarity of a signal potential that has been written to the pixel electrode,
the display driving circuit comprising:
the shift register according to claim 1,
wherein:
a retention circuit is provided in correspondence with said stage of the shift register;
the retention circuit is supplied with a retention target signal;
the retention circuit corresponding to said stage, when a control signal generated in said stage becomes active, receives the retention target signal and retains the retention target signal;
the output signal of said stage is supplied to a scanning signal line connected with a pixel corresponding to said stage; and
an output of the retention circuit corresponding to said stage is supplied, as the modulation signal, to a storage capacitor line which forms a capacitor together with a pixel electrode included in a pixel corresponding to a first stage prior to said stage.

16. A display driving circuit for use in a display device that supplies, to a storage capacitor line which forms a capacitor together with a pixel electrode included in a pixel, a modulation signal corresponding to a polarity of a signal potential that has been written to the pixel electrode,
the display driving circuit comprising:
the shift register according to claim 1,
wherein:
a retention circuit is provided in correspondence with said stage of the shift register;
the retention circuit is supplied with a retention target signal;
the retention circuit corresponding to a second stage, when a control signal generated in the second stage becomes active, receives the retention target signal and retains the retention target signal;

an output of the retention circuit corresponding to the first stage is supplied, as the modulation signal, to a storage capacitor line; and a control signal generated in said stage becomes active before an initial vertical scanning period of a display image.

17. A display driving circuit for use in a display device that supplies, to a storage capacitor line which forms a capacitor together with a pixel electrode included in a pixel, a modulation signal corresponding to a polarity of a signal potential that has been written to the pixel electrode, the display driving circuit comprising:
the shift register according to claim 1,
wherein:
a retention circuit is provided in correspondence with said stage of the shift register;
the retention circuit is supplied with a retention target signal;
the output signal of said stage and an output signal of a third stage subsequent to said stage are supplied to a logic circuit;
the retention circuit corresponding to said stage, when an output of the logic circuit becomes active, receives the retention target signal and retains the retention target signal;
the output signal of said stage is supplied to a scanning signal line connected to a pixel corresponding to said stage;
an output of the retention circuit corresponding to said stage is supplied, as the modulation signal, to a storage capacitor line which forms a capacitor together with a pixel electrode included in the pixel corresponding to said stage; and the retention target signal supplied to a first set of retention circuits is different in phase from the retention target signal supplied to a second set of retention circuits.

18. A display driving circuit for use in a display device that includes a pixel electrode connected, via a switching element, with a data signal line and with a scanning signal line and that supplies, to a storage capacitor line which forms a capacitor together with the pixel electrode, a modulation signal corresponding to a polarity of a signal potential that has been written to the pixel electrode, the display driving circuit comprising:
the shift register according to claim 1,
wherein:
the display driving circuit switches between (i) a first mode in which a polarity of a signal potential supplied to a data signal line is inverted every n horizontal scanning periods (where n is a natural number) and (ii) a second mode in which the polarity of the signal potential supplied to the data signal line is inverted every m horizontal scanning periods (where m is a natural number different from n).

19. The shift register as set forth in claim 1, wherein:
the set terminal is provided with one of the output signal and a reverse signal of the output signal each of that is output from a preceding stage of said stage;
the reset terminal is provided with (i) one of the output signal and the reverse signal of the output signal each of that is output from said stage or (ii) one of the output signal and the reverse signal of the output signal each of that is output from a succeeding stage of said stage; and
a shift register initialization to make outputs of the flip-flops included in respective all stages of the shift register non-active is carried out during the simultaneous selection.

* * * * *